(12) United States Patent
Stroebe et al.

(10) Patent No.: US 12,365,301 B2
(45) Date of Patent: Jul. 22, 2025

(54) VEHICLE TRIM COMPONENT

(71) Applicant: Shanghai Yanfeng Jinqiao Automotive Trim Systems Co. Ltd., Novi, MI (US)

(72) Inventors: Jennifer A. Stroebe, Holland, MI (US); Michael Robert Catlin, Holland, MI (US); Jason Denbow, Holland, MI (US); Michael Edward Phillips, Holland, MI (US); Jason Mathew Hipshier, Hudsonville, MI (US); Michael Gerard Zimmer, Belmont, MI (US); Scott Allen Hansen, Holland, MI (US); Michael John Thomas, Ann Arbor, MI (US)

(73) Assignee: Shanghai Yanfeng Jinqiao Automotive Trim Systems Co. Ltd., Novi, MI (US)

( * ) Notice: Subject to any disclaimer, the term of this patent is extended or adjusted under 35 U.S.C. 154(b) by 0 days.

(21) Appl. No.: 18/495,375

(22) Filed: Oct. 26, 2023

(65) Prior Publication Data
US 2024/0051489 A1 Feb. 15, 2024

Related U.S. Application Data

(63) Continuation-in-part of application No. 17/592,971, filed on Feb. 4, 2022, now Pat. No. 11,840,188, which
(Continued)

(51) Int. Cl.
*B60R 21/205* (2011.01)
*B60R 13/02* (2006.01)
(Continued)

(52) U.S. Cl.
CPC ........ *B60R 21/205* (2013.01); *B60R 13/0256* (2013.01); *B60R 16/02* (2013.01); *B60R 21/2165* (2013.01); *H05K 1/181* (2013.01)

(58) Field of Classification Search
CPC .............. B60R 21/205; B60R 13/0256; B60R 21/2165; B60R 21/215; B60R 2021/21537; B60R 13/02; B60R 16/02; H05K 1/181
See application file for complete search history.

(56) References Cited

U.S. PATENT DOCUMENTS 1,563,731 A 12/1925 Charles
2,441,960 A 5/1948 Paul
(Continued)

FOREIGN PATENT DOCUMENTS

| DE | 10332953 A1 * | 2/2005 | ............ G06F 3/045 |
|----|----|----|----|
| WO | 2000020256 A1 | 4/2000 | |
| WO | WO-2015188017 A1 * | 12/2015 | ......... B29C 67/0055 |

*Primary Examiner* — Timothy Wilhelm
(74) *Attorney, Agent, or Firm* — Amin, Turocy & Watson LLP

(57) ABSTRACT

A component for a vehicle interior may comprise a composite structure comprising a fiber panel and a cover. The fiber panel may comprise a conductor. The conductor may provide a functional circuit for the composite structure. The conductor may comprise a pattern of electrically conductive threads. Conductive thread may be within the fiber panel. Conductive thread may be stitched into/onto the fiber panel. The conductor may comprise a stitch pattern comprising conductive thread comprising the functional circuit. The functional circuit may comprise a user interface, an input device, an output device, and/or a circuit element. The composite structure may comprise a resin structure for the fiber panel adjacent to the functional circuit. The component may comprise a trim panel, instrument panel, door panel, overhead panel, console, overhead console, floor console, interior trim component, pillar trim, operator control, steering control/wheel, etc.

20 Claims, 48 Drawing Sheets

Related U.S. Application Data is a continuation-in-part of application No. 17/006,213, filed on Aug. 28, 2020, now Pat. No. 11,325,290, which is a continuation of application No. PCT/US2019/039587, filed on Jun. 27, 2019.

(60) Provisional application No. 62/691,595, filed on Jun. 28, 2018.

(51) Int. Cl.
  *B60R 16/02* (2006.01)
  *B60R 21/2165* (2011.01)
  *H05K 1/18* (2006.01)

(56) References Cited

U.S. PATENT DOCUMENTS

| | | | | |
|---|---|---|---|---|
| 5,429,784 | A * | 7/1995 | Iannazzi | B60R 21/2165 264/126 |
| 5,624,622 | A * | 4/1997 | Boyce | B29C 44/569 264/258 |
| 5,826,905 | A * | 10/1998 | Tochacek | D04B 21/165 428/36.1 |
| 5,873,318 | A * | 2/1999 | Bohlinger | D05B 23/00 112/475.08 |
| 6,012,735 | A * | 1/2000 | Gray | B60R 21/215 280/732 |
| 6,076,246 | A * | 6/2000 | McCooey | B60R 13/02 264/261 |
| 6,187,411 | B1 * | 2/2001 | Palmer | B32B 5/024 428/318.6 |
| 6,337,461 | B1 * | 1/2002 | Yasuda | B23K 26/032 219/121.62 |
| 6,522,755 | B1 | 2/2003 | Warnaka et al. | |
| 6,726,239 | B1 * | 4/2004 | Teranishi | B60R 21/2165 280/732 |
| 6,756,003 | B2 * | 6/2004 | Kieltyka | B29C 45/14 264/254 |
| 6,845,725 | B2 * | 1/2005 | Takei | B60N 2/5891 112/475.08 |
| 6,908,521 | B2 * | 6/2005 | Ponthieu | B60R 21/2165 156/82 |
| 6,962,120 | B1 * | 11/2005 | Fujikura | D05B 15/00 112/475.17 |
| 6,997,126 | B2 * | 2/2006 | Murley | B60N 2/58 112/475.08 |
| 7,100,941 | B2 * | 9/2006 | Riha | B60R 21/2165 280/732 |
| 7,234,726 | B2 * | 6/2007 | Trevino | B60R 21/2165 280/732 |
| 7,353,669 | B2 * | 4/2008 | Ternon | D04B 21/14 442/314 |
| 7,464,958 | B2 * | 12/2008 | Kong | B29C 45/1635 280/728.3 |
| 7,549,303 | B2 * | 6/2009 | Callaway | D04B 21/06 66/195 |
| 7,676,917 | B2 | 3/2010 | McCall et al. | |
| 7,681,917 | B2 * | 3/2010 | Guillo | C09J 7/35 280/743.2 |
| 7,748,732 | B2 * | 7/2010 | Sella | B60R 21/201 280/728.3 |
| 7,878,528 | B2 * | 2/2011 | Dorn | B60R 21/2165 280/728.3 |
| 7,918,480 | B2 * | 4/2011 | Kwon | B60R 21/216 280/730.2 |
| 7,918,481 | B2 * | 4/2011 | Ohgo | B60R 21/2165 280/732 |
| 7,922,956 | B1 * | 4/2011 | Scheidmantel | B29C 44/18 264/294 |
| 8,096,577 | B2 * | 1/2012 | Roring | B60R 21/2165 16/221 |
| 8,100,070 | B2 * | 1/2012 | Boinais | B60N 2/58 112/475.08 |
| 8,157,289 | B2 * | 4/2012 | Bittner | B60R 21/2165 280/728.3 |
| 8,316,785 | B2 * | 11/2012 | Boinais | B60N 2/58 112/436 |
| 8,348,303 | B1 * | 1/2013 | Roring | B60R 21/216 280/732 |
| 8,376,395 | B2 * | 2/2013 | Ory | B60R 21/215 280/743.2 |
| 8,500,158 | B2 * | 8/2013 | Ory | B60R 21/215 280/743.2 |
| 8,506,865 | B2 * | 8/2013 | Wangenheim | B32B 27/12 156/308.2 |
| 8,530,028 | B2 * | 9/2013 | Smith | B60R 13/02 428/102 |
| 8,657,328 | B2 * | 2/2014 | Ory | B60R 21/205 280/743.2 |
| 8,678,458 | B2 * | 3/2014 | Filipp | B29C 44/5627 428/102 |
| 8,833,829 | B2 * | 9/2014 | Wenzel | D05B 93/00 112/402 |
| 8,877,317 | B2 * | 11/2014 | Zellner, Jr. | B32B 5/20 428/102 |
| 8,919,270 | B2 * | 12/2014 | Wenzel | D05B 57/32 112/470.27 |
| 8,943,985 | B2 * | 2/2015 | Hashimoto | D05B 1/08 112/165 |
| 8,955,872 | B2 * | 2/2015 | Ory | B60R 21/215 280/728.3 |
| 9,010,801 | B2 * | 4/2015 | Baudart | B60R 21/215 280/728.3 |
| 9,045,106 | B2 * | 6/2015 | Pauthier | B29C 45/14 |
| 9,090,222 | B2 * | 7/2015 | Roring | B60R 21/216 |
| 9,228,383 | B2 * | 1/2016 | Svatos | E05D 1/02 |
| 9,266,480 | B2 * | 2/2016 | Fujita | B60R 13/0256 |
| 9,279,641 | B1 * | 3/2016 | Springsteen | F41H 5/0471 |
| 9,296,354 | B1 * | 3/2016 | Preisler | B60R 21/215 |
| 9,297,100 | B1 * | 3/2016 | Wu | D05B 1/20 |
| 9,340,912 | B2 * | 5/2016 | Wenzel | B60N 2/5891 |
| 9,387,820 | B2 * | 7/2016 | Jordan | B60R 21/21 |
| 9,510,650 | B2 * | 12/2016 | Uozumi | A44B 19/343 |
| 9,566,763 | B2 * | 2/2017 | Wenzel | B32B 27/32 |
| 9,775,700 | B2 * | 10/2017 | Greenhalgh | D05B 93/00 |
| 9,809,176 | B2 * | 11/2017 | Wenzel | D05B 1/06 |
| 9,821,832 | B2 * | 11/2017 | Davignon | B32B 5/26 |
| 9,879,366 | B2 * | 1/2018 | Toda | D05B 1/00 |
| 9,925,900 | B2 * | 3/2018 | Lafferty | B60N 2/5685 |
| 9,988,010 | B2 * | 6/2018 | Aust | B60R 21/215 |
| 10,081,327 | B2 * | 9/2018 | Toda | B60R 21/2165 |
| 10,160,415 | B2 * | 12/2018 | Choi | B60R 21/215 |
| 10,926,732 | B2 * | 2/2021 | Sterne Stroebe | B60R 13/0256 |
| 11,052,635 | B2 * | 7/2021 | Fujiwara | B32B 3/30 |
| 11,504,945 | B2 * | 11/2022 | Berlat | B32B 9/02 |
| 2005/0269804 | A1 * | 12/2005 | Yamada | B29C 66/532 428/156 |
| 2006/0107701 | A1 * | 5/2006 | Ternon | D04B 21/165 66/195 |
| 2009/0217484 | A1 * | 9/2009 | Bittner | B60R 21/2165 16/223 |
| 2009/0283993 | A1 * | 11/2009 | Finch | B60R 21/2165 280/732 |
| 2010/0196686 | A1 * | 8/2010 | Van Dam | D04H 1/558 156/60 |
| 2014/0134391 | A1 * | 5/2014 | Lumb | B32B 5/06 428/102 |
| 2017/0050606 | A1 * | 2/2017 | Asakuma | B60R 21/2165 |
| 2018/0079371 | A1 * | 3/2018 | Iwasaki | D05B 23/00 |
| 2018/0201218 | A1 * | 7/2018 | Zhang | B60R 13/0256 |
| 2018/0207843 | A1 * | 7/2018 | Fujiwara | B32B 33/00 |
| 2019/0016242 | A1 * | 1/2019 | Kato | B32B 7/12 |
| 2020/0079054 | A1 * | 3/2020 | Fujiwara | B32B 5/18 |
| 2020/0139651 | A1 * | 5/2020 | Guha | D03D 11/00 |
| 2021/0245680 | A1 * | 8/2021 | Czerkas | B32B 38/00 |

* cited by examiner

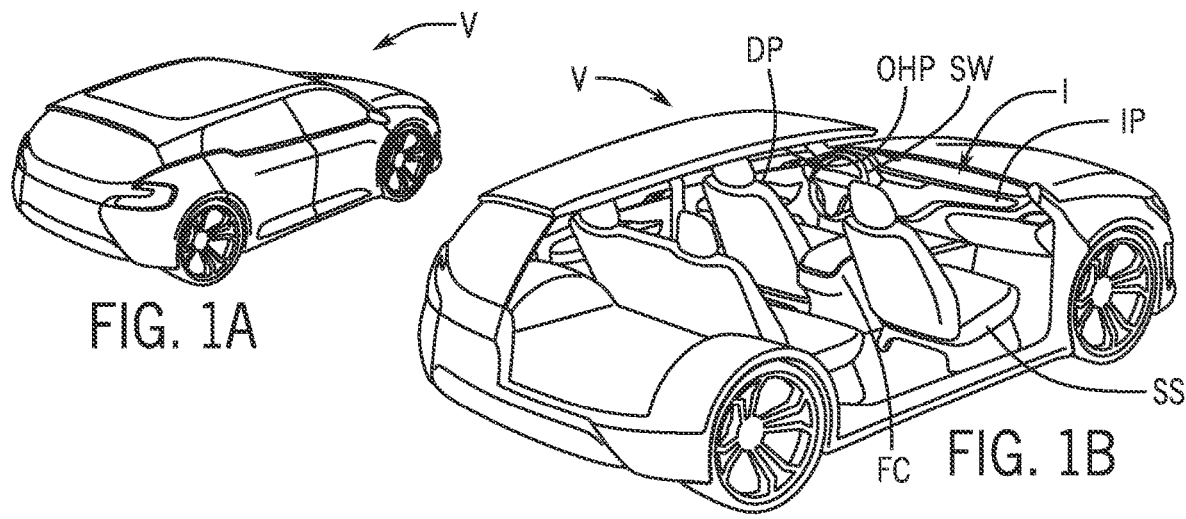
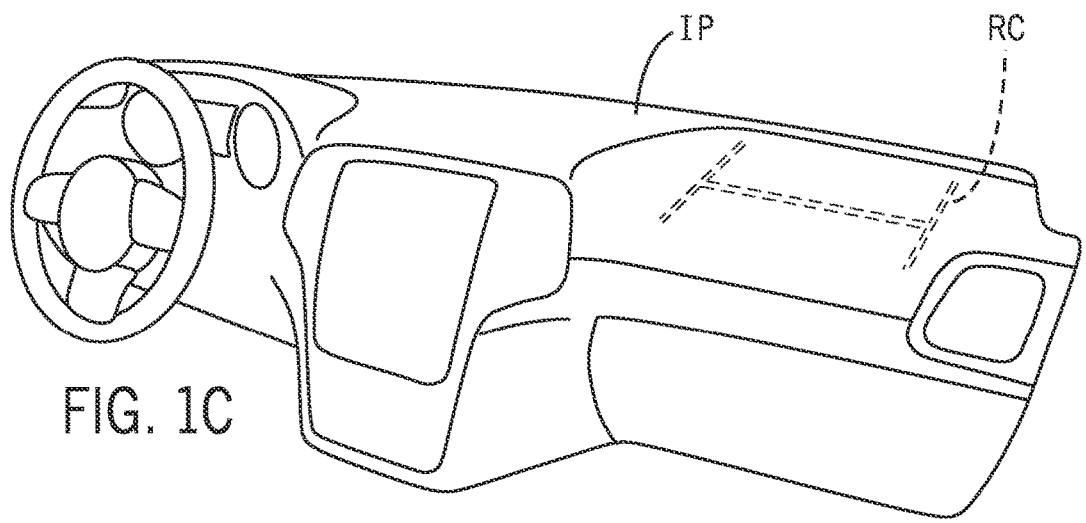
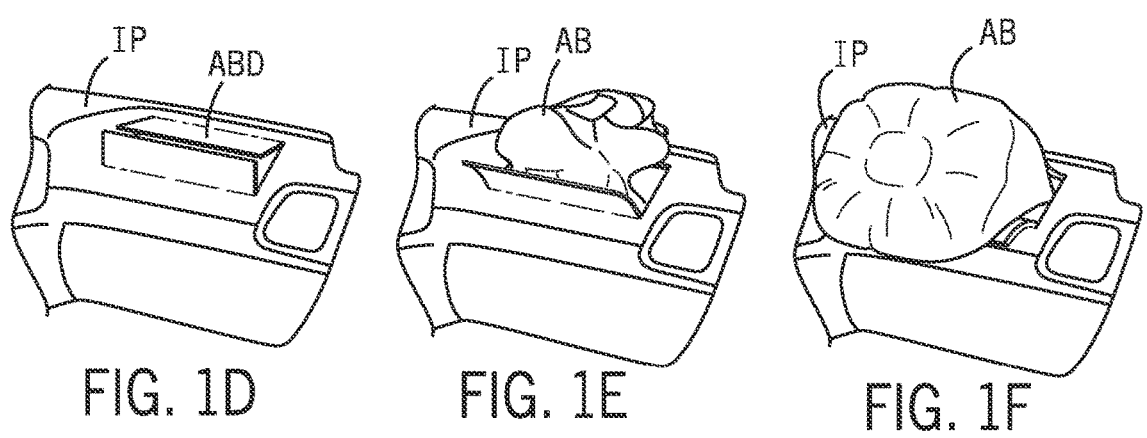

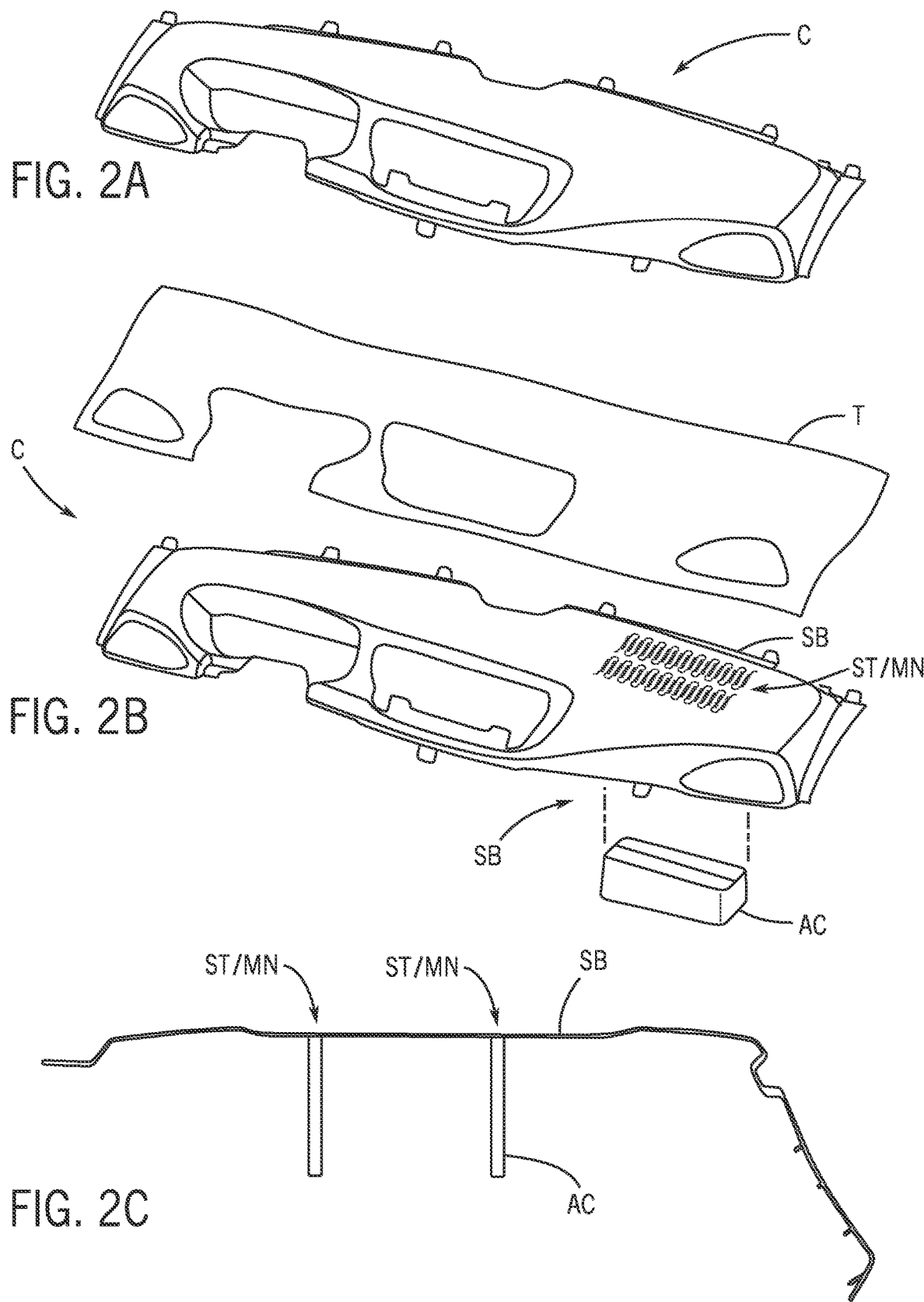

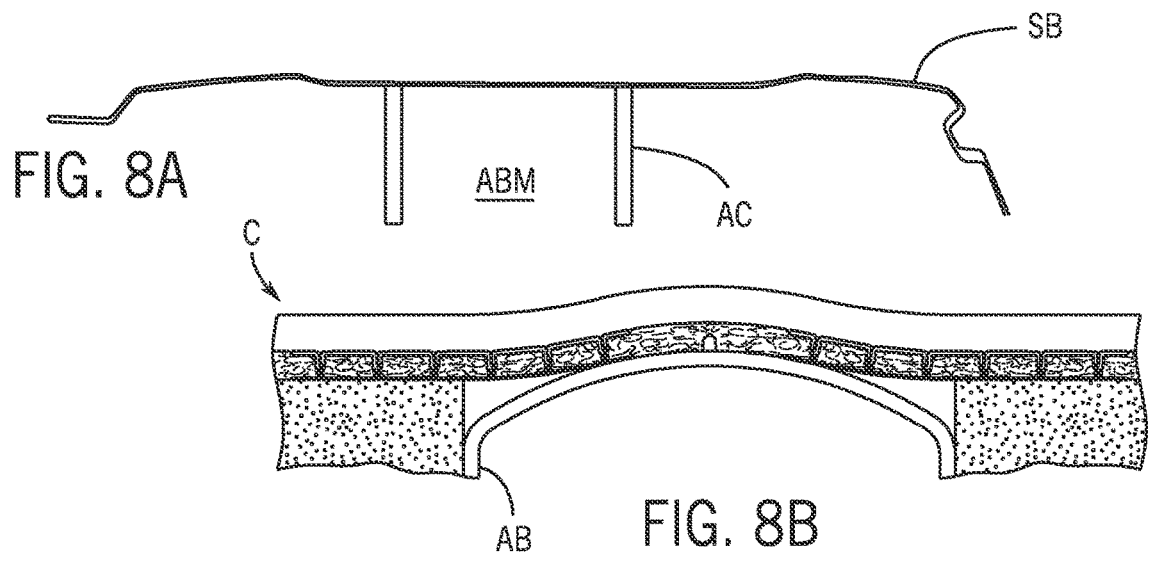
FIG. 8A
FIG. 8B
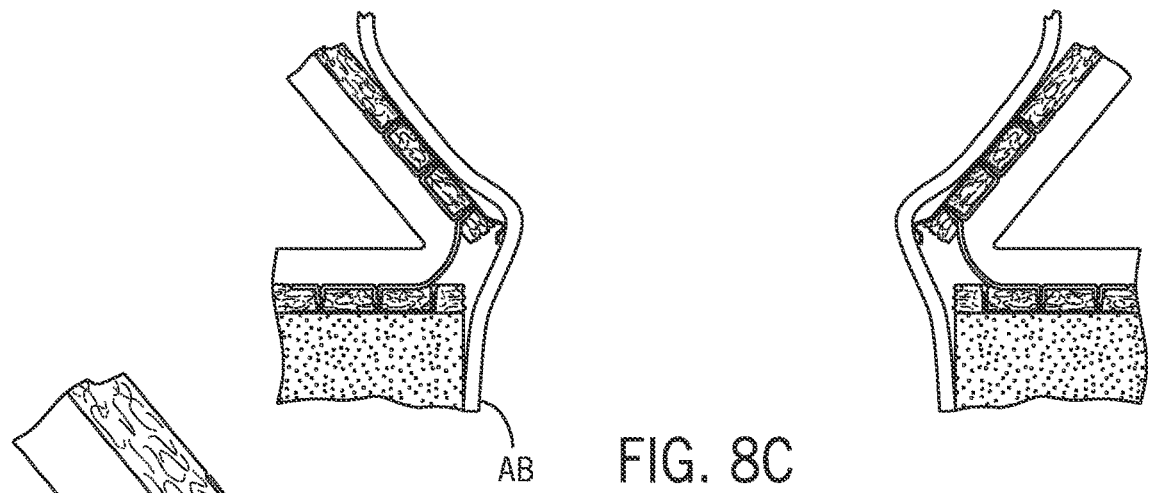
FIG. 8C
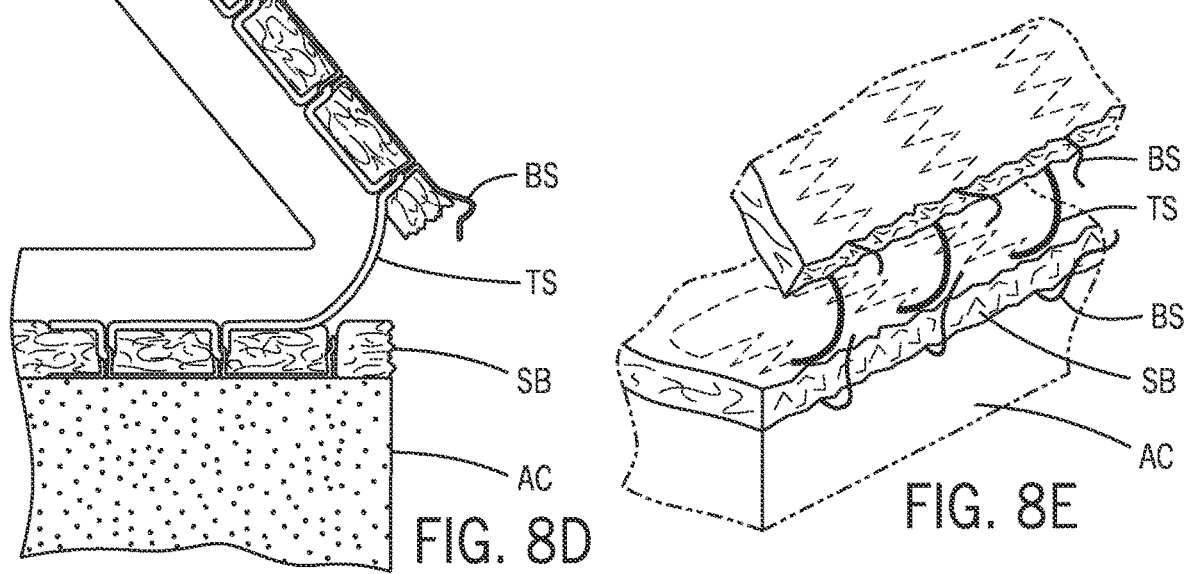
FIG. 8D
FIG. 8E

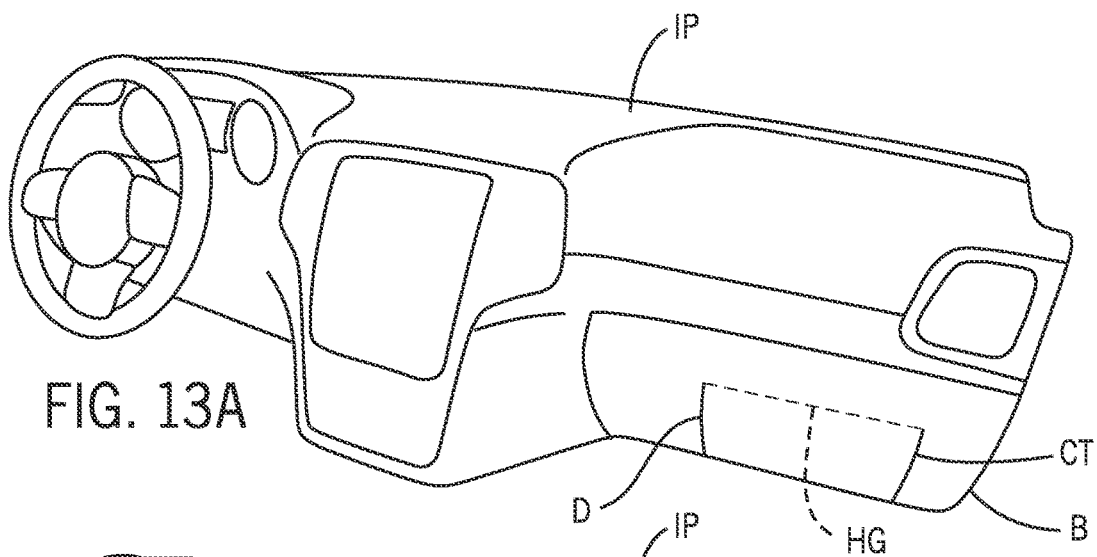
FIG. 13A
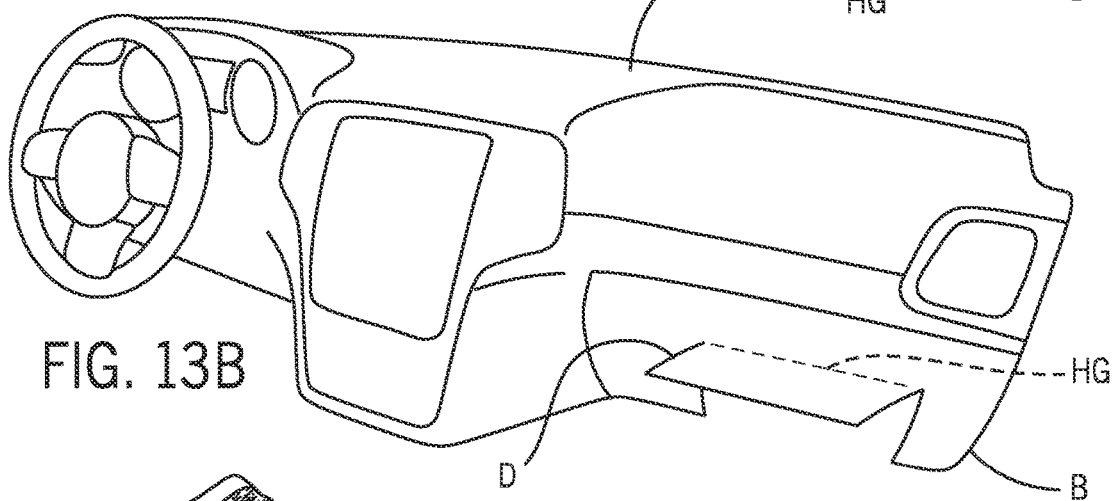
FIG. 13B
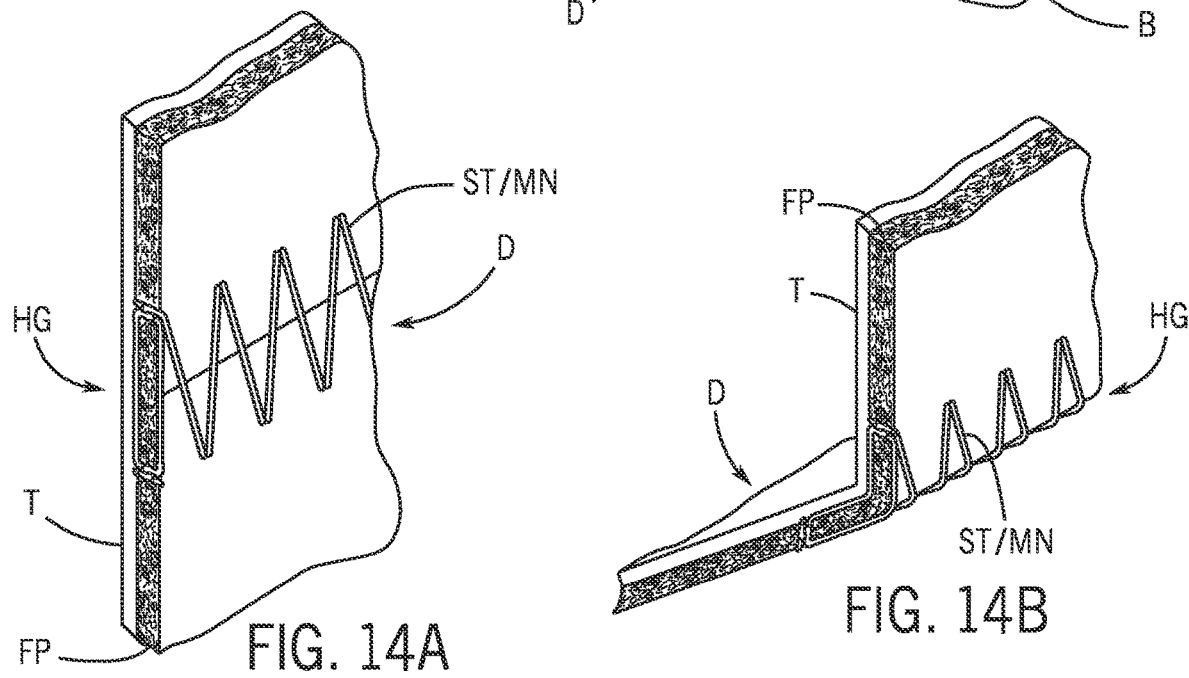
FIG. 14A
FIG. 14B

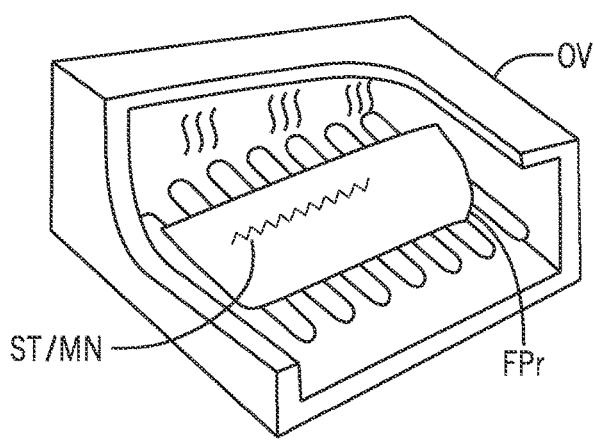
FIG. 16A
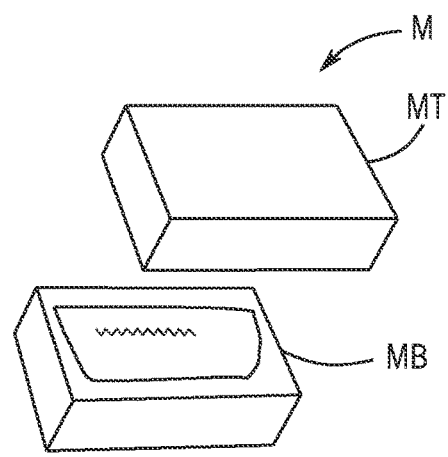
FIG. 16B
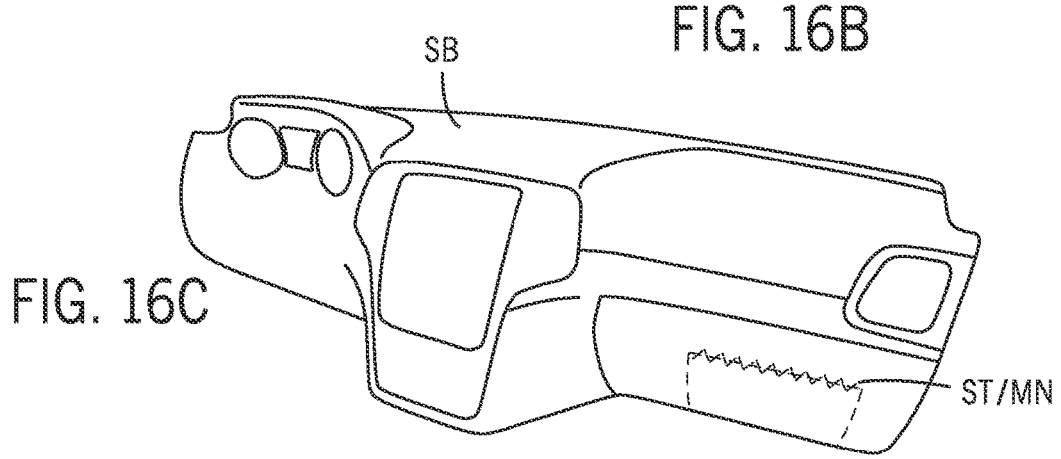
FIG. 16C
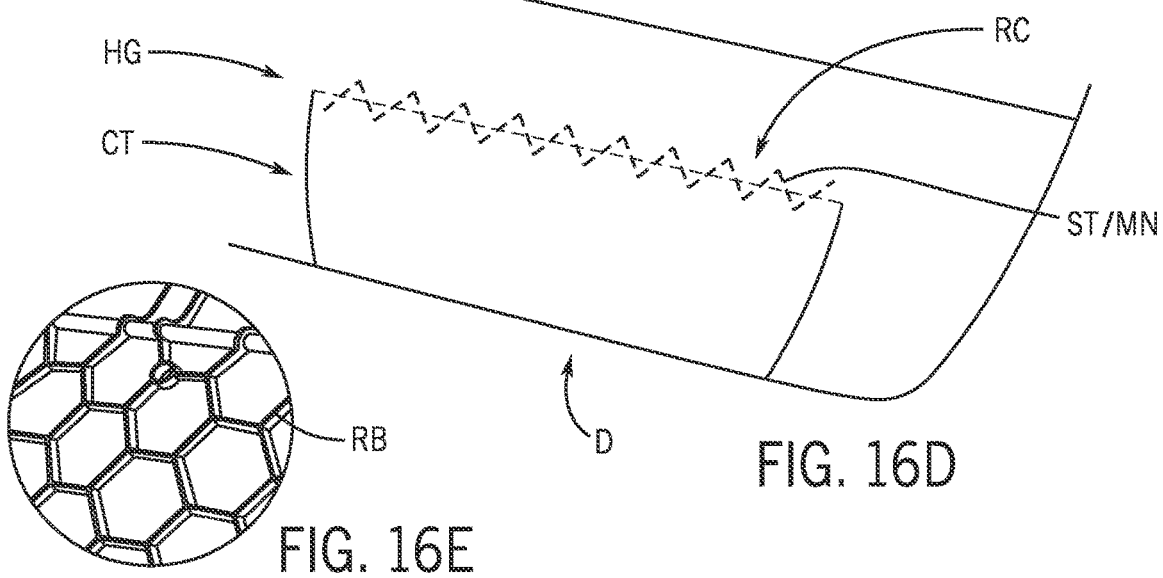
FIG. 16D
FIG. 16E

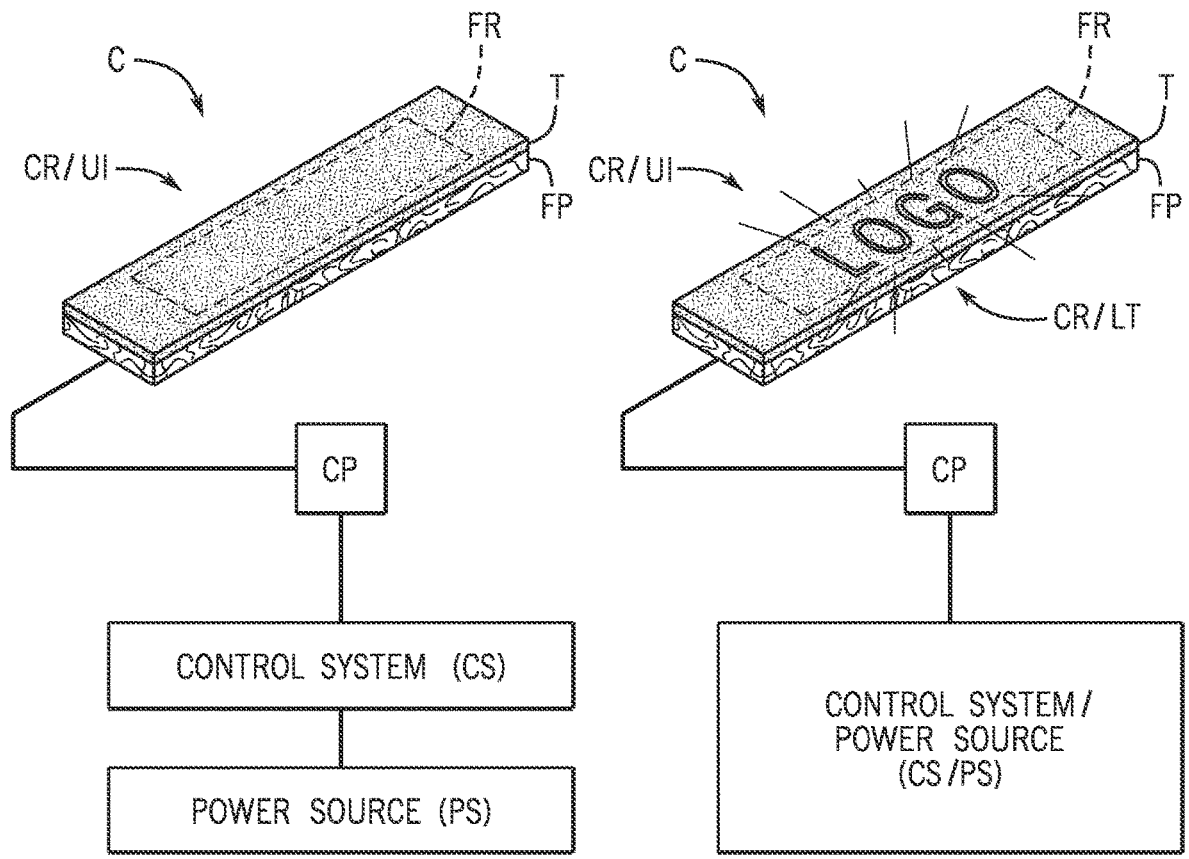
FIG. 30
FIG. 31
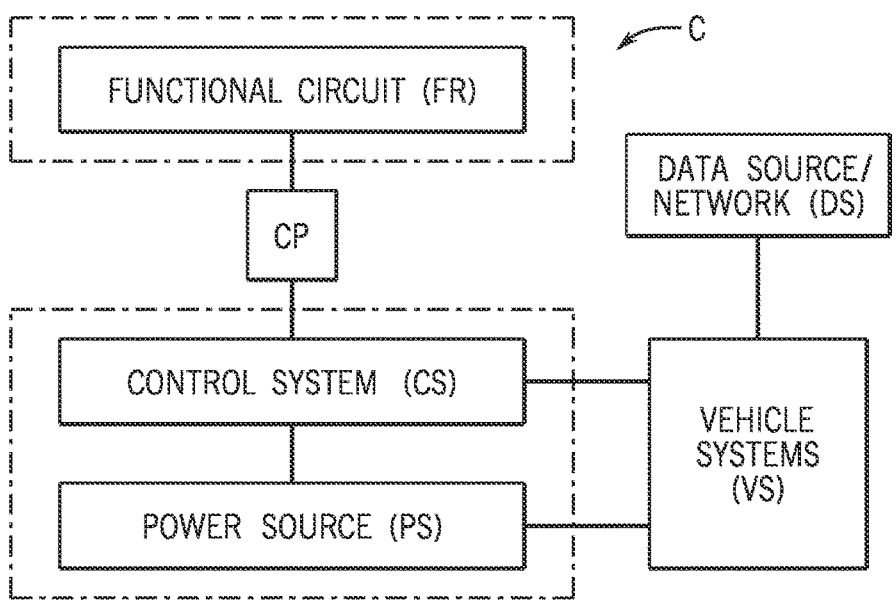
FIG. 32

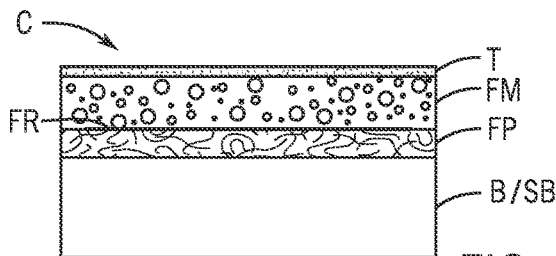
FIG. 35A
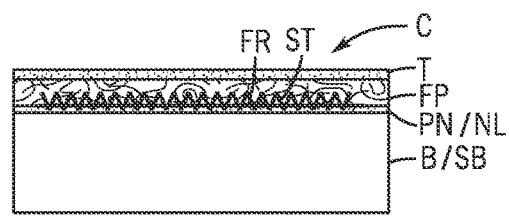
FIG. 36A
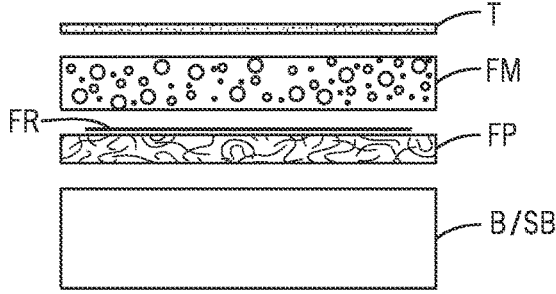
FIG. 35B
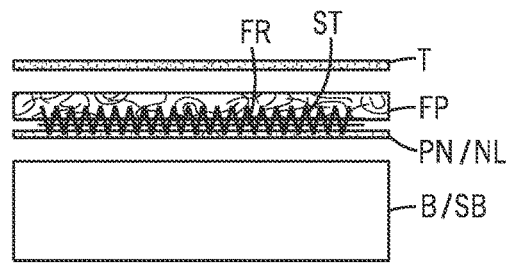
FIG. 36B
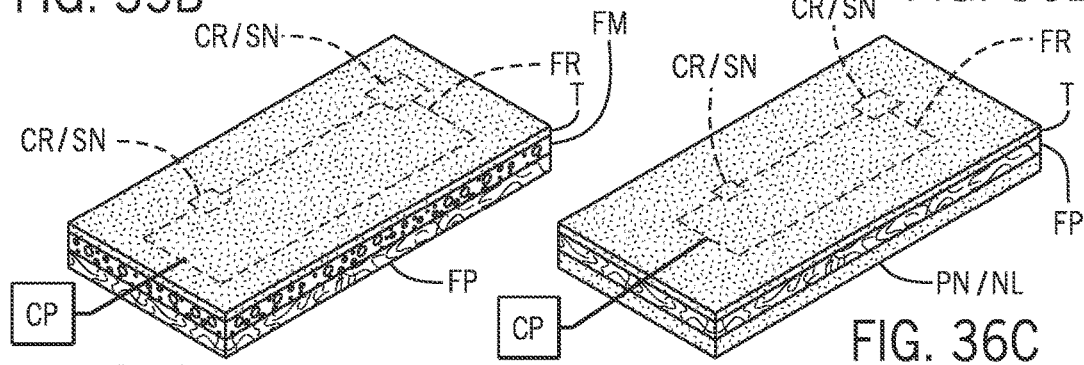
FIG. 35C
FIG. 36C
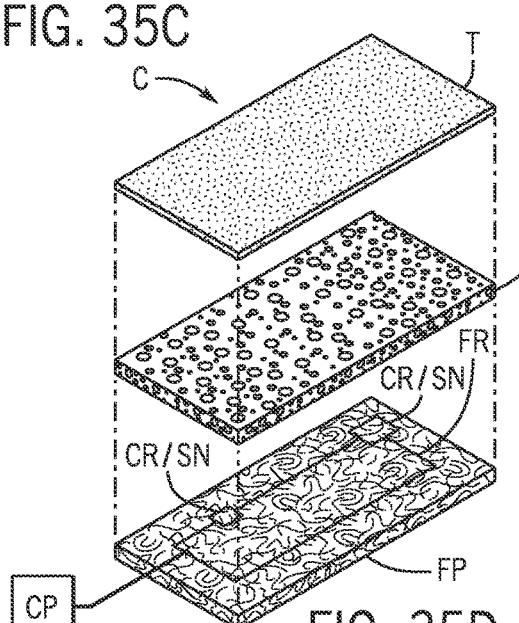
FIG. 35D
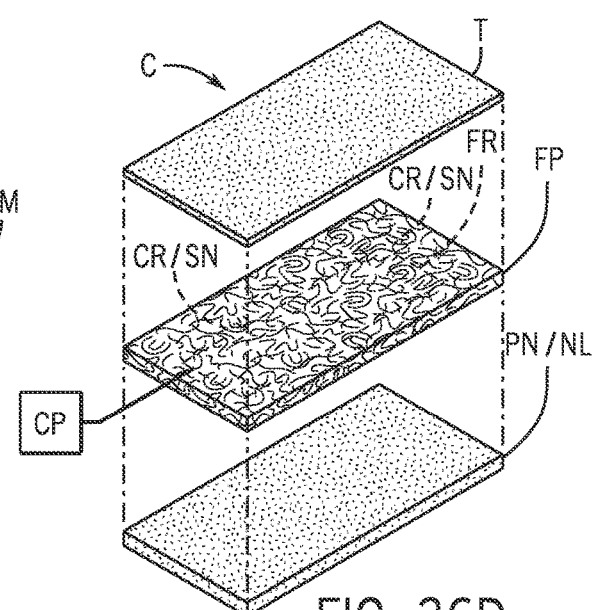
FIG. 36D

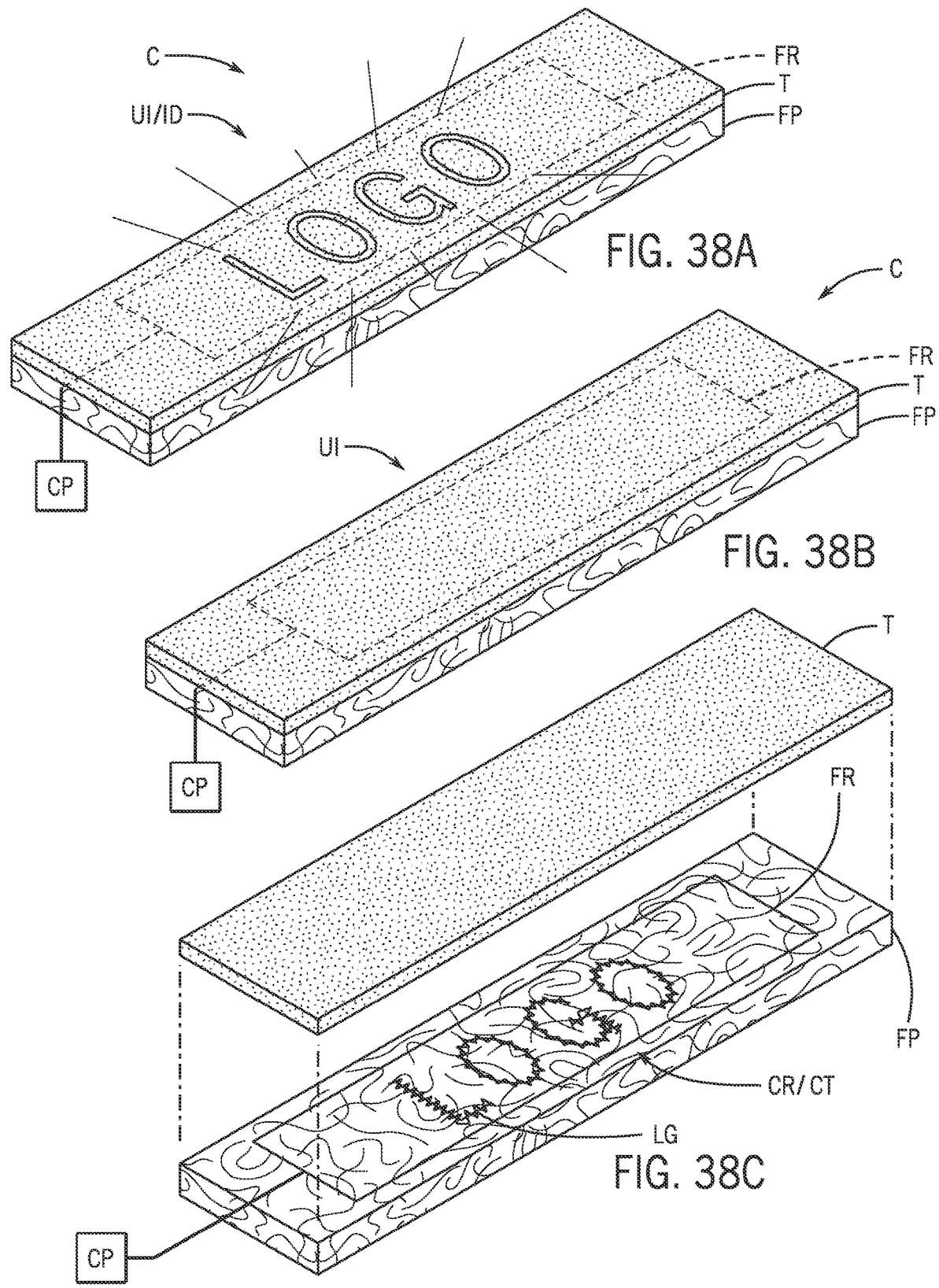

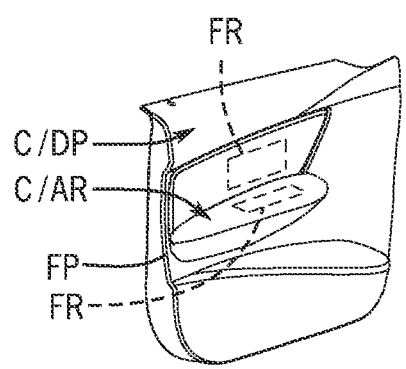
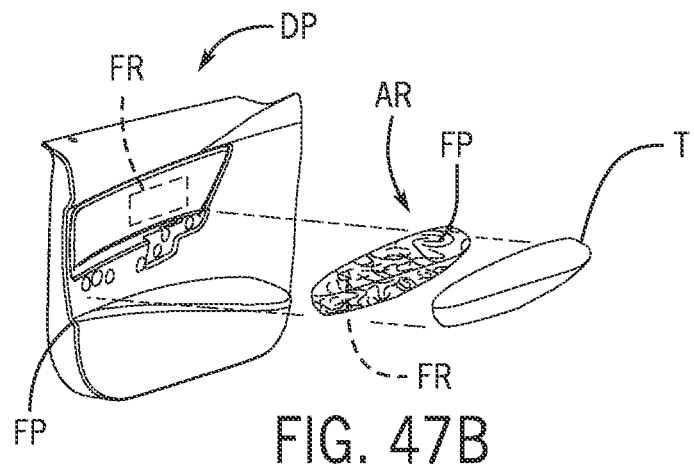
FIG. 47A
FIG. 47B
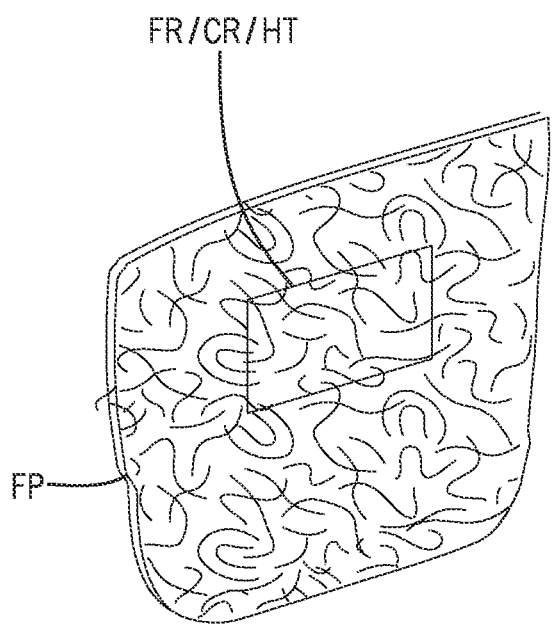
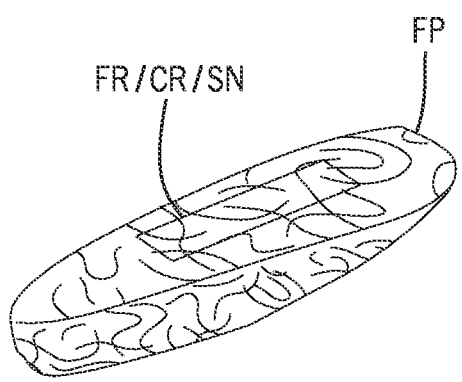
FIG. 47C
FIG. 47D

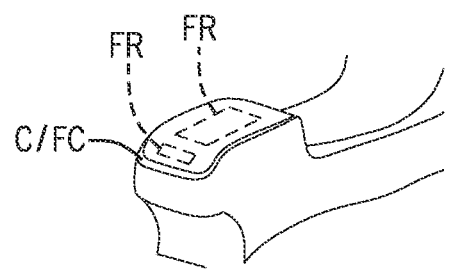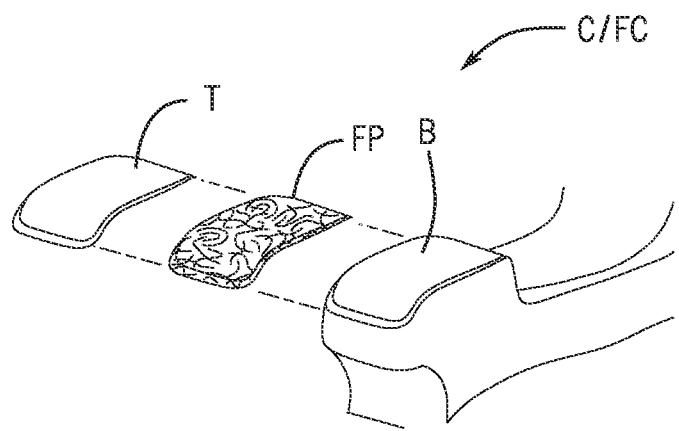
FIG. 48A    FIG. 48B
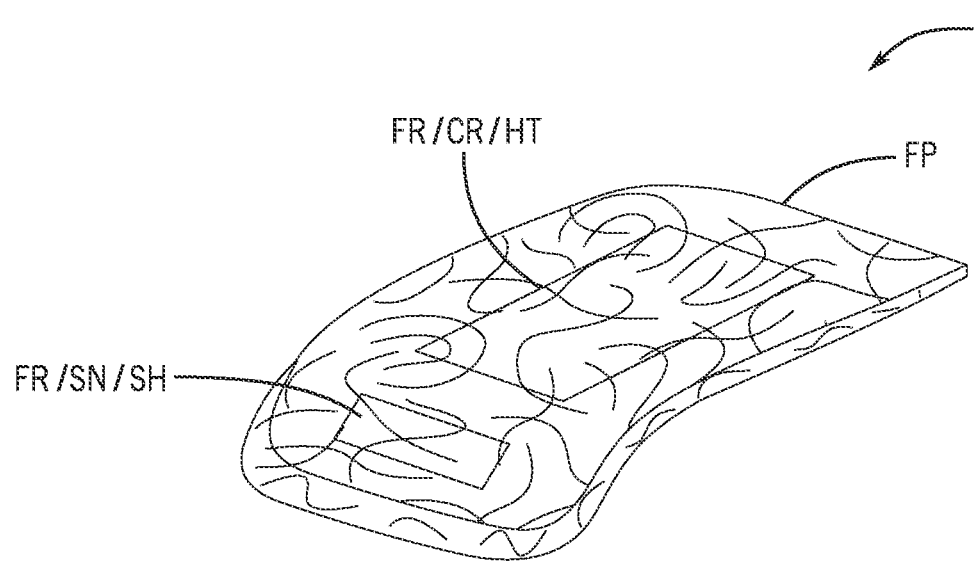
FIG. 48C

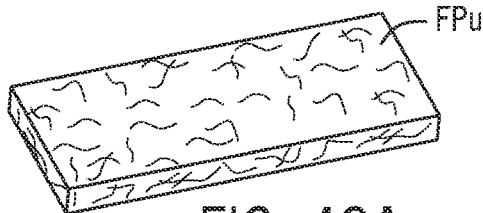
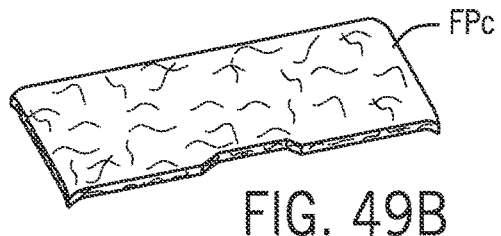
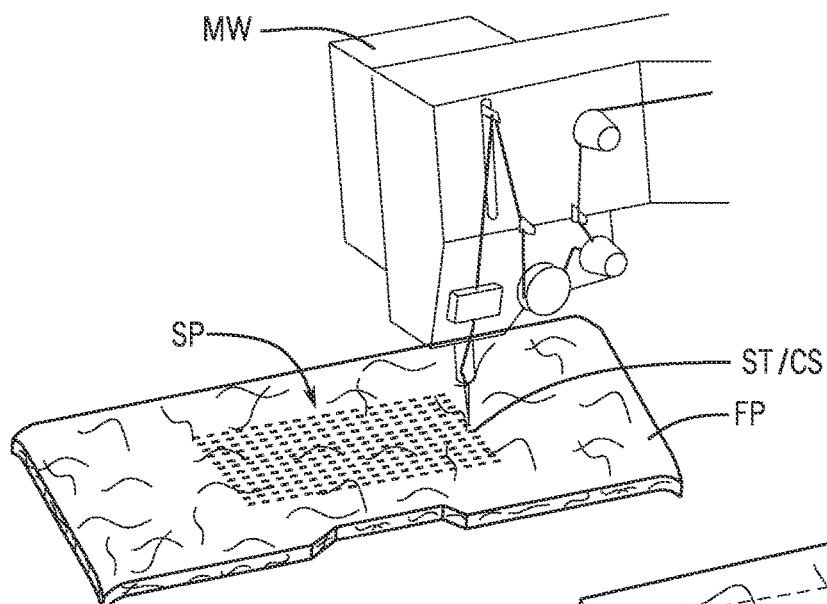
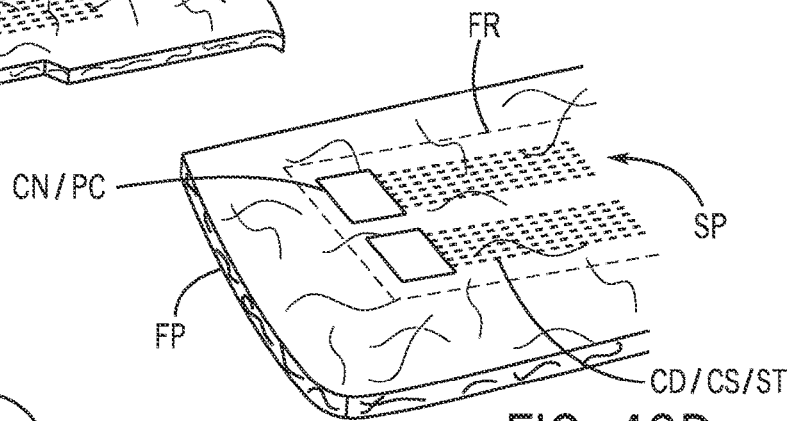
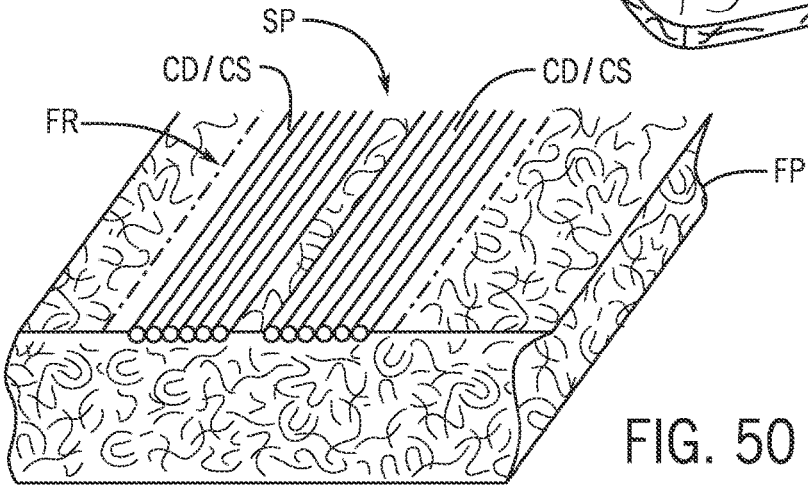

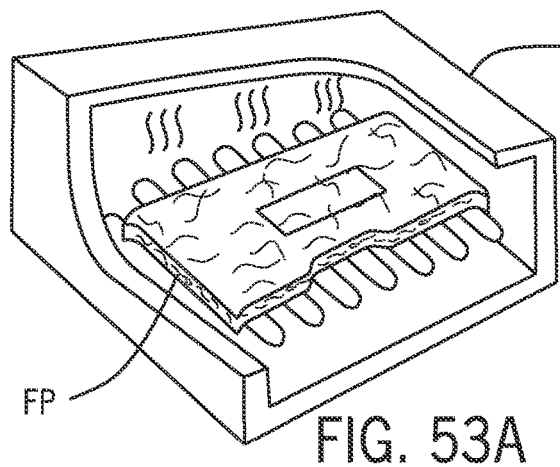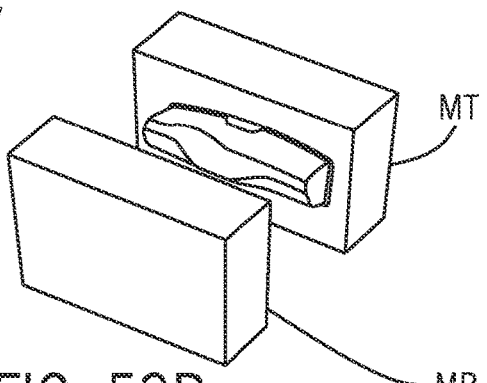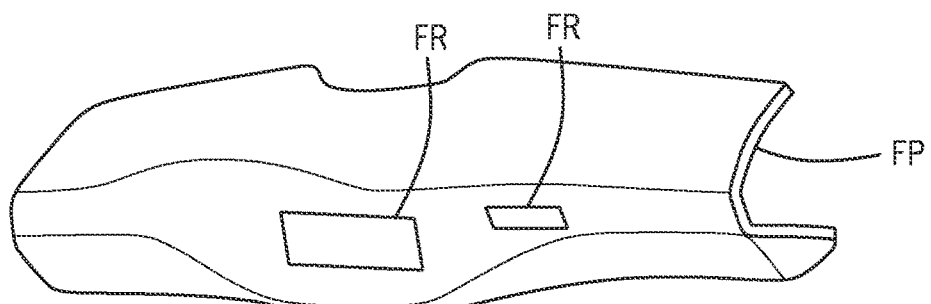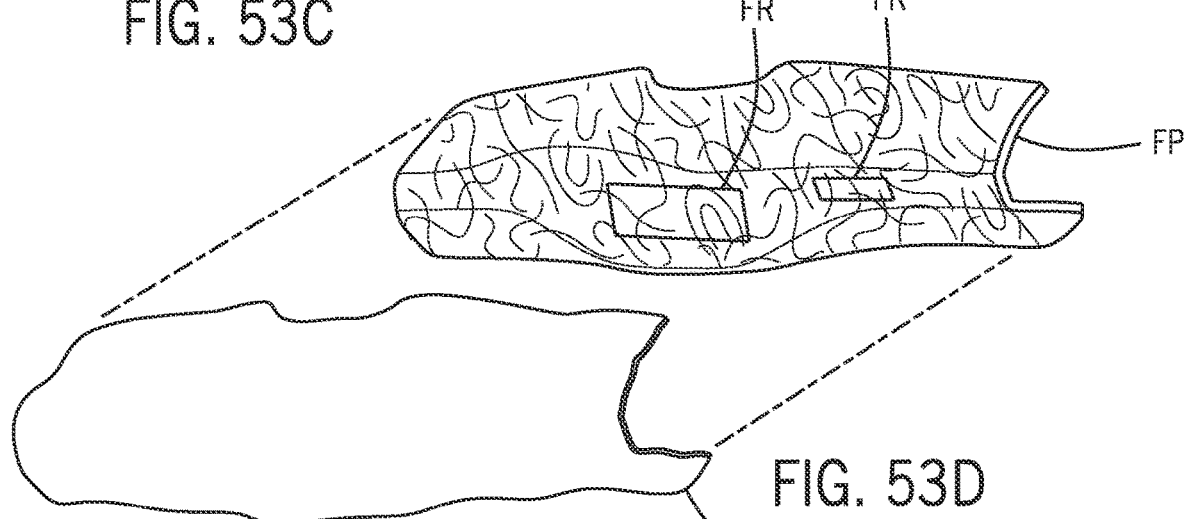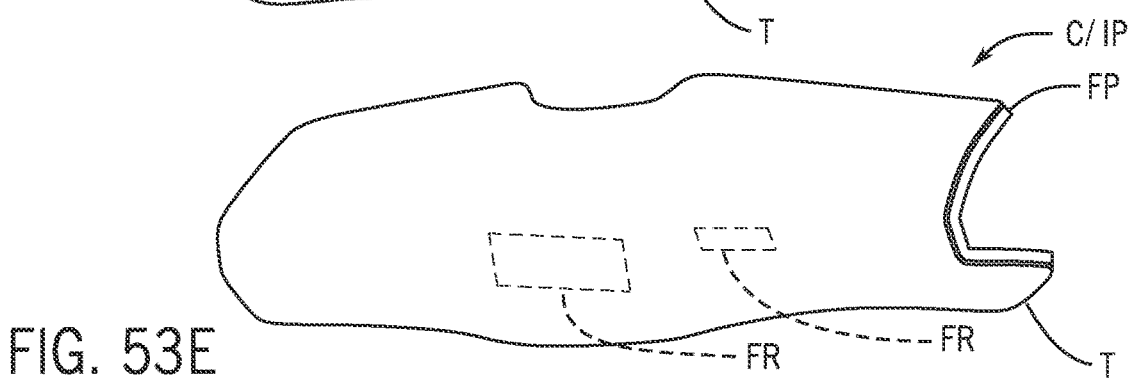
FIG. 53A
FIG. 53B
FIG. 53C
FIG. 53D
FIG. 53E

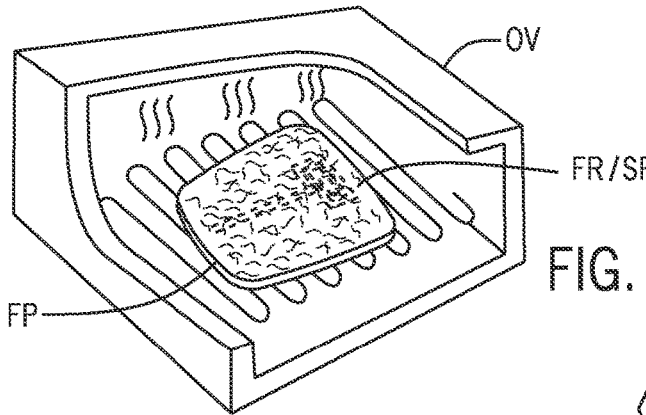
FIG. 56A
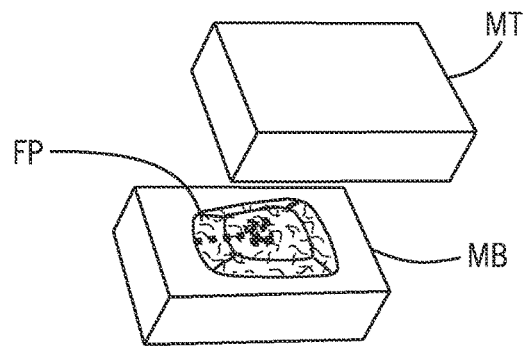
FIG. 56B
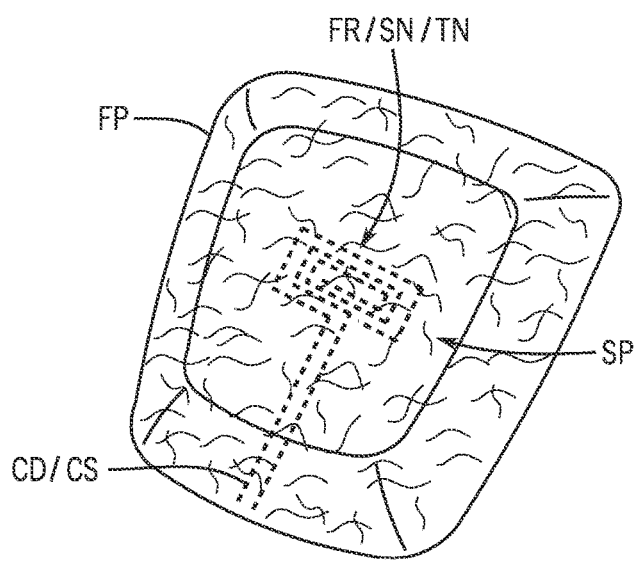
FIG. 56C
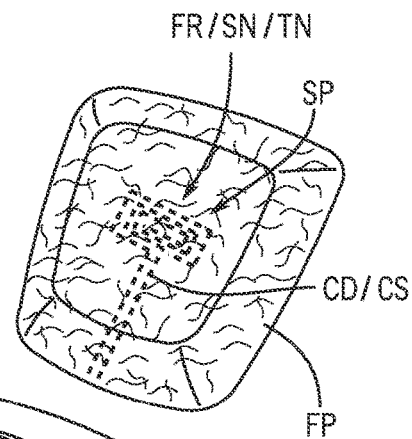
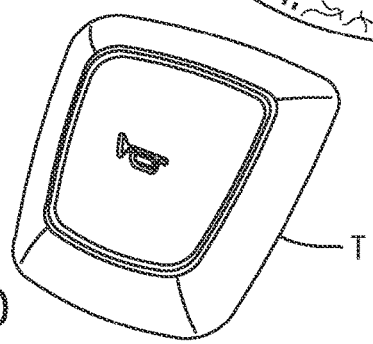
FIG. 56D

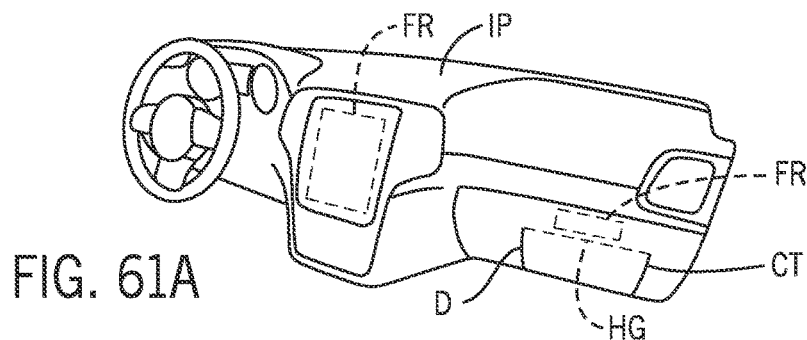
FIG. 61A
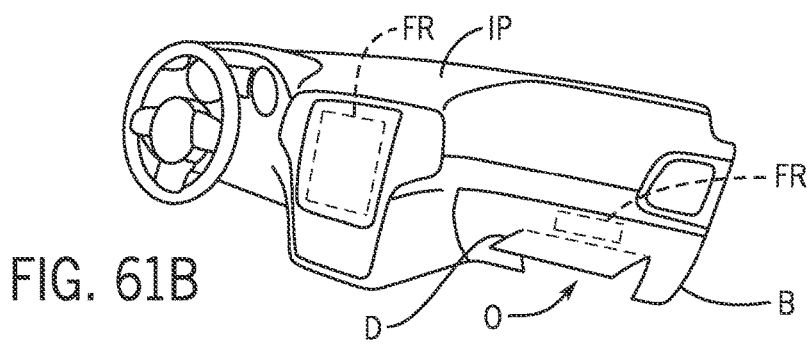
FIG. 61B
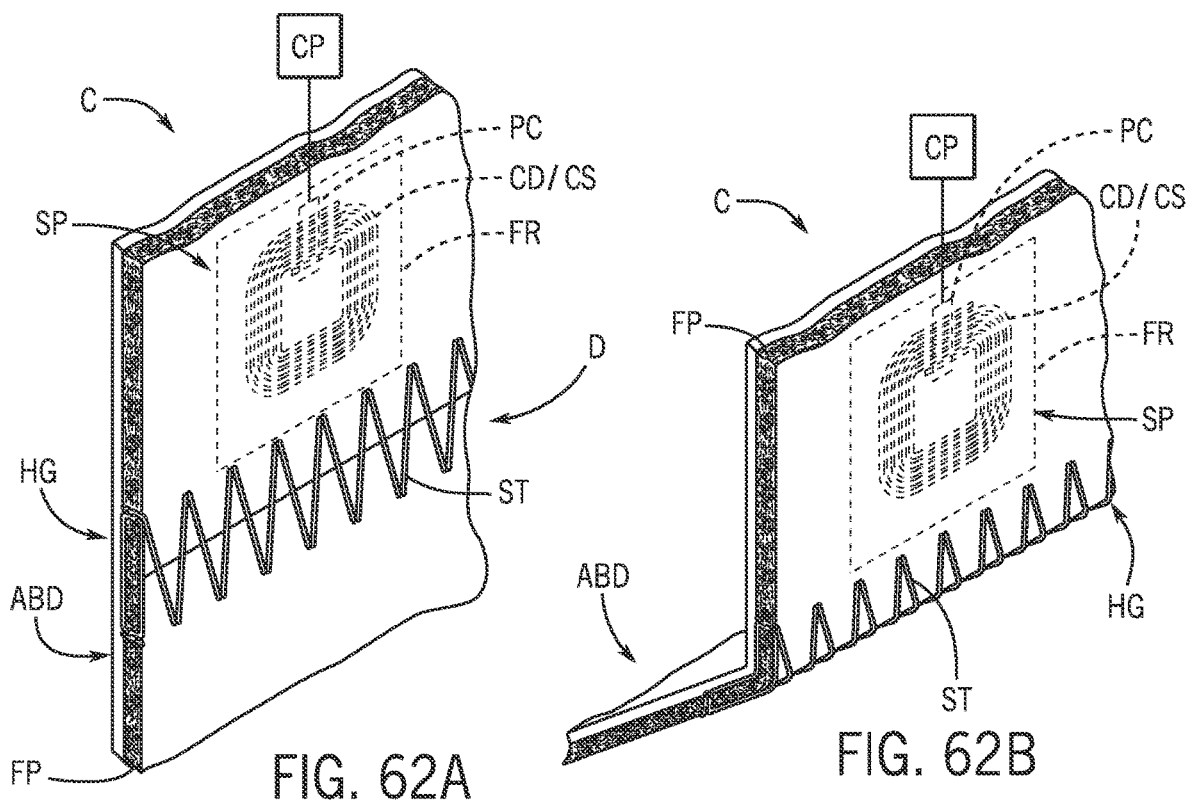
FIG. 62A
FIG. 62B

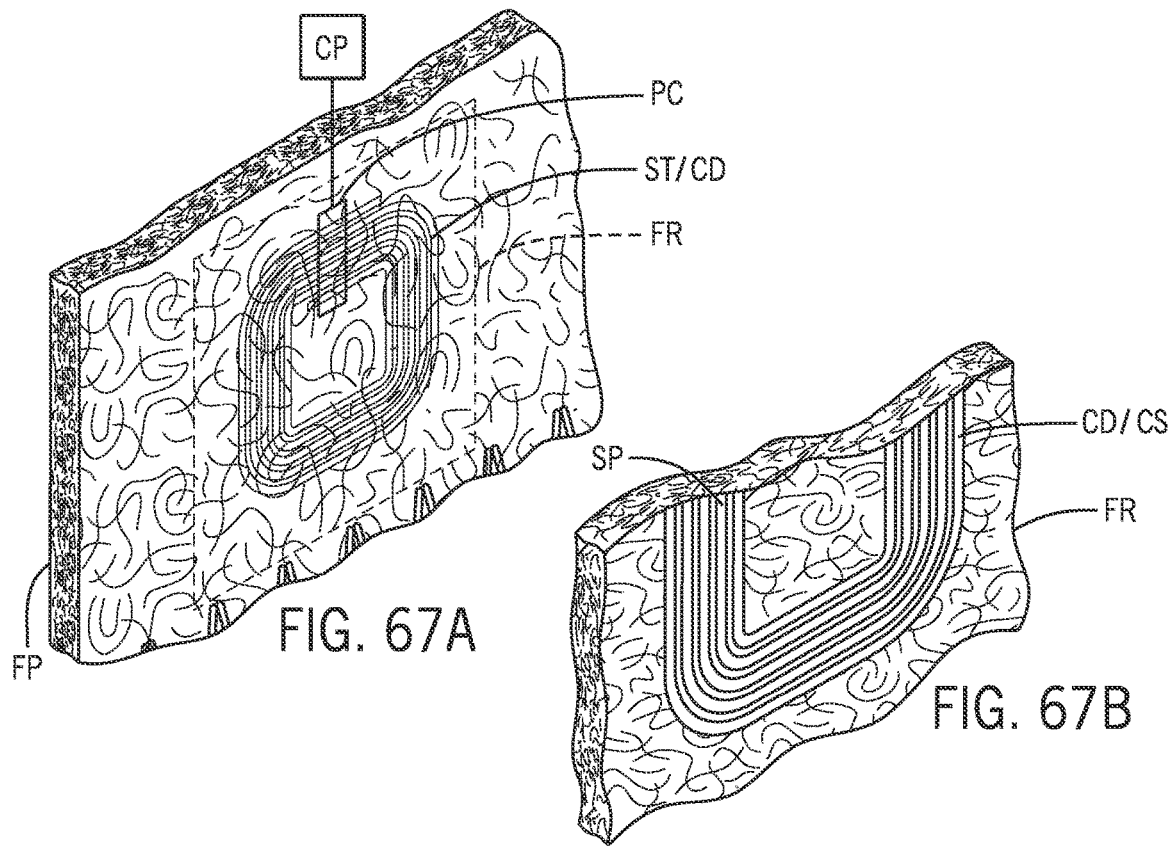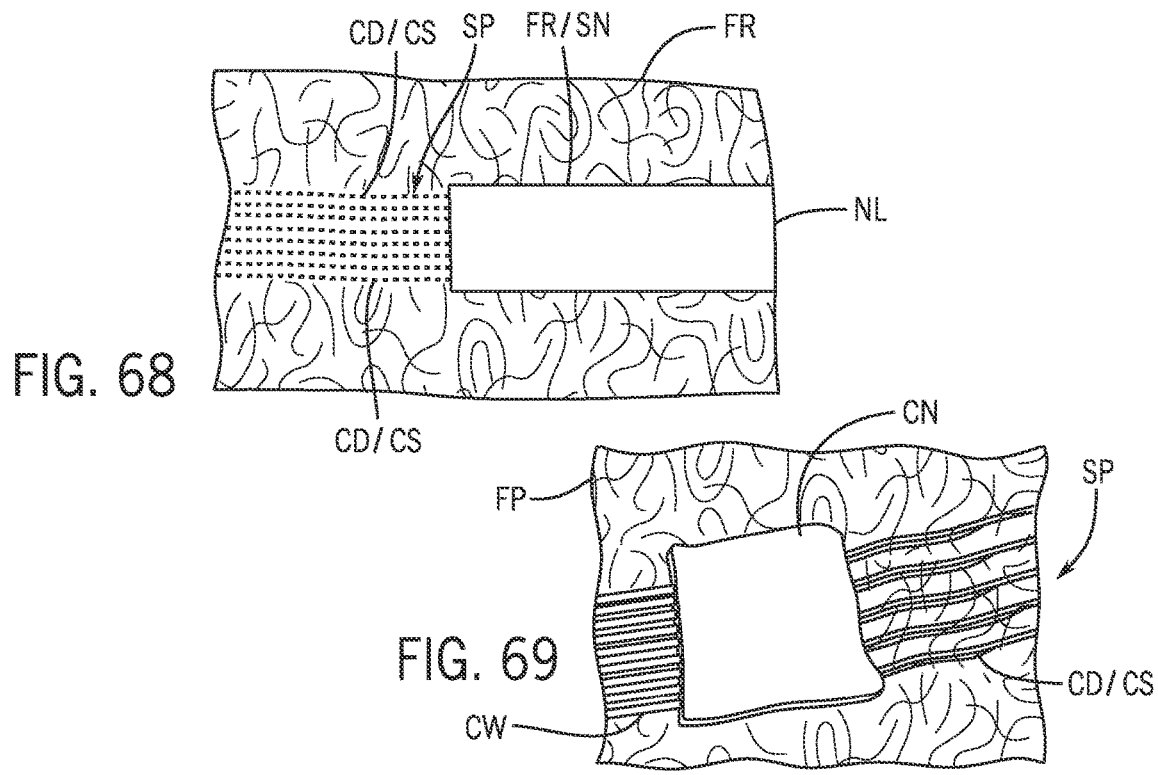

VEHICLE TRIM COMPONENT

CROSS-REFERENCE TO RELATED APPLICATIONS

The present application is a continuation in part of U.S. patent application Ser. No. 17/592,971 titled "VEHICLE TRIM COMPONENT" filed Feb. 4, 2022 which is a continuation in part of U.S. patent application Ser. No. 17/006,213 titled "VEHICLE TRIM COMPONENT" filed Aug. 28, 2020 (now U.S. Pat. No. 11,325,290), which is a continuation of PCT/International Patent Application No. PCT/US19/39587 titled "VEHICLE TRIM COMPONENT" filed Jun. 27, 2019, which claims the benefit of U.S. Provisional Patent Application No. 62/691,595 titled "VEHICLE TRIM COMPONENT" filed Jun. 28, 2018.

The present application claims priority to and incorporates by reference in full the following patent applications: (a) U.S. Provisional Patent Application No. 62/691,595 titled "VEHICLE TRIM COMPONENT" filed Jun. 28, 2018; (b) PCT/International Patent Application No. PCT/US19/39587 titled "VEHICLE TRIM COMPONENT" filed Jun. 27, 2019; (c) U.S. patent application Ser. No. 17/006,213 titled "VEHICLE TRIM COMPONENT" filed Aug. 28, 2020 (now U.S. Pat. No. 11,325,290); (d) U.S. patent application Ser. No. 17/592,971 titled "VEHICLE TRIM COMPONENT" filed Feb. 4, 2022.

FIELD

The present invention relates to a vehicle interior component.

The present invention relates to a vehicle interior component comprising a composite structure configured to provide a circuit element.

The present invention relates to a vehicle interior component comprising a composite structure configured to provide an arrangement of conductors for a circuit element.

The present invention relates to a vehicle interior component comprising a composite structure configured to provide an arrangement of conductors for a circuit element to provide a functional circuit.

The present invention relates to a vehicle interior component comprising a composite structure comprising a fiber panel configured to provide an arrangement of conductors for a circuit element to provide a functional circuit.

BACKGROUND

It is known to provide a vehicle interior component comprising a composite structure configured to provide a circuit element.

It would be advantageous to provide an improved vehicle interior component comprising a composite structure configured to provide a circuit element.

It would be advantageous to provide a vehicle interior component comprising a composite structure configured to provide an arrangement of conductors for a circuit element.

It would be advantageous to provide a vehicle interior component comprising a composite structure configured to provide an arrangement of conductors for a circuit element to provide a functional circuit.

It would be advantageous to provide a vehicle interior component comprising a composite structure comprising a fiber panel configured to provide an arrangement of conductors for a circuit element to provide a functional circuit.

It would be advantageous to provide a vehicle interior component comprising a composite structure comprising a fiber panel configured to provide an arrangement of conductors comprising conductive threads for a circuit element to provide a functional circuit.

SUMMARY

The present invention relates to a component for a vehicle interior comprising a composite structure comprising a fiber panel and a cover. The fiber panel may comprise a conductor. The conductor may be configured to provide a functional circuit for the composite structure. The conductor may comprise a pattern of electrically conductive threads. Conductive thread may be within the fiber panel. Conductive thread may be stitched onto the fiber panel. The conductor may comprise a stitch pattern comprising conductive thread comprising the functional circuit. The functional circuit may comprise a user interface. The functional circuit may comprise an input device and/or an output device. The functional circuit may comprise a circuit element. The composite structure may comprise a feature on the fiber panel; the feature may comprise at least one of (a) a resin structure; (b) a resin feature; (c) a molded feature; (d) a molded structure; (e) a rib. The composite structure may comprise a resin structure for the fiber panel adjacent to the functional circuit. The fiber panel may comprise a stitch pattern comprising at least one of (a) conductive thread; (b) non-conductive thread. The component may comprise at least one of a trim panel, an instrument panel, a door panel, an overhead panel, a console, an overhead console, a floor console, an interior trim component, pillar trim, an operator control, a steering control, a steering wheel.

The present invention relates to a component for a vehicle interior comprising a composite structure comprising a fiber panel and a cover. The fiber panel may comprise a conductor. The conductor may comprise conductive thread configured to provide a functional circuit. The conductive thread may comprise a pattern of electrically conductive threads. The composite structure may comprise a stitch pattern in the fiber panel comprising the conductive thread to provide the functional circuit. The functional circuit may comprise a sensor. The functional circuit may comprise at least one of a light, an LED light, a display, an illuminated feature. The functional circuit may comprise at least one of (a) a user interface; (b) an input device; (c) a switch; (d) an output device; (e) a display. The functional circuit may be configured to be connected to at least one of (a) a control system; (b) a vehicle system; (c) a network; (d) a power source. The composite structure may be configured to facilitate deployment of an airbag; the airbag may be configured to deploy through an airbag door; the airbag door may be configured to be formed adjacent to the functional circuit.

The present invention relates to a component for a vehicle interior comprising a composite structure comprising a fiber panel and a cover. The fiber panel may comprise a conductor. The conductor may be configured to provide a functional circuit for the composite structure. The conductor may comprise conductive thread. The conductor may comprise electrically conductive thread. The conductor may comprise a pattern of electrically conductive threads. The conductor may comprise a set of electrically conductive threads. Conductive thread may be within the fiber panel. Conductive thread may be stitched within the fiber panel. Conductive thread may be stitched into the fiber panel. Conductive thread may be stitched onto the fiber panel. The conductor may comprise a stitch pattern comprising conductive thread.

The conductor may comprise a stitch pattern comprising the functional circuit. The functional circuit may comprise a user interface. The functional circuit may comprise an input device and/or an output device. The functional circuit may comprise an input device and an output device. The functional circuit may comprise a connection point. The functional circuit may comprise a circuit element. The functional circuit may be configured for connection to a power source. The functional circuit may be configured for operation by a control system. The fiber panel may comprise a compressed fiber panel. The composite structure may comprise a feature on the fiber panel. The feature may comprise a resin structure. The feature may comprise a resin feature. The feature may comprise a molded feature. The feature may comprise a molded structure. The feature may comprise a rib. The composite structure may comprise a resin structure for the fiber panel. The feature may comprise a resin structure adjacent to the functional circuit. The fiber panel may comprise a stitch pattern comprising conductive thread. The fiber panel may comprise a stitch pattern comprising non-conductive thread. The stitch pattern comprising non-conductive thread may comprise a reinforcement for the fiber panel; the reinforcement may be configured to provide a hinge area for an airbag door. The component may comprise at least one of a trim panel, an instrument panel, a door panel, an overhead panel, a console, an overhead console, a floor console, an interior trim component, pillar trim, an operator control, a steering control, a steering wheel.

The present invention relates to a component for a vehicle interior comprising a composite structure comprising a fiber panel and a cover. The fiber panel may comprise a conductor. The conductor may comprise conductive thread configured to provide a functional circuit. The conductive thread may comprise a pattern of electrically conductive threads. The composite structure may comprise a stitch pattern in the fiber panel comprising the conductive thread to provide the functional circuit. The functional circuit may comprise a sensor. The sensor may be configured to operate as a switch. The functional circuit may comprise at least one of a light, an LED light, a display, an illuminated feature. The functional circuit may comprise a user interface. The functional circuit may comprise an input device. The input device may comprise a switch. The functional circuit may comprise an output device. The output device may comprise a display. The functional circuit may comprise an input device and an output device. The component may comprise a connector for the functional circuit. The functional circuit may be configured to be connected to a control system. The functional circuit may be configured to be connected to a vehicle system. The functional circuit may be configured to be connected to a network. The functional circuit may be configured to be connected to a power source. The composite structure may be configured to facilitate deployment of an airbag; the airbag may be configured to deploy through an airbag door; the airbag door may be configured to be formed adjacent to the functional circuit. The composite structure may comprise a stitch pattern in the fiber panel comprising non-conductive thread; the stitch pattern may be configured to provide a reinforcement for a hinge area for the airbag door. The component may comprise at least one of a trim panel, an instrument panel, a door panel, an overhead panel, a console, an overhead console, a floor console, an interior trim component, pillar trim, an operator control, a steering control, a steering wheel.

The present invention relates to a component for a vehicle interior configured to provide a panel configured to be moved between a closed position and an open position comprising a structural substrate comprising a base providing the panel and a hinge area for the panel; and a reinforcement for the panel at the hinge area. The reinforcement may comprise a stitch pattern configured to reinforce the hinge area during movement of the panel. The hinge area may comprise a hinge. The hinge may comprise material of the structural substrate and the reinforcement. The panel of the base of the structural substrate may comprise a fiber panel. The stitch pattern of the reinforcement may comprise thread sewn into the fiber panel. The structural substrate may comprise the fiber panel and thread sewn into the fiber panel as the reinforcement. The stitch pattern of the reinforcement may comprise thread sewn into the structural substrate at the hinge area. The panel may comprise a door. The structural substrate may comprise a surface for the stitch pattern; the stitch pattern may be pressed into the surface of the structural substrate. The structural substrate may comprise at least one of (a) a compression-formed component; (b) a generally rigid fiber mat; (c) a fiber panel. The structural substrate may comprise a base; the panel may be configured to be movable relative to the base; the reinforcement may be configured to reinforce the panel to the base at the hinge. The component may comprise a cover providing an exterior surface; the stitch pattern may be concealed at the exterior surface by the cover. The reinforcement may be comprised of at least one of (a) KEVLAR, (b) aramid, (c) nylon, (d) polyester, (e) thread, (f) ceramic fibers, (g) polymeric fibers, (h) synthetic fibers. The component may comprise at least one of (a) an instrument panel; (b) a door panel; (c) a trim panel; (d) a trim component; (e) a trim component wherein the panel comprises a door; (f) a trim component wherein the panel comprises an airbag door.

The present invention relates to a component for a vehicle interior configured to provide a panel configured to be moved between a closed position and an open position prepared in a mold providing a first mold surface and a second mold surface by a method comprising the steps of: providing a substrate comprising a base; forming the substrate with a hinge area so that the panel is configured to be movable relative to the base of the substrate at the hinge area; joining a reinforcement in the substrate at the hinge area for the panel; and compressing the substrate between the first mold surface and the second mold surface of the mold to form a structural substrate having a shape. The shape of the structural substrate may be formed at least partially by the first mold surface and the second mold surface. The reinforcement at the hinge area for the panel is configured to secure the panel to the base for movement between the closed position and the open position. The step of joining the reinforcement in the substrate may comprise sewing a stitch pattern in the substrate. The substrate may comprise a fiber panel. The stitch pattern of the reinforcement may comprise thread sewn into the fiber panel. The structural substrate may comprise the fiber panel and thread sewn into the fiber panel as the reinforcement. The hinge area may comprise a hinge and the panel may comprise a door. The hinge may comprise a living hinge formed in the base of the substrate. The hinge may comprise material from the substrate reinforced by the stitch pattern of the reinforcement. The hinge area may comprise a recess in the substrate. The step of forming the substrate may comprise at least partially cutting the panel from the base of the substrate and at least partially retaining material for a hinge for the panel at the hinge area. The substrate may comprise a fiber panel. The component may comprise the step of providing a cover layer on the substrate; the stitch pattern of the reinforcement may be at least partially concealed by the cover layer. Joining the reinforcement in the substrate may comprise sewing a stitch pattern in a surface of the substrate.

The present invention relates to a component for a vehicle interior configured to provide a panel configured to be moved between a closed position and an open position comprising: (a) a structural substrate formed from a fiber panel; (b) a cover for the structural substrate providing an exterior surface. The structural substrate may comprise a hinge for the panel and a stitch pattern at the hinge. The stitch pattern may comprise thread sewn into the fiber panel. The stitch pattern may be configured to provide a reinforcement at the hinge when the panel is rotated between the closed position and the open position. The structural substrate may comprise the fiber panel and thread sewn into the fiber panel as the reinforcement. The stitch pattern may be formed into the structural substrate so that the stitch pattern is not visible at the exterior surface of the cover.

The present invention relates to a component for a vehicle interior configured for an airbag chute and an airbag module providing an airbag configured to be deployed through an opening into the vehicle interior comprising a structural substrate configured to provide at least one door upon deployment of the airbag to facilitate deployment of the airbag from the airbag module through the opening. The structural substrate may comprise a reinforcement configured to secure the at least one door to the structural substrate during deployment of the airbag. The reinforcement may comprise a top stitch and a bottom stitch. The top stitch may be configured to secure the door to the structural substrate upon deployment of the airbag. The structural substrate may comprise a fiber panel. The reinforcement may comprise thread sewn into the fiber panel. The structural substrate may comprise the fiber panel and thread sewn into the fiber panel as the reinforcement. The structural substrate may comprise a panel comprised at least partially of fibers; the thread may be sewn into and pressed into a surface of the panel. The structural substrate may comprise at least one of (a) a compression-formed component; (b) a generally rigid fiber mat; (c) a panel comprised at least partially of fibers. The top stitch may comprise a thread weight and the bottom stitch may comprise a thread weight; the thread weight of the top stitch may be generally greater than the thread weight of the bottom stitch. The bottom stitch may be configured to separate upon deployment of the airbag to facilitate deployment of the airbag from the airbag module through the opening. The reinforcement may be comprised of at least one of (a) KEVLAR, (b) aramid, (c) nylon, (d) polyester, (e) thread, (f) ceramic fibers, (h) polymeric fibers, (i) synthetic fibers. The component may be formed by a process comprising the step of injecting resin into a mold after a compression-formed structure comprising the structural substrate is formed to form an ancillary component of a composite structure.

The present invention relates to a component for a vehicle interior configured for an airbag chute and an airbag module providing an airbag configured to be deployed through an opening into the vehicle interior comprising a structural substrate configured to provide at least one door upon deployment of the airbag to facilitate deployment of the airbag from the airbag module through the opening. The structural substrate may comprise a reinforcement configured to secure the at least one door to the structural substrate during deployment of the airbag. The reinforcement may comprise a stitch pattern. The structural substrate may comprise a fiber panel. The stitch pattern may comprise a pattern of threads sewn into the fiber panel. The structural substrate may comprise the fiber panel and the pattern of threads sewn into the fiber panel as the reinforcement. The pattern of threads may comprise a first set of threads and a second set of threads. The stitch pattern may comprise a network of threads formed into the structural substrate. The stitch pattern may comprise a first set of threads comprising a first thread weight and second set of threads comprising a second thread weight; the first thread weight may be greater than the second thread weight. The component may comprise a cover; the pattern of threads may be pressed into a surface of the fiber panel so that the structural substrate may comprise a generally flat surface for the cover. The structural substrate may comprise a compression-formed component from the fiber panel. The stitch pattern may comprise an upper set of threads and a lower set of threads; the upper set of threads may comprise a set of retaining threads. The lower set of threads may comprise a set of sacrificial threads; the door may be configured to remain at least partially attached at a hinge provided by the set of retaining threads. The component may comprise a cover providing an exterior surface; the stitch pattern may be formed into the structural substrate so that the stitch pattern is not visible at the exterior surface of the cover. The component may comprise at least one of an instrument panel; a door panel; a trim panel; a trim component.

The present invention relates to a component for a vehicle interior configured to support an airbag module providing an airbag for deployment through an opening into the vehicle interior prepared using a mold by a process comprising the steps of: (a) providing a pre-form substrate; (b) joining a reinforcement to the pre-form substrate in at least one hinge area to form a reinforced pre-form substrate; (c) disposing the reinforced pre-form substrate onto a first surface of the mold; and (d) compressing the reinforced pre-form substrate between the first surface and a second surface of the mold to form the reinforced pre-form substrate into a structural substrate having a shape. The shape may correspond to a first contour of the first surface and a second contour of the second surface. The structural substrate may be configured to provide at least one door established upon deployment of the airbag to facilitate deployment of the airbag from the airbag module through the opening. The reinforcement may be configured to secure the at least one door to the structural substrate during deployment of the airbag. The step of joining the reinforcement to the pre-form substrate may comprise sewing at least one of a thread or a stitch to the pre-form substrate. The step of joining the reinforcement to the pre-form substrate may comprise piercing an opening in the pre-form substrate and joining a top stitch to a bottom stitch at the opening. The component may comprise a cover providing an exterior surface; the reinforcement may not be visible at the exterior surface of the cover.

The present invention relates to a component for a vehicle interior configured to support an airbag chute and an airbag module providing an airbag configured to be deployed through an opening into the vehicle interior comprising: a structural substrate providing at least one door established upon deployment of the airbag to facilitate deployment of the airbag from the airbag module through the opening. The structural substrate may comprise a reinforcement configured to secure the at least one door to the structural substrate during deployment of the airbag. The reinforcement may comprise at least one stitch. The reinforcement may comprise a top stitch and a bottom stitch. The top stitch may comprise a thread weight and the bottom stitch may comprise a thread weight; the thread weight of the top stitch may be generally greater than the thread weight of the bottom stitch. The top stitch may comprise 210 Tex thread; the bottom stitch may comprise 70 Tex thread. The bottom stitch may be configured to separate upon deployment of the airbag to facilitate deployment of the airbag from the airbag module through the opening. The top stitch may be configured to secure the door to the structural substrate upon deployment of the airbag. The top stitch may be configured to stretch upon deployment of the airbag to secure the door to the structural substrate. The reinforcement may be comprised of bonded nylon thread. The reinforcement may be comprised of at least one of (a) KEVLAR, (b) aramid, (c) nylon, (d) polyester, (e) thread, (f) ceramic fibers, (h) polymeric fibers, (i) synthetic fibers. The structural substrate may comprise a panel comprised at least partially of fibers; the reinforcement may be comprised of thread sewn to the panel. The thread may be pressed into a surface of the panel during a compression forming process. The panel may comprise a depression; the thread may be joined to the panel at the depression. The thread and the panel may form a generally continuous surface for the component. The structural substrate may comprise a compression-formed component. The compression-formed component may comprise a recess in a back side of the structural substrate configured to establish the opening so that the airbag will deploy through the compression-formed component at the opening. The structural substrate may be formed at least partially from fibers. The component may further comprise a cover to provide a surface on a front side of the structural substrate. Contact between the airbag and the at least one door may induce tearing of the cover to establish the opening for the airbag and to facilitate deployment of the airbag through the opening. The airbag chute may define at least one hinge area for the at least one door; the reinforcement may be positioned adjacent the hinge area. The structural substrate may comprise a generally rigid fiber mat. The component may further comprise a cover; the cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil.

The present invention relates to a vehicle interior component produced in a mold comprising a first surface and a second surface by a process comprising: placing a pre-form substrate onto the first surface of the mold, forming a compression-formed structure from the pre-form substrate by compressing the pre-form substrate between the first surface of the mold and the second surface of the mold, and applying a cover to the compression-formed structure to form a panel assembly providing a surface effect. The pre-form substrate may comprise a reinforced pre-form substrate. The reinforcement may comprise at least one of (a) KEVLAR, (b) aramid, (c) nylon, (d) polyester, (e) thread, (f) ceramic fibers, (h) polymeric fibers, (i) synthetic fibers. The substrate layer may comprise a panel comprised at least partially of fibers; the reinforcement may be comprised of thread sewn to the panel. The compression-formed structure may comprise the substrate layer and the reinforcement. The reinforced pre-form substrate may comprise a surface effect comprising a generally smooth texture. The surface effect of the panel assembly may generally comprise the surface effect of the reinforced pre-from substrate. The step of forming the compression-formed structure may comprise forming the reinforcement and the pre-form substrate into a generally continuous surface. The substrate layer for the pre-form substrate may comprise a fiber mat. The substrate layer may comprise a generally rigid fiber mat. The step of forming the compression-formed structure may comprise forming the substrate layer into a generally rigid form. The surface effect of the panel assembly may comprise the generally rigid form of the substrate layer of the compression-formed structure. The surface effect of the panel assembly may comprise a generally smooth texture and a generally rigid form. The generally smooth texture of the panel assembly may be provided by (a) a surface effect of the cover and (b) a surface effect of the pre-form substrate. The cover of the panel assembly may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil. The compression-formed structure may comprise a shape. The panel assembly may comprise at least partially the shape of the compression-formed structure. The shape may comprise a first contour provided by the first surface of the mold and a second contour provided by the second surface of the mold. The substrate layer for the pre-form substrate may comprise a fiber mat. The process may comprise the step of forming the pre-form substrate from a generally compressible fiber mat. The pre-form substrate may comprise natural fibers and a resin. The resin may comprise polypropylene and the natural fibers comprise at least one of (a) flax; (b) kenaf. The pre-form substrate may comprise an area weight of between 1000 grams per square meter and 1800 grams per square meter. The pre-form substrate may comprise a thickness of between 1.5 mm and 4 mm; the compression-formed structure may comprise a thickness of between 0.8 mm and 3 mm. The process may comprise the step of heating the pre-formed substrate; the pre-formed substrate may be compressed as the pre-formed substrate cools. The process may comprise the step of injecting resin into the mold after the compression-formed structure is formed to form an ancillary component of the panel assembly.

The present invention relates to a component for a vehicle interior configured to support an airbag module configured to deploy an airbag through an airbag chute by establishing a door providing an opening into the vehicle interior for the airbag comprising a composite structure comprising a structural substrate formed from a fiber panel and a cover for the structural substrate providing an exterior surface. The structural substrate may comprise a stitch pattern. The composite structure may be configured so that when the airbag is deployed from the airbag module the stitch pattern provides a reinforcement for the door providing the opening so that the airbag can be deployed through the opening while the door remains at least partially attached to the composite structure. The reinforcement may comprise a set of threads. The stitch pattern may provide the reinforcement at a hinge area for the door. The stitch pattern may comprise a set of threads. The set of threads for the stitch pattern may comprise a first set of threads and a second set of threads. The set of threads for the stitch pattern may comprise an upper set of threads and a lower set of threads. The upper set of threads may comprise a set of retaining threads and the lower set of threads may comprise a set of sacrificial threads. The set of threads for the stitch pattern may comprise a set of retaining threads configured to stretch and a set of sacrificial threads configured to break. The door may remain at least partially attached to the composite structure by the set of retaining threads. The retaining threads may provide the reinforcement for the door. The sacrificial threads may be configured to rupture when the airbag establishes the door and the opening in the composite structure. The set of threads for the stitch pattern may comprise a set of upper threads and a set of lower threads; the upper threads may provide a hinge for the door; the lower threads may comprise sacrificial threads configured to rupture when the airbag establishes the opening in the composite structure. The stitch pattern may be provided on the fiber panel. The stitch pattern may be formed into the structural substrate. The stitch pattern may be formed into the structural substrate so that the stitch pattern may not be visible at the exterior surface of the cover. The stitch pattern may comprise a network of threads in the fiber panel formed into the structural substrate. The reinforcement provided by the stitch pattern may comprise reinforcement for the composite structure. The stitch pattern may comprise a first set of threads comprising a first thread weight and second set of threads comprising a second thread weight; the first thread weight may be larger than the second thread weight. The stitch pattern may comprise a set of retaining threads comprising 210 Tex thread and a set of sacrificial threads comprising 70 Tex thread. The set of retaining threads may be configured to stretch upon deployment of the airbag through the door for the composite structure. The stitch pattern may comprise a set of threads at least partially sewn into the fiber panel of the structural substrate. The set of threads of the stitch pattern may be pressed into a surface of the fiber panel. The set of threads of the stitch pattern may be pressed into a surface of the fiber panel so that the structural substrate may comprise a generally flat surface for the cover. The set of threads of the stitch pattern may be pressed into a surface of the fiber panel so that the set of threads may not be visible at the exterior surface of the cover of the composite surface. The reinforcement may comprise bonded nylon thread. The reinforcement may comprise a set of threads for the stitch pattern comprising at least one of (a) KEVLAR, (b) aramid, (c) nylon, (d) polyester, (e) thread, (f) ceramic fibers, (h) polymeric fibers, (i) synthetic fibers. The component may further comprise a notch in the structural substrate configured to facilitate establishment of the opening for the airbag through the composite structure. The structural substrate may be formed into a shape. The component may further comprise a feature on the structural substrate. The feature may comprise the airbag chute. The feature may comprise a resin-formed feature molded on the structural substrate. The feature may comprise at least one of (a) the airbag chute; (b) a passage for the airbag; (c) a rib; (d) a set of ribs; (e) a feature adjacent to the reinforcement; (f) a feature at the reinforcement; (g) a feature at a hinge area; (h) a feature at the opening; (i) a feature configured to facilitate the opening; (j) a structure for the door; (k) a set of ribs configured to establish a seam for the door; (l) structure for a double door comprising the door; (m) the airbag chute at the hinge area; (n) a resin-formed feature. The door may comprise a double door; the feature may comprise a seam to facilitate formation of the double door. The door may comprise a double door providing the opening for the airbag; the reinforcement may comprise a hinge area for each door of the double door. The composite structure further may comprise a foam layer beneath the cover. The reinforcement may comprise a hinge area configured for the door established by deployment of the airbag through the airbag chute. The structural substrate may comprise a compression-formed component from the fiber panel. The structural substrate may comprise a generally rigid fiber mat. The cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

The present invention relates to a component for a vehicle interior configured to support an airbag module configured to deploy an airbag through an airbag chute by establishing a door providing an opening into the vehicle interior for the airbag comprising a composite structure comprising a structural substrate formed from a fiber panel, a cover for the structural substrate providing an exterior surface and a feature formed from resin on the structural substrate. The structural substrate may comprise a reinforcement; the reinforcement may be configured so that the door established by deployment of the airbag remains at least partially attached to the composite structure. The reinforcement may comprise a pattern of threads; the pattern of threads may be configured so that when the airbag is deployed from the airbag module the door remains at least partially attached to the composite structure by at least a portion of the pattern of threads. The pattern of threads may comprise a first stitch pattern and a second stitch pattern. The pattern of threads may comprise a set of stitches. The pattern of threads may comprise a stitch network. The stitch network may comprise a hinge for the door; the stitch network for the reinforcement may comprise a set of retaining threads and a set of sacrificial threads. The pattern of threads for the reinforcement may comprise a first set of threads and a second set of threads. The pattern of threads for the reinforcement may comprise a set of retaining threads and a set of sacrificial threads. The pattern of threads for the reinforcement may comprise a set of strong threads and a set of weak threads. The set of threads for the reinforcement may comprise a set of retaining threads and a set of sacrificial threads; the set of retaining threads may be configured to comprise the reinforcement after deployment of the airbag. The reinforcement may comprise a hinge area for the door. The reinforcement may comprise a hinge for the door. The feature may comprise a resin-formed feature molded on the structural substrate. The feature may comprise the airbag chute. The resin-formed feature may comprise at least one of (a) the airbag chute; (b) a passage for the airbag; (c) a rib; (d) a set of ribs; (e) a feature adjacent to the reinforcement; (f) a feature at the reinforcement; (g) a feature at a hinge area; (h) a feature at the opening; (i) a feature configured to facilitate the opening; (j) structure for the door; (k) a set of ribs configured to establish a seam for the door; (l) structure for a double door comprising the door.

The present invention relates to a trim component for a vehicle interior configured to support an airbag module providing an airbag for deployment through an opening into the vehicle interior prepared using a mold by a process comprising the steps of: providing a pre-form substrate, joining a reinforcement to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate having a shape. The shape may correspond to a first contour of the first surface and a second contour of the second surface. The structural substrate may be configured to provide at least one door established upon deployment of the airbag to facilitate deployment of the airbag from the airbag module through the opening. The reinforcement may be configured to secure the at least one door to the structural substrate during deployment of the airbag. The step of joining a reinforcement to the pre-form substrate may comprise sewing at least one of a thread; a stitch to the pre-form substrate. The at least one of the thread or the stitch may be comprised of at least one of (a) KEVLAR, (b) aramid, (c) nylon, (d) polyester, (e) ceramic fibers, (f) polymeric fibers, (g) synthetic fibers. The step of joining a reinforcement to the pre-form substrate may comprise piercing an opening in the pre-form substrate and joining a top stitch to a bottom stitch at the opening. The top stitch may comprise a thread weight and the bottom stitch may comprise a thread weight; the thread weight of the top stitch may be generally greater than the thread weight of the bottom stitch. The process may comprise the step of forming a recess in a surface of at least one of the pre-form substrate; the structural substrate; the recess may be configured to facilitate deployment of the airbag.

The present invention relates to a method of manufacturing a vehicle trim component configured to support an airbag module providing an airbag for deployment from the airbag module through an opening into the vehicle interior comprising the steps of: providing a pre-form substrate, joining a reinforcement to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate having a shape. The shape may correspond to a first contour of the first surface and a second contour of the second surface. The structural substrate may be configured to provide at least one door established upon deployment of the airbag to facilitate deployment of the airbag from the airbag module through the opening. The reinforcement may be configured to secure the door to the structural substrate during deployment of the airbag.

The present invention relates to a trim component for a vehicle interior configured to support an airbag chute and an airbag module providing an airbag configured to be deployed through an opening into the vehicle interior. The component may comprise a structural substrate providing a front side, a back side and at least one door established upon deployment of the airbag to facilitate deployment of the airbag from the airbag module through the opening. The structural substrate may comprise a reinforcement configured to secure the door to the structural substrate during deployment of the airbag. The reinforcement may comprise at least one stitch. The reinforcement may be comprised of at least one of (a) KEVLAR, (b) aramid, (c) nylon, (d) polyester, (e) thread, (f) ceramic fibers, (g) polymeric fibers, (h) synthetic fibers. The structural substrate may comprise a panel comprised at least partially of fibers. The reinforcement may be comprised of thread sewn to the panel. The structural substrate may comprise a compression-formed component. The compression-formed component may comprise a recess in the back side of the structural substrate configured to establish the opening so that the airbag will deploy through the compression-formed component at the opening. The structural substrate may be formed at least partially from fibers. The trim component may comprise a cover to provide a surface on the front side of the structural substrate. Contact between the airbag and the door may induce tearing of the cover to establish the opening for the airbag and may facilitate deployment of the airbag through the opening.

The present invention relates to a trim component for a vehicle interior configured to support an airbag module providing an airbag for deployment through an opening into the vehicle interior prepared using a mold by a process. The process may comprise the steps of providing a fiber panel, joining a reinforcement to the fiber panel in at least one hinge area to form a reinforced fiber panel, disposing the reinforced fiber panel onto a first surface of the mold, compressing the reinforced fiber panel between the first surface and a second surface of the mold to form the reinforced fiber panel into a structural substrate having a shape and attaching a structure on a side of the structural substrate. The shape may correspond to a first contour of the first surface and a second contour of the second surface. The structural substrate may be configured to provide at least one door established upon deployment of the airbag to facilitate deployment of the airbag from the airbag module through the opening. The structure may be configured to support the airbag module and to direct the airbag toward the structural substrate to establish the opening and the door during deployment of the airbag. The reinforcement may be configured to secure the door to the structural substrate during deployment of the airbag. Joining a reinforcement to the fiber panel may comprise sewing at least one of a thread; a stitch to the fiber panel. The at least one of the thread; the stitch may be comprised of at least one of (a) KEVLAR, (b) aramid, (c) nylon, (d) polyester, (e) ceramic fibers, (f) polymeric fibers, (g) synthetic fibers. Attaching the structure on a side of the structural substrate may comprise injecting resin into the mold. The process may comprise the step of forming a recess in a surface of at least one of the fiber panel; the reinforced fiber panel; the recess may be configured to facilitate deployment of the airbag.

The present invention relates to a method of manufacturing a vehicle trim component configured to support an airbag module providing an airbag for deployment from the airbag module through an opening into the vehicle interior. The method may comprise the steps of providing a fiber panel, joining a reinforcement to the fiber panel in at least one hinge area to form a reinforced fiber panel, disposing the reinforced fiber panel onto a first surface of the mold, compressing the reinforced fiber panel between the first surface and a second surface of the mold to form the reinforced fiber panel into a structural substrate having a shape and attaching a structure on a side of the structural substrate. The shape may correspond to a first contour of the first surface and a second contour of the second surface. The structural substrate may be configured to provide at least one door established upon deployment of the airbag to facilitate deployment of the airbag from the airbag module through the opening. The structure may be configured to support the airbag module and may direct the airbag toward the structural substrate to establish the opening and the door during deployment of the airbag. The reinforcement may be configured to secure the door to the structural substrate during deployment of the airbag.

FIGURES

FIG. 1A is a schematic perspective view of a vehicle according to an exemplary embodiment.

FIG. 1B is a schematic perspective cut-away view of a vehicle showing a vehicle interior according to an exemplary embodiment.

FIG. 1C is a schematic perspective view of a vehicle interior component shown as an instrument panel according to an exemplary embodiment.

FIGS. 1D through 1F are schematic perspective detail views of an airbag deployment according to an exemplary embodiment.

FIG. 2A is a schematic perspective view of a vehicle interior component shown as an instrument panel according to an exemplary embodiment.

FIG. 2B is a schematic exploded perspective view of a vehicle interior component shown as an instrument panel according to an exemplary embodiment.

FIG. 2C is a schematic partial section view of a vehicle interior component shown as an instrument panel according to an exemplary embodiment.

FIG. 8A is a schematic partial section view of a vehicle interior component shown as an instrument panel according to an exemplary embodiment.

FIGS. 8B through 8D are schematic partial section views of an airbag deployment according to an exemplary embodiment.

FIG. 8E is a schematic partial perspective view of a vehicle interior component shown as an instrument panel according to an exemplary embodiment.

FIGS. 13A and 13B are schematic perspective views of a vehicle interior component shown as an instrument panel according to an exemplary embodiment.

FIGS. 14A and 14B are schematic cutaway perspective views of a vehicle interior component according to an exemplary embodiment.

FIGS. 16A through 16C are schematic perspective views of a process to form a structural substrate from a reinforced fiber panel according to an exemplary embodiment.

FIG. 16D is a schematic perspective cut-away view of a structural substrate according to an exemplary embodiment.

FIG. 16E is a schematic perspective cut-away view of a component for a vehicle interior according to an exemplary embodiment.

FIG. 30 is a schematic perspective view of a component comprising a panel with a functional circuit according to an exemplary embodiment.

FIG. 31 is a schematic perspective view of a component comprising a panel with a functional circuit according to an exemplary embodiment.

FIG. 32 is a schematic block diagram of a component comprising a panel with a functional circuit according to an exemplary embodiment.

FIG. 35A is a schematic exploded section view of a component comprising a panel with a functional circuit according to an exemplary embodiment.

FIG. 35B is a schematic exploded perspective view of a component comprising a panel with a functional circuit according to an exemplary embodiment.

FIG. 35C is a schematic perspective view of a component comprising a panel with a functional circuit according to an exemplary embodiment.

FIG. 35D is a schematic exploded perspective view of a component comprising a panel with a functional circuit according to an exemplary embodiment.

FIG. 36A is a schematic exploded section view of a component comprising a panel with a functional circuit according to an exemplary embodiment.

FIG. 36B is a schematic exploded perspective view of a component comprising a panel with a functional circuit according to an exemplary embodiment.

FIG. 36C is a schematic perspective view of a component comprising a panel with a functional circuit according to an exemplary embodiment.

FIG. 36D is a schematic exploded perspective view of a component comprising a panel with a functional circuit according to an exemplary embodiment.

FIG. 38A is a schematic perspective view of a component comprising a panel with a functional circuit according to an exemplary embodiment.

FIG. 38B is a schematic perspective view of a component comprising a panel with a functional circuit according to an exemplary embodiment.

FIG. 38C is a schematic exploded perspective view of a component comprising a panel with a functional circuit according to an exemplary embodiment.

FIG. 47A is a schematic perspective view of a component comprising a panel with a functional circuit according to an exemplary embodiment.

FIG. 47B is a schematic exploded perspective view of a component comprising a panel with a functional circuit according to an exemplary embodiment.

FIG. 47C is a schematic perspective view of a component comprising a panel with a functional circuit according to an exemplary embodiment.

FIG. 47D is a schematic perspective view of a component comprising a panel with a functional circuit according to an exemplary embodiment.

FIG. 48A is a schematic perspective view of a component comprising a panel with a functional circuit according to an exemplary embodiment.

FIG. 48B is a schematic exploded perspective view of a component comprising a panel with a functional circuit according to an exemplary embodiment.

FIG. 48C is a schematic perspective view of a component comprising a panel with a functional circuit according to an exemplary embodiment.

FIGS. 49A through 49C are schematic perspective views of a process to form a fiber panel according to an exemplary embodiment.

FIG. 49D is a schematic cutaway perspective view of a fiber panel according to an exemplary embodiment.

FIG. 50 is a schematic cutaway perspective view of a fiber panel according to an exemplary embodiment.

FIGS. 53A through 53D are schematic perspective views of a process to form a component comprising a panel with a functional circuit according to an exemplary embodiment.

FIG. 53E is a schematic perspective view of a component comprising a panel with a functional circuit according to an exemplary embodiment.

FIGS. 56A through 56D are schematic perspective views of a process to form a component comprising a panel with a functional circuit according to an exemplary embodiment.

FIG. 61A is a schematic perspective view of a component comprising a panel with a functional circuit according to an exemplary embodiment.

FIG. 61B is a schematic perspective view of a component comprising a panel with a functional circuit according to an exemplary embodiment.

FIG. 62A is a schematic cutaway perspective view of a component comprising a panel with a functional circuit according to an exemplary embodiment.

FIG. 62B is a schematic cutaway perspective view of a component comprising a panel with a functional circuit according to an exemplary embodiment.

FIG. 67A is a schematic cutaway perspective view of a circuit element for a panel for a component according to an exemplary embodiment.

FIG. 67B is a schematic cutaway perspective view of a circuit element for a panel for a component according to an exemplary embodiment.

FIG. 68 is a schematic cutaway plan view of a circuit element for a panel for a component according to an exemplary embodiment.

FIG. 69 is a schematic cutaway plan view of a circuit element for a panel for a component according to an exemplary embodiment.

DESCRIPTION

Referring to FIGS. 1A and 1B, a vehicle V is shown schematically with an interior I comprising components such as trim components, panels, consoles, etc. As indicated schematically according to an exemplary embodiment in FIGS. 1C-1F and 13A-13B, the vehicle interior may comprise a component such as a trim panel shown as instrument panel IP configured to provide a door such as an airbag door ABD to facilitate deployment of an airbag AB (see FIGS. 1C-1F) or a moveable panel/door D to provide access into an opening (see FIGS. 13A-13B).

Figure 45A:
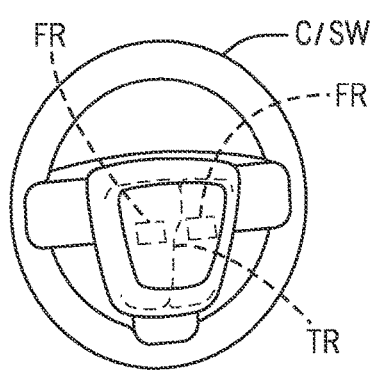
FIG. 45A through 45C are schematic perspective views of an airbag deployment according to an exemplary embodiment.
Figure 45B:
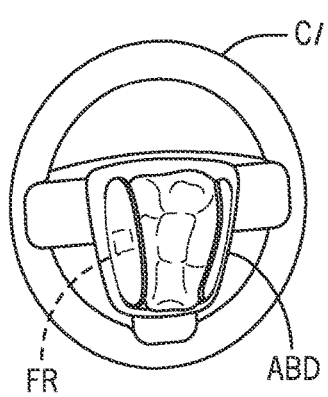
Figure 45C:
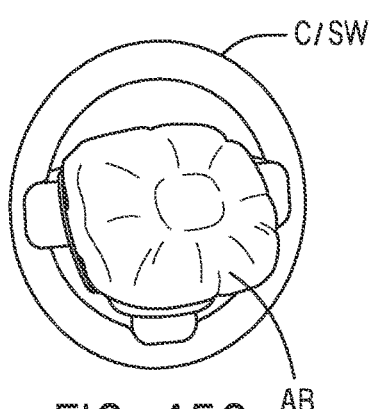
Figure 46A:
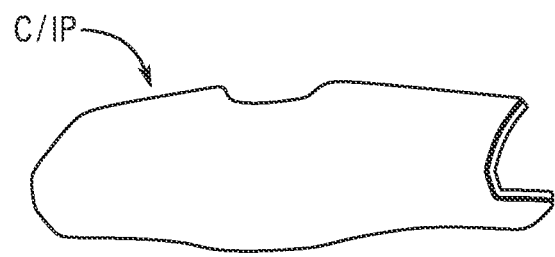
FIG. 46A is a schematic perspective view of a component comprising a panel with a functional circuit according to an exemplary embodiment.
Figure 46B:
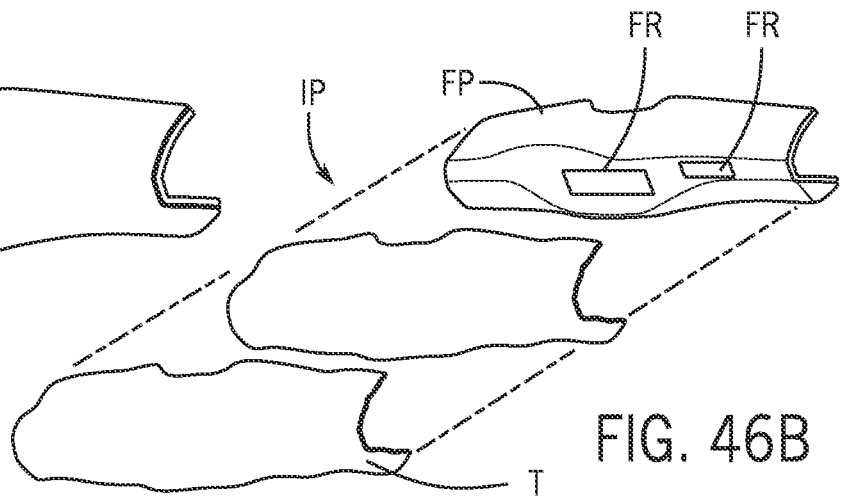
FIG. 46B is a schematic exploded perspective view of a component comprising a panel with a functional circuit according to an exemplary embodiment.
Figure 46C:
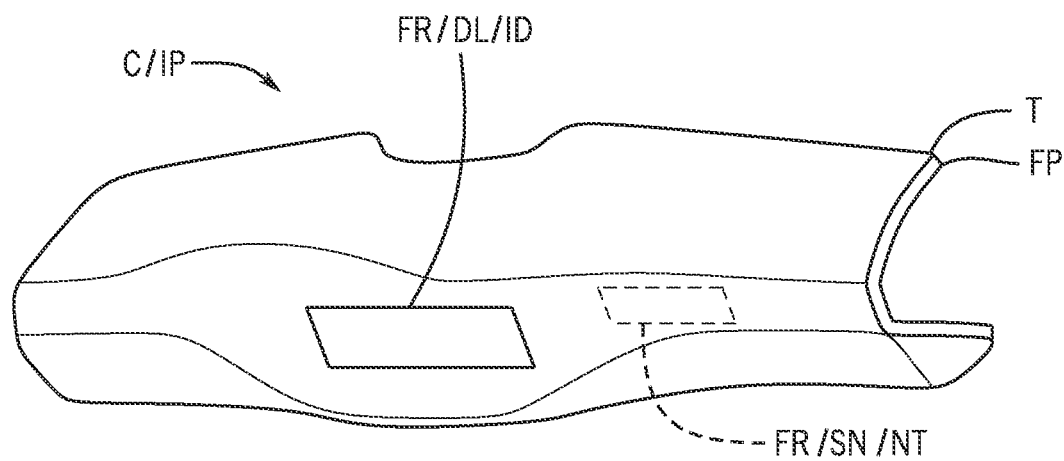
FIG. 46C is a schematic perspective view of a component comprising a panel with a functional circuit according to an exemplary embodiment.
Figure 51A:
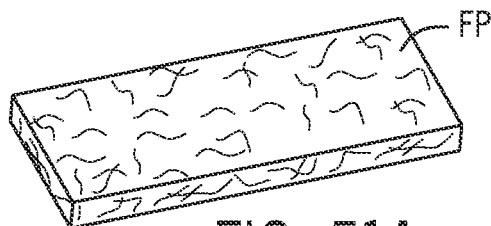
FIGS. 51A through 51C are schematic perspective views of a process to form a fiber panel according to an exemplary embodiment.
Figure 51B:
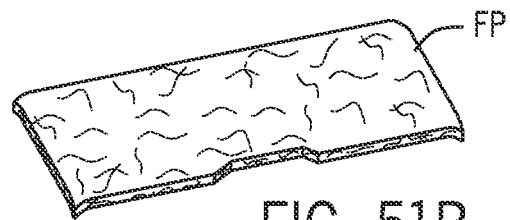
Figure 51C:
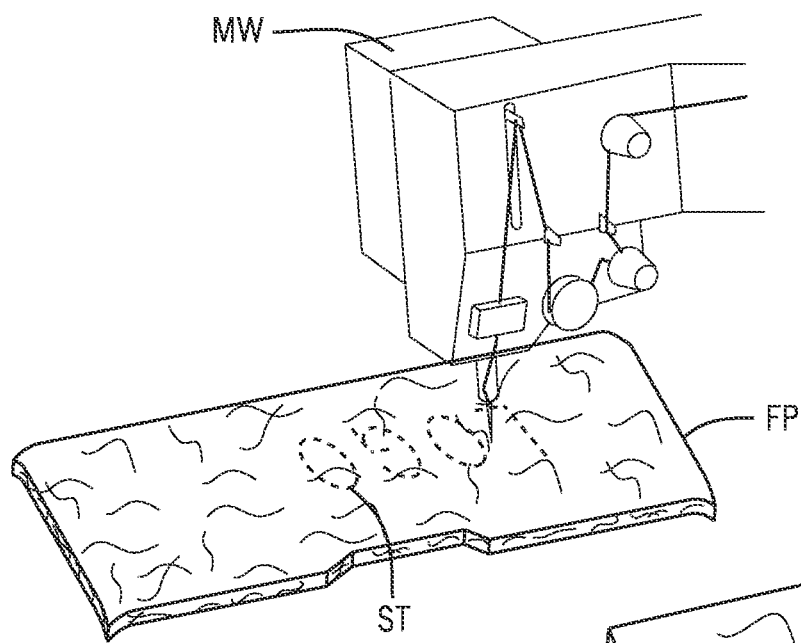
Figure 51D:
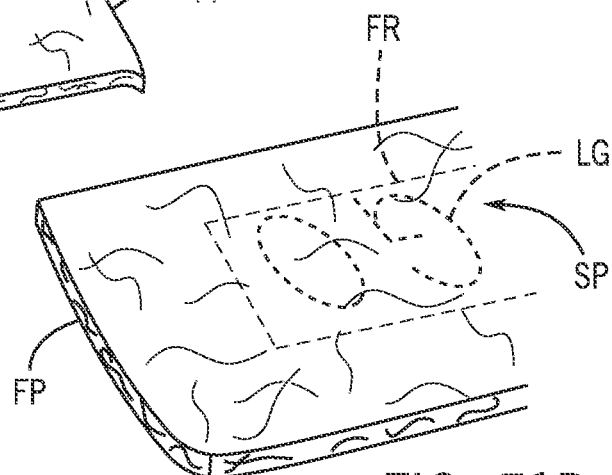
FIG. 51D is a schematic cutaway perspective view of a fiber panel according to an exemplary embodiment.
Figure 52:
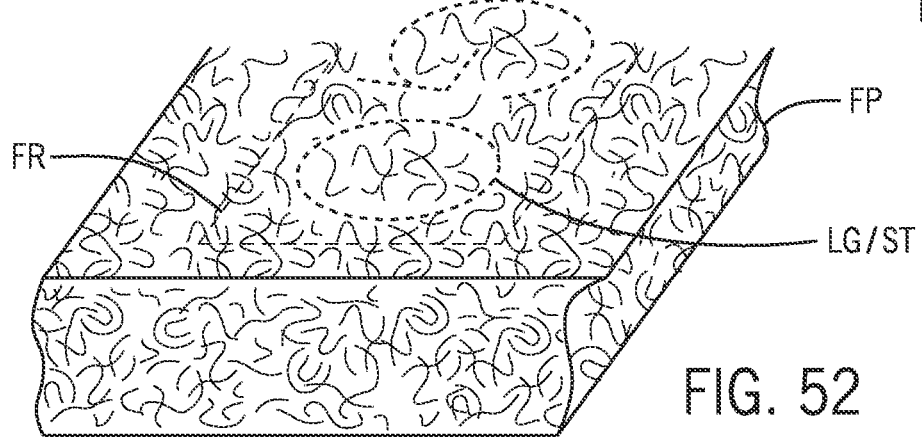
FIG. 52 is a schematic cutaway perspective view of a fiber panel according to an exemplary embodiment.
Figure 54A:
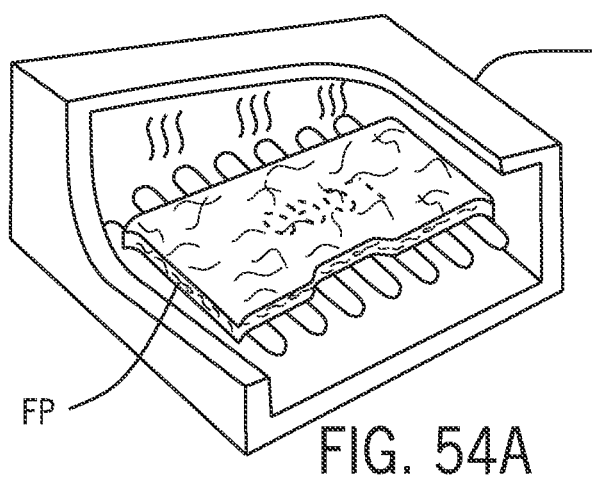
FIGS. 54A through 54D are schematic perspective views of a process to form a component comprising a panel with a functional circuit according to an exemplary embodiment.
Figure 54B:
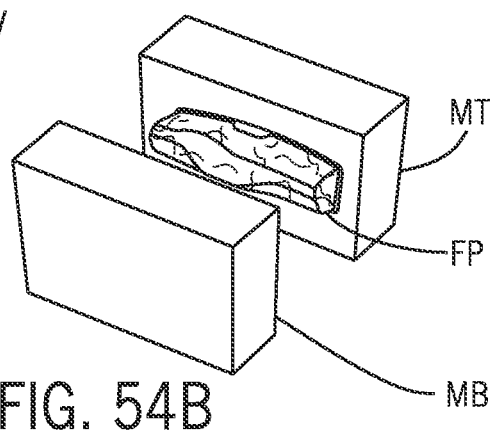
Figure 54C:
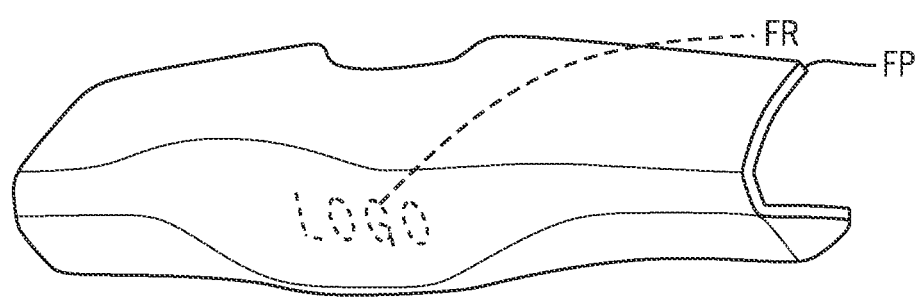
Figure 54D:
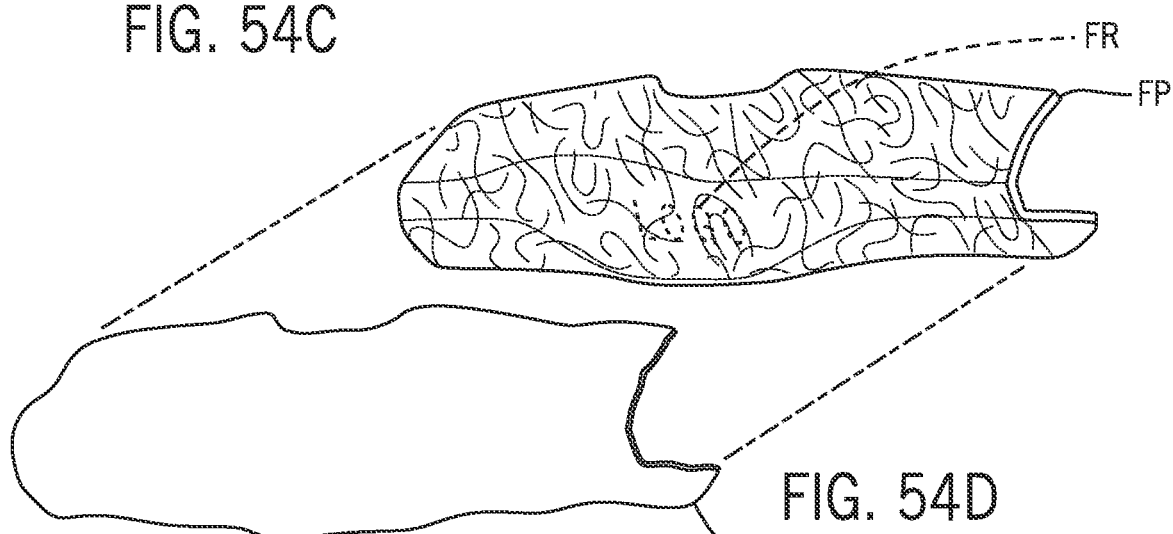
Figure 54E:
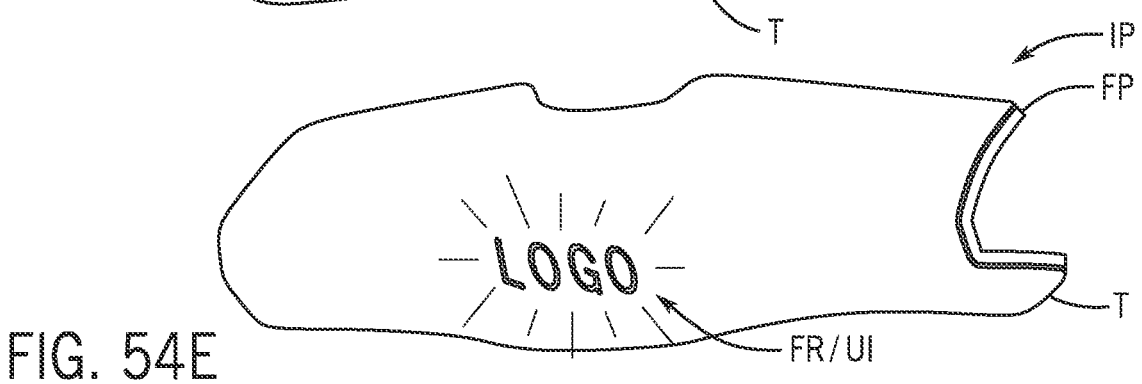
FIG. 54E is a schematic perspective view of a component comprising a panel with a functional circuit according to an exemplary embodiment.
Figure 55A:
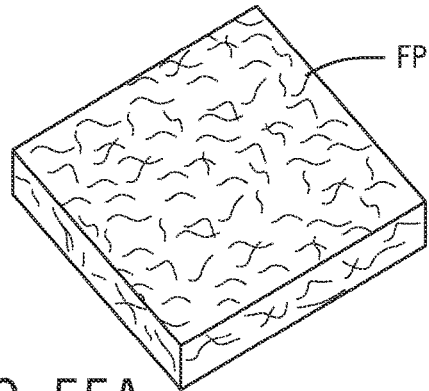
FIGS. 55A through 55D are schematic perspective views of a process to form a component comprising a panel with a functional circuit according to an exemplary embodiment.
Figure 55B:
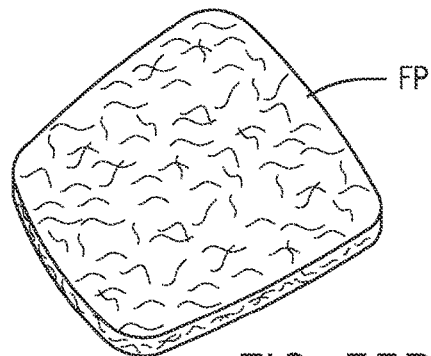
Figure 55C:
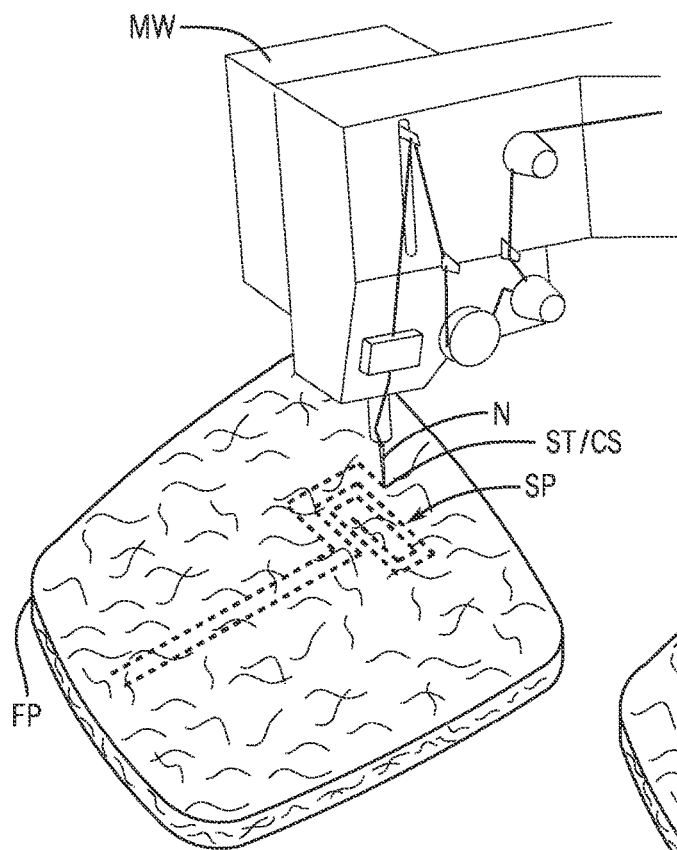
Figure 55D:
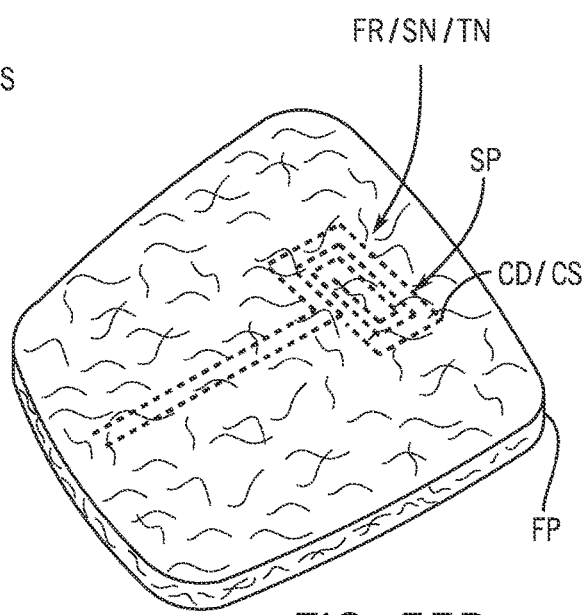
Figure 57A:
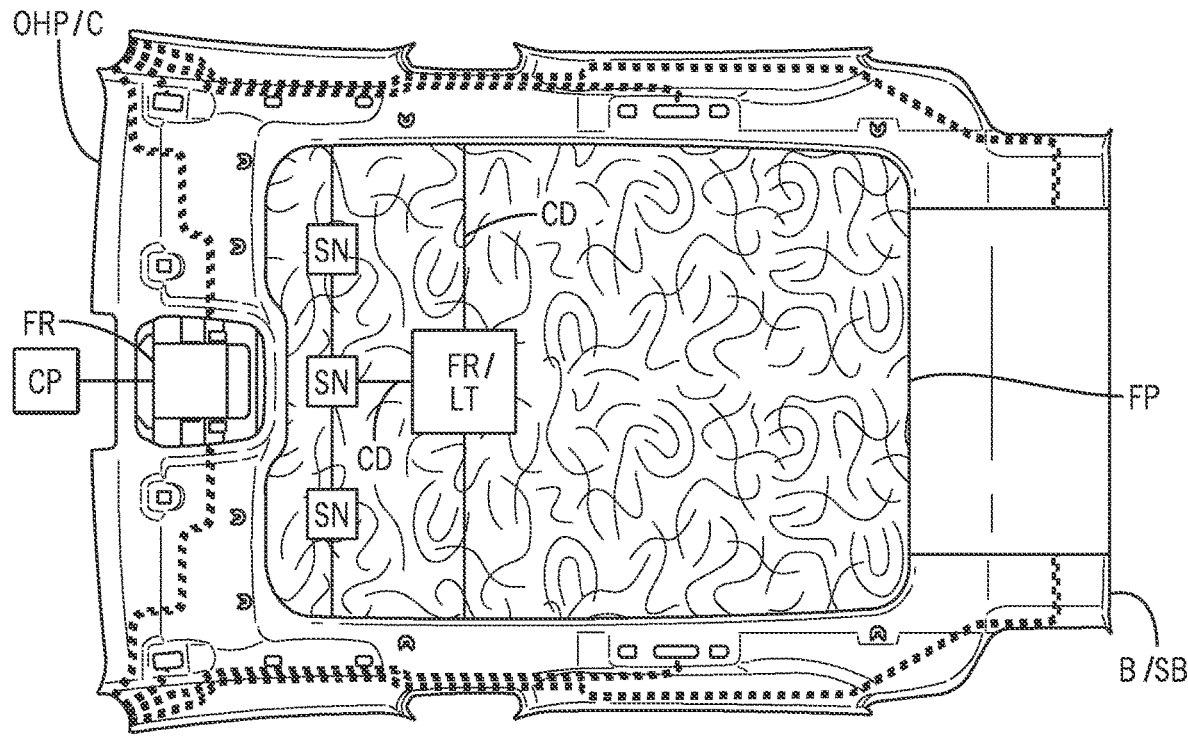
FIG. 57A is a schematic plan view of a component comprising a panel with a functional circuit according to an exemplary embodiment.
Figure 57B:
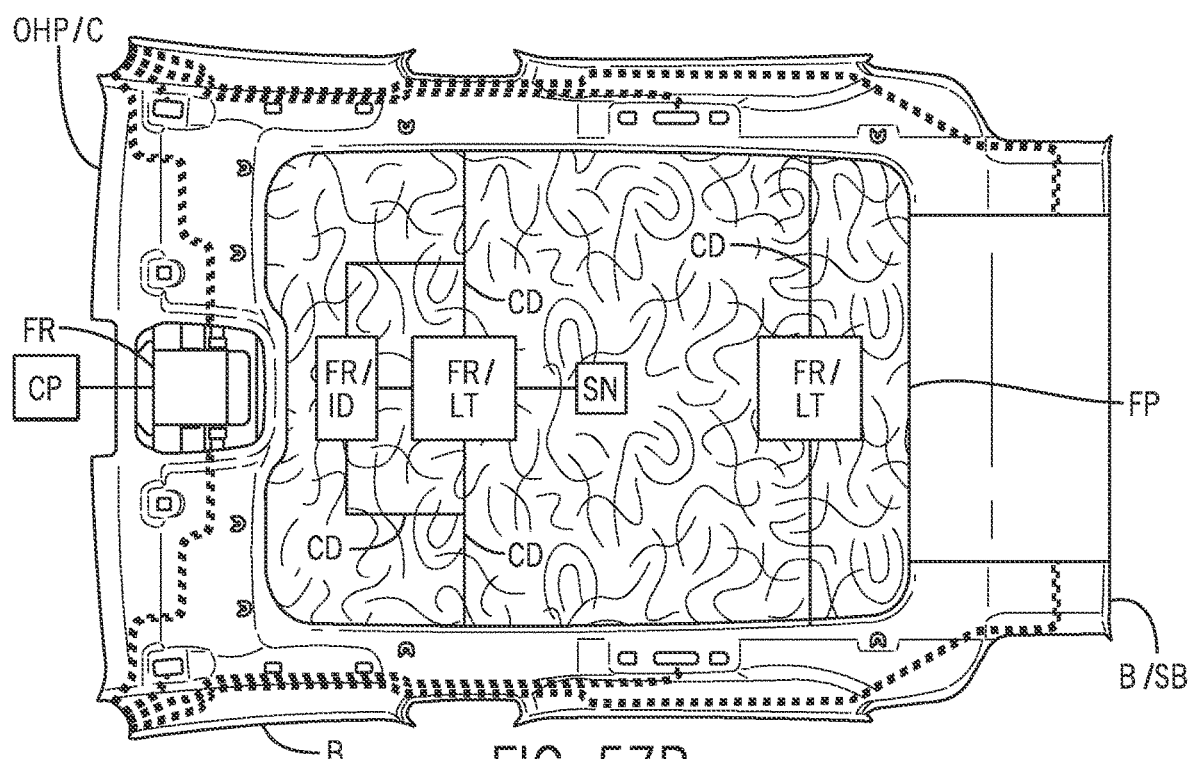
FIG. 57B is a schematic plan view of a component comprising a panel with a functional circuit according to an exemplary embodiment.
Figure 58A:
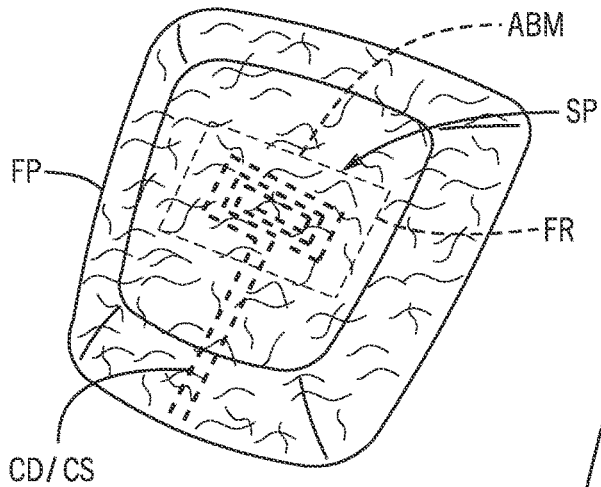
FIG. 58A is a schematic perspective view of a component comprising a panel with a functional circuit according to an exemplary embodiment.
Figure 58B:
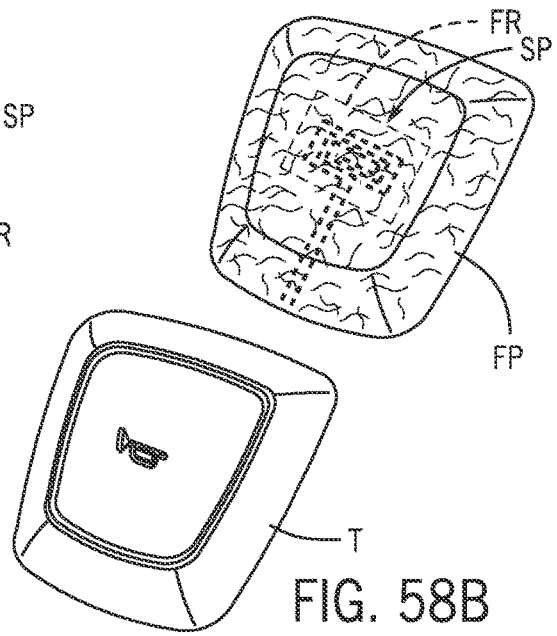
FIG. 58B is a schematic exploded perspective view of a component comprising a panel with a functional circuit according to an exemplary embodiment.
Figure 59A:
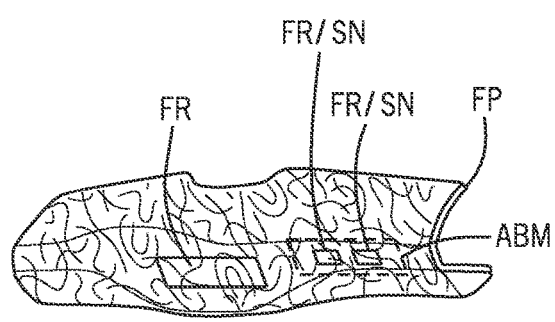
FIG. 59A is a schematic perspective view of a component comprising a panel with a functional circuit according to an exemplary embodiment.
Figure 59B:
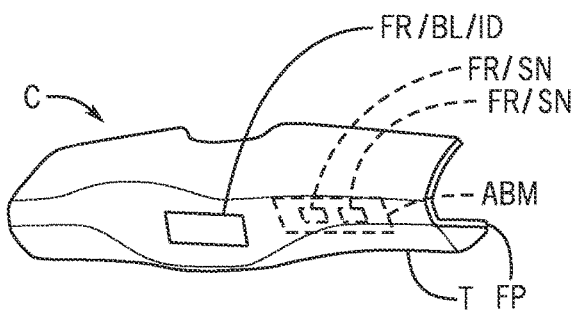
FIG. 59B is a schematic perspective view of a component comprising a panel with a functional circuit according to an exemplary embodiment.
Figure 60A:
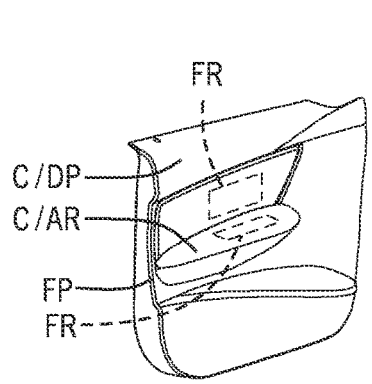
FIG. 60A is a schematic perspective view of a component comprising a panel with a functional circuit according to an exemplary embodiment.
Figure 60B:
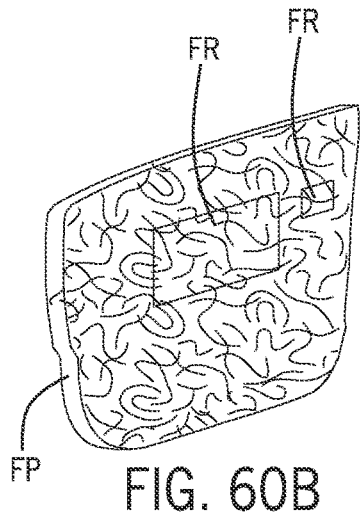
FIG. 60B is a schematic perspective view of a component comprising a panel with a functional circuit according to an exemplary embodiment.
Figure 60C:
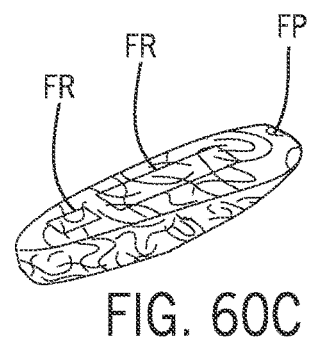
FIG. 60C is a schematic perspective view of a component comprising a panel with a functional circuit according to an exemplary embodiment.
Figure 63:
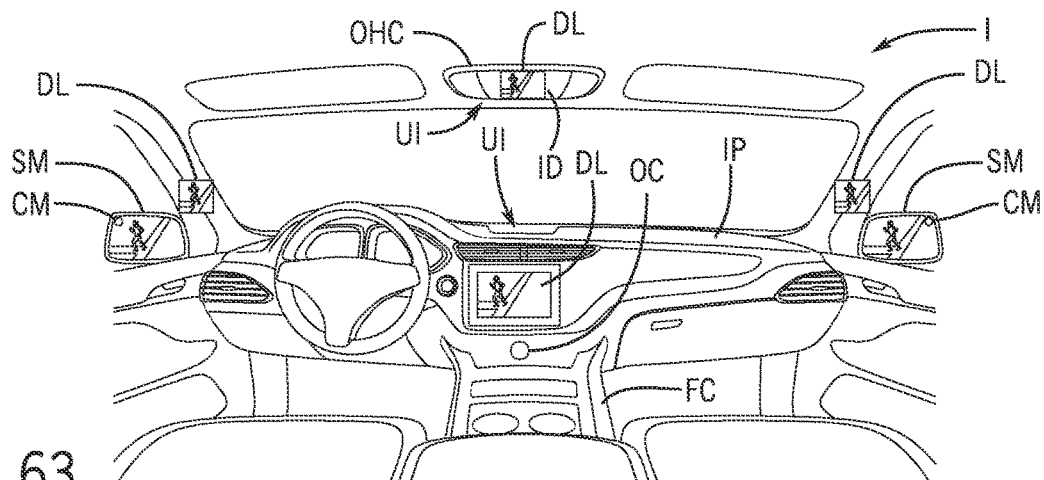
FIG. 63 is a schematic perspective cut-away view of a vehicle interior according to an exemplary embodiment.
Figure 64:
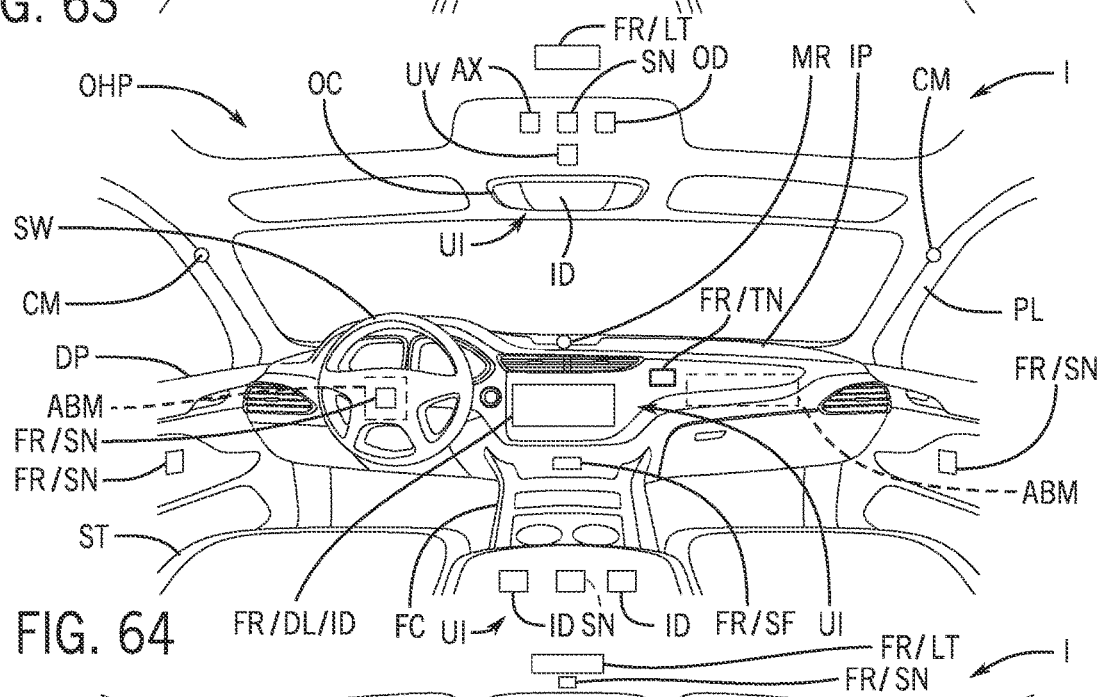
FIG. 64 is a schematic perspective cut-away view of a vehicle interior according to an exemplary embodiment.
Figure 65:
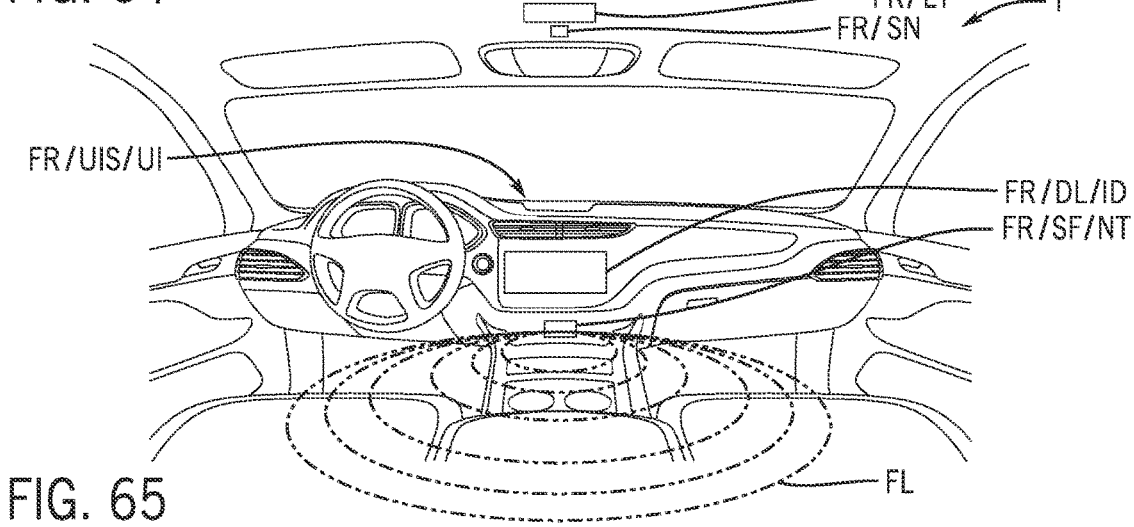
FIG. 65 is a schematic perspective cut-away view of a vehicle interior according to an exemplary embodiment.
Figure 66A:
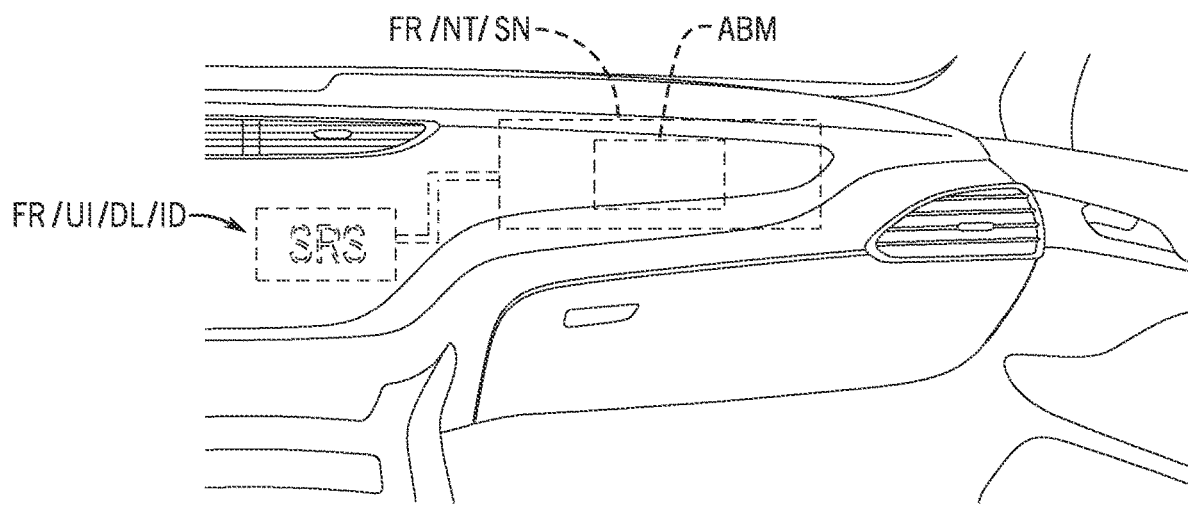
FIG. 66A is a schematic cutaway perspective view of a component comprising a panel with a functional circuit according to an exemplary embodiment.
Figure 66B:
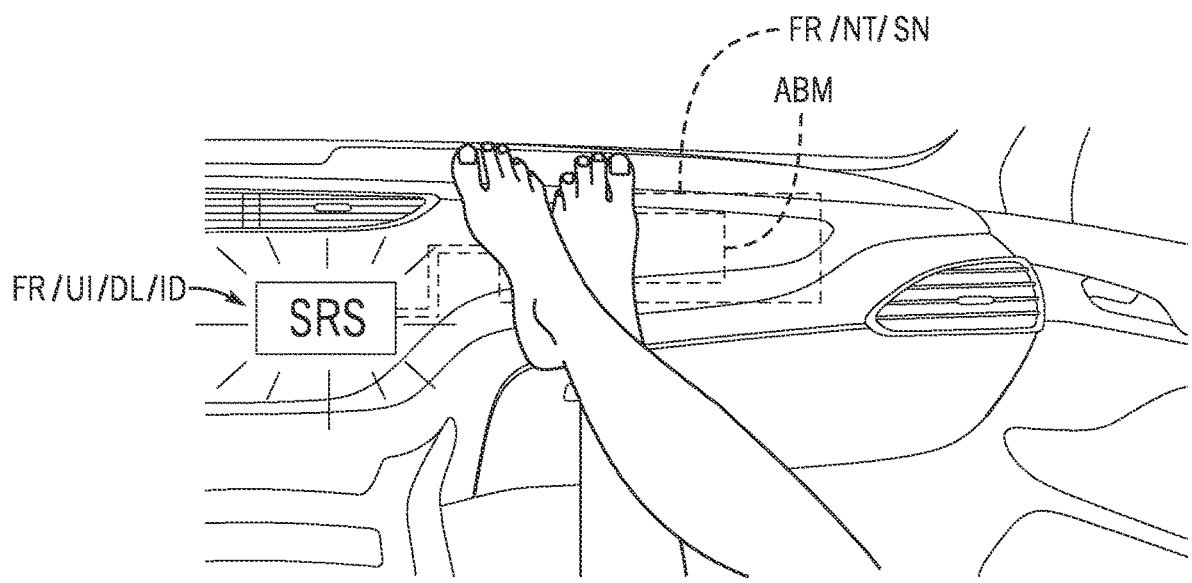
FIG. 66B is a schematic cutaway perspective view of a component comprising a panel with a functional circuit according to an exemplary embodiment.
Figure 70A:
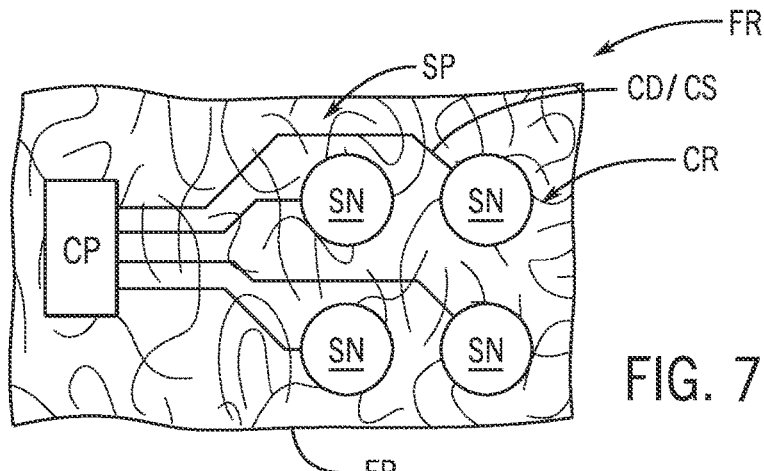
FIG. 70A is a schematic cutaway plan view of a circuit element for a panel for a component according to an exemplary embodiment.
Figure 70B:
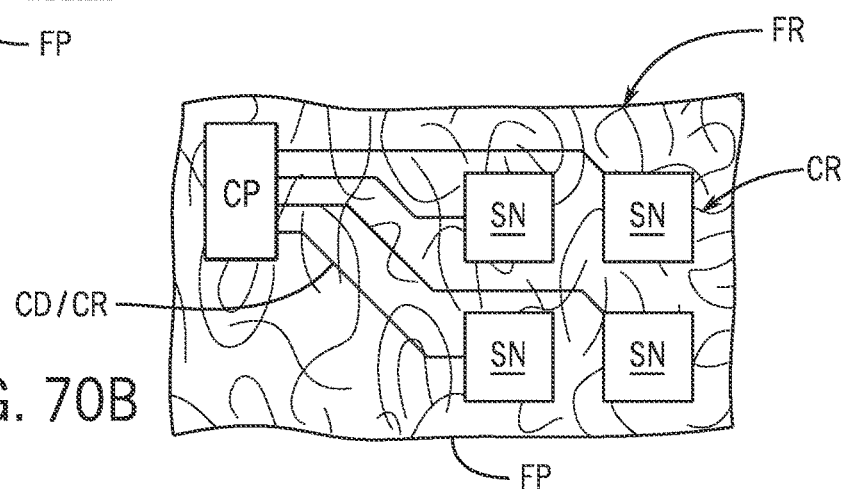
FIG. 70B is a schematic cutaway plan view of a circuit element for a panel for a component according to an exemplary embodiment.
Figure 71:
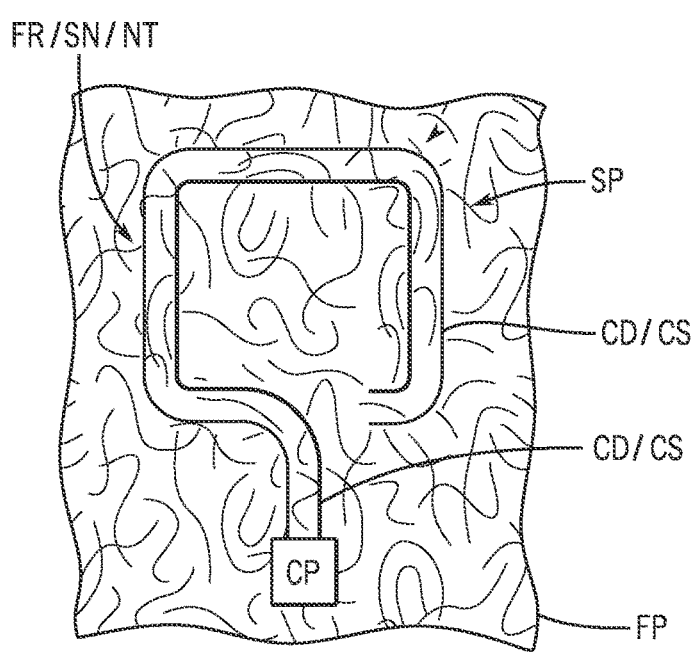
FIG. 71 is a schematic cutaway plan view of a circuit element for a panel for a component according to an exemplary embodiment.
Figure 72A:
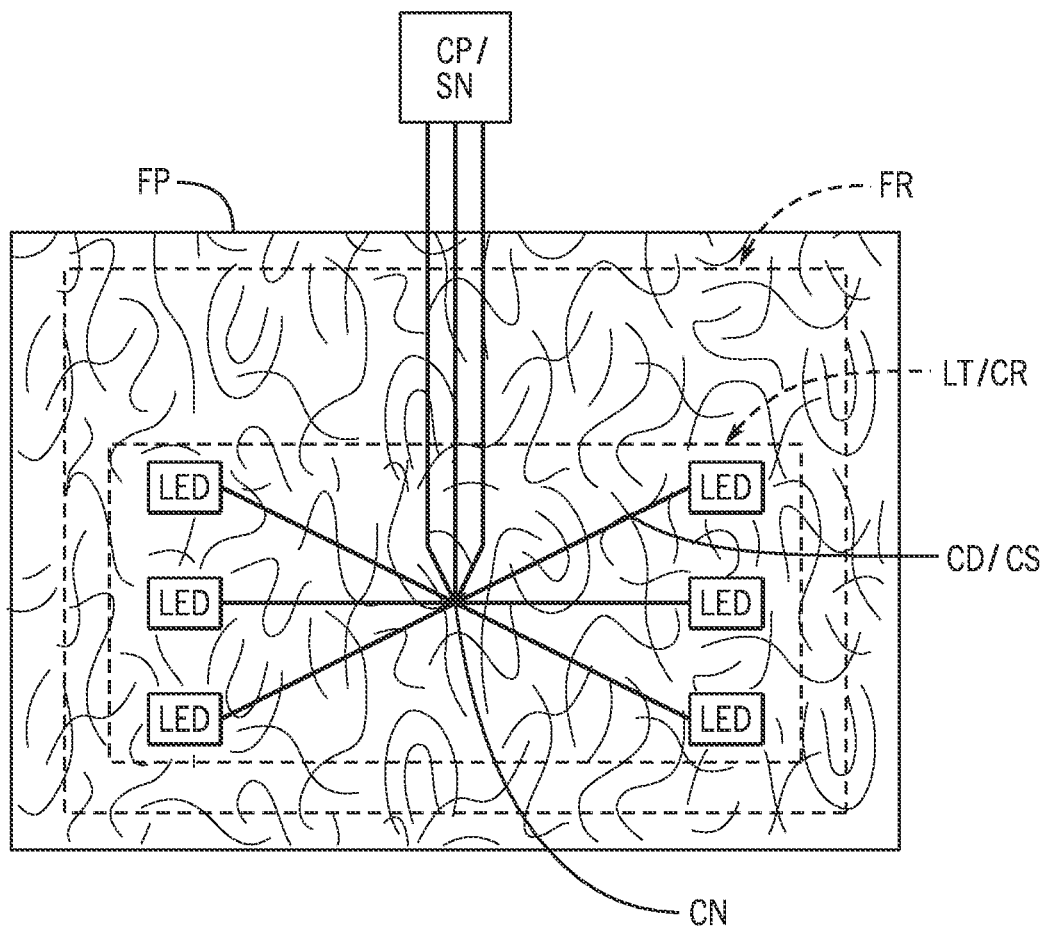
FIG. 72A is a schematic cutaway plan view of a circuit element for a panel for a component according to an exemplary embodiment.
Figure 72B:
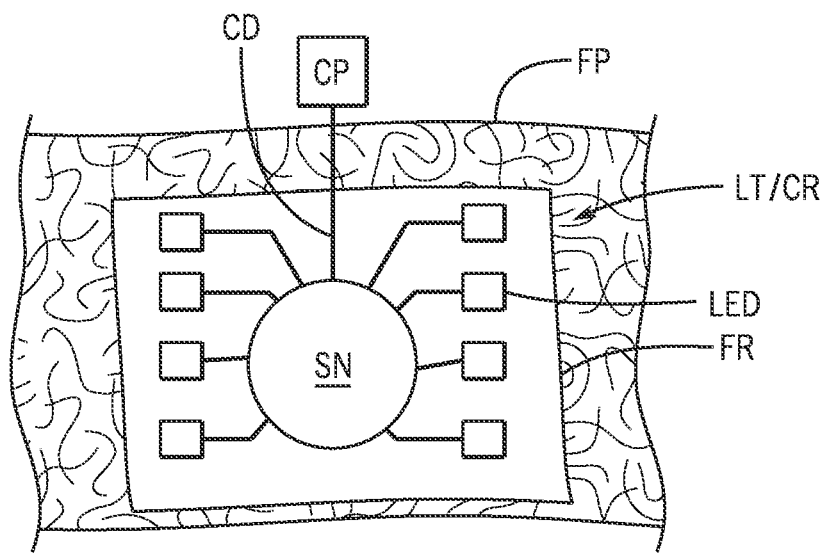
FIG. 72B is a schematic cutaway plan view of a circuit element for a panel for a component according to an exemplary embodiment.

Referring to FIGS. 1A-1B, 21 and 22, a vehicle V is shown with an interior I comprising components C including trim components such as an instrument panel IP, door panel DP, pillar PL, floor console FC, overhead panel OHP, operator control shown as steering wheel SW, and seating shown as seats SS; interior I may comprise safety systems such as an airbag module ABM and/or horn/alerting device within components such as instrument panel IP and steering wheel SW, overhead panel/system OHP, etc. See also FIGS. 45A-45C.

As shown schematically according to an exemplary embodiment in FIGS. 3A-3F, 11A-11B, 12, 15A-15F, 19 and 20, the component may comprise a substrate such as a fiber panel FP formed with a reinforcement MN such as a stitch/stitch pattern ST at a hinge area for the door ABD/D. See also FIGS. 6A-6C, 7A-7F, 8A-8E, 14A-14B, 17A-17E and 18A-18D.

As shown schematically according to an exemplary embodiment in FIGS. 1B, 21, 22, 23, 24, 25, 26, 27, 28, 29, 63, 64 and 65, a vehicle interior may comprise systems/devices configured to provide functional systems/circuits FR and configured to be integrated with components C; as indicated schematically according to an exemplary embodiment, devices/systems provided by functional circuits FR and/or circuit elements CR may be configured and/or combined with components C to provide features/functionality such as a user interface UI (e.g. input device and/or output device), user interface system UIS, illumination such as light LT (provided through a display panel, lamp, etc.) and light guide LG, LED arrangement LED, image display/device ID, sensor/detector arrangements such as a system to generate a sensor field/antenna SF in a field/detection space/area FL or a sensor/detector SN or sensor configured to operate as an input device/switch SH or sensor configured to operate as an occupancy detector OC or ultraviolet sensor UV, odor/scent detector OD, microphone/sound detector MR, camera/video-recorder CM, accelerometer AX, antenna NT, wireless charging/connection area/surface CW (e.g. for mobile devices, etc.), heating element HT, etc. As indicated schematically according to an exemplary embodiment in FIGS. 1B, 30, 31 and 32, the devices/systems provided by functional circuits FR and/or circuit elements CR configured and/or combined with components C to provide features/functionality may be operated by a control system CS and power source PS and connected to vehicle systems VS and/or data sources/networks DS (including the internet, local networks, proprietary networks, etc.); connection may be provided at a connection point such as a plug/connector CP; features/functionality may comprise any of a variety of arrangements within the vehicle interior, including user interface arrangements UI, input/output systems, display panels DL, occupant controls such as switches/buttons SH, entertainment, lighting such as light LT, HVAC/temperature comfort (heating, cooling, etc.), data communications such as at image display ID, monitoring such as by sensors SN, safety systems/detection such as for airbag modules ABM or other vehicle/safety systems, alert/warning systems, occupant interaction/monitoring, interaction/connection with mobile devices MD or other objects OB, etc. See also FIGS. 21, 22, 23, 24, 25, 26, 27, 28, 29, 63, 64, 65 and 66A-66B.

As indicated schematically according to an exemplary embodiment in FIGS. 33A-33B, 34A-34B, 35A-35D, 36A-36D, 37A-37B, 38A-38C, 39, 40, 41A-41B, 42A-42D, 43A-43B, 44A-44B, 45A-45C, 46A-46C, 47A-47D, 48A-48C, 57A-57B, 58A-58B, 59A-59B, 60A-60C and 61A-61B, the devices/systems provided by functional circuits FR and/or circuit elements CR configured and/or combined with components C to provide features/functionality may be provided in a composite structure comprising a panel shown as fiber panel FP and a cover T; component C may comprise the composite structure of panel and cover on or with a base/substrate B/SB; the fiber panel FP may comprise a conductor CD; the conductor may provide the functional circuit FR for the composite structure. As indicated schematically according to an exemplary embodiment in the FIGURES, the systems/devices provided by functional circuit FR may be configured to provide a wide variety of features/functions and to integrate/connect with conventional systems/devices for a vehicle interior.

As indicated schematically according to an exemplary embodiment in FIGS. 39, 40, 41A-41B and 57A-57B, the component C may comprise an overhead system/panel assembly OHP comprising a base B/SB and a fiber panel FP with an arrangement of conductors CD for functional circuits FR such as lighting LT, sensors/switches SN, etc. connected to vehicle systems at connection points CP; the composite structure of the overhead system/panel OHP/C may comprise structural elements such as ribs RB formed on/for the fiber panel FP; the overhead system/panel OHP/C may be configured to facilitate formation of a moon/sun roof. As indicated schematically according to an exemplary embodiment in FIGS. 33A-33B, 34A-34B, 35A-35D, 36A-36D, 37A-37B, 38A-38C, 42A-42D, 43A-43B, 44A-44B, 45A-45C, 46A-46C, 47A-47D, 48A-48C, 58A-58B, 59A-59B, 60A-60C and 61A-61B, the component C may comprise any of a variety of interior components comprising in any of a variety of forms a composite structure with a cover T and a fiber panel FP with an arrangement of conductors CD for a variety of functional circuits FR such as lighting LT, sensors/switches SN, etc.; as indicated schematically, the composite structure may comprise other structures such as reinforcement/rigidifying elements shown as molded/resin ribs, etc. for the fiber panel comprising the functional circuit.

As indicated schematically according to an exemplary embodiment in FIGS. 33A-33B, 34A-34B, 35A-35D, 36A-36D, 37A-37B, 38A-38C, 39, 40, 41A-41B, 42A-42D, 43A-43B, 44A-44B, 45A-45C, 46A-46C, 47A-47D, 48A-48C, 57A-57B, 58A-58B, 59A-59B, 60A-60C and 61A-61B, the systems/devices provided by functional circuit FR for component C may be configured to integrate/connect with the composite structure comprising fiber panel FP. See also FIGS. 21, 22, 23, 24, 25, 26, 27, 28, 29, 62A-62B, 63, 64, 65 and 66A-66B.

As indicated schematically in FIGS. 33A-33B, 34A-34B, 35A-35D, 36A-36D, 37A-37B and 38A-38C, the functional circuit FR with circuit elements CR such as sensor elements SN, lighting elements LG/LT, etc. may be formed with and/or on the fiber panel FP of the composite structure; as indicated schematically in FIGS. 35A-35D and 36A-36D, the component with composite structure may comprise a base/substrate B/SB; as indicated schematically in FIGS. 35A-35D, the composite structure may comprise an intermediate layer such as shown by foam layer FM; as indicated schematically in FIGS. 36A-36D and 37A-37B, the composite structure may comprise an insulation layer/panel such as shown by layer PN/NL; as indicated schematically in FIGS. 36A-36D, the composite structure may comprise a non-conductive stitch shown as ST. As indicated schematically in FIGS. 38A-38C, the composite structure may comprise a fiber panel FP with a functional circuit FR comprising a lighting arrangement comprising light guide LG. See also FIGS. 51A-51D.

As indicated schematically according to an exemplary embodiment in FIGS. 49A-49D, 50, 51A-51B, 52, 53A-53E, 54A-54E, 55A-55D and 56A-56D, the systems/devices provided by functional circuit FR for component C may be configured to be formed with and within the composite structure comprising fiber panel FP; the conductor CD for functional circuit FR may comprise a pattern of electrically conductive threads CS; conductive thread may comprise a stitch arrangement ST shown as a stitch pattern SP within the fiber panel FP; conductive thread may be stitched into/onto the fiber panel. As indicated schematically, the conductor CD may comprise a stitch pattern SP comprising conductive thread CS comprising the functional circuit FR. As indicated schematically, the composite structure may comprise a structure shown as resin structure RB for the fiber panel FP; the resin structure RB may be formed on the fiber panel FP at or adjacent to the functional circuit FR. As indicated schematically in FIGS. 36A-36D, 62A-62B and 67A-67B, the component C with composite structure may comprise a fiber panel FP configured to provide an arrangement of conductors CD shown as conductive threads CS for functional circuit FR or circuit element CR and/or an arrangement of non-conductive threads ST such as for reinforcement of a hinge HG for an airbag door ABD or for a decorative feature, etc. See also FIGS. 14A-14B and 15A-15B. As indicated schematically in FIGS. 49A-49D, 51A-51D and 55A-55D, a stitch pattern SP comprising a conductive thread CS and/or a non-conductive thread ST and/or light guide thread LG may be provided in fiber panel FP by the stitch of a needle N from an apparatus shown as sewing machine MW (e.g. to stitch on, emboss, stitch in, etc. the fiber panel).

As indicated schematically according to an exemplary embodiment in FIGS. 50, 52, 67A-67B, 68, 69, 70A-70B, 71 and 72A-72B, the systems/devices provided by functional circuit FR for component C may be configured with and within the composite structure comprising fiber panel FP as or with a variety of circuit elements CR including with conductors CD of conductive thread CS provided in a stitch pattern SP and cables/wires CW and with connection points CN and insulation/layer NL and connector/pad PC and light arrangement LT with light guide LG and/or LED elements and sensor/switch SN and sensor/detector arrangement SN and antenna NT and etc. See also FIGS. 62A-62B. As indicated schematically in FIGS. 1B, 21, 22, 23, 24, 25, 26, 27, 28, 29, 62A-62B, 63, 64, 65 and 66A-66B, the functional circuit FR and circuit elements CR provided with the fiber panel FP of the composite structure of the component C may be designed/configured to provide a wide variety of features/functions and systems/devices within the vehicle interior.

Figure 43A:
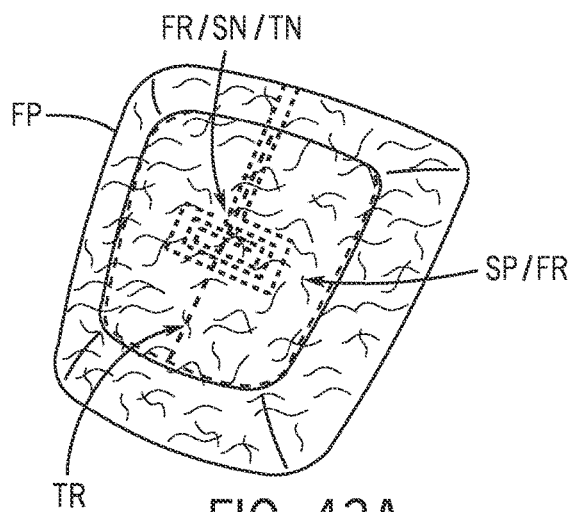
FIG. 43A is a schematic perspective view of a component comprising a panel with a functional circuit according to an exemplary embodiment.
Figure 43B:
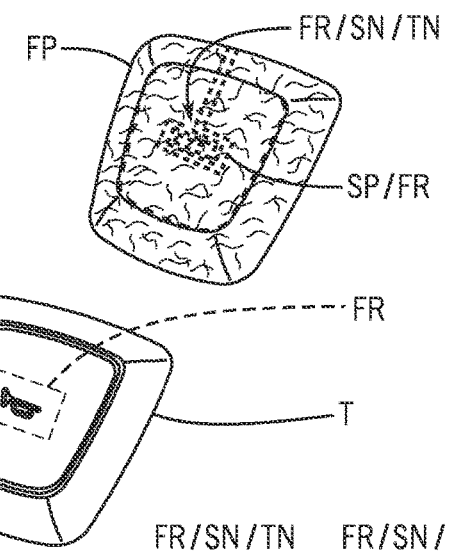
FIG. 43B is a schematic exploded perspective view of a component comprising a panel with a functional circuit according to an exemplary embodiment.
Figure 44A:
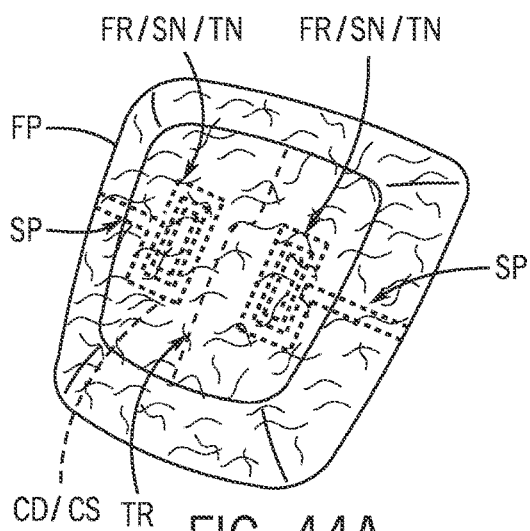
FIG. 44A is a schematic perspective view of a component comprising a panel with a functional circuit according to an exemplary embodiment.
Figure 44B:
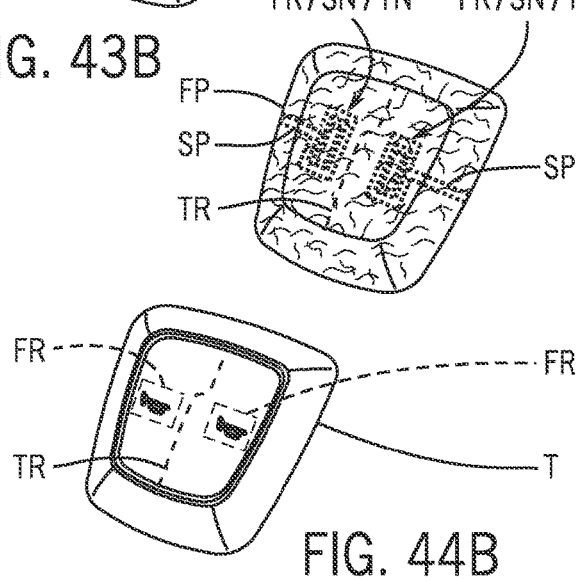
FIG. 44B is a schematic exploded perspective view of a component comprising a panel with a functional circuit according to an exemplary embodiment.

As indicated schematically in FIGS. 42A-42D, 43A-43B, 44A-44B and 45A-45C, the functional circuit FR of the fiber panel FP of the composite structure may be configured to be formed and to integrate within the component and with other features/systems such as an airbag module ABM configured to deploy an airbag AB through an opening formed by an airbag door ABD at a tear line/seam TR in the component C; as indicated schematically in FIGS. 43A-43B, the functional circuit FR may be on the tear line/seam TR to facilitate deployment of the airbag AB; as indicated schematically in FIGS. 44A-44B and 45A-45C, the functional circuit FR is adjacent to the tear line/seam TR to facilitate deployment of the airbag AB at the airbag door ABD. As indicated schematically in FIGS. 66A-66B, the functional circuit FR may comprise a sensor SN/NT configured to detect the presence/touch of an occupant and provide a signal to a vehicle system such as a safety system SRS shown as comprising an airbag module ABM; as indicated schematically, the functional circuit FR of the component C may be integrated with other systems of the component such as the airbag module ABM. See also FIGS. 45A-45C.

Exemplary Embodiments—A

Referring to FIGS. 1A and 1B, a vehicle V is shown including an interior I with vehicle interior components shown as an instrument panel IP, doors DP and a floor console FC. According to an exemplary embodiment, components of vehicle V such as instrument panel IP and doors DP may include trim components/panels comprised of fiber and plastic. According to an exemplary embodiment, instrument panel IP and doors DP may provide visible surfaces in the vehicle interior of vehicle V. According to an exemplary embodiment, vehicle interior/trim components such as instrument panel IP and/or doors DP may provide at least one airbag behind the visible surfaces; instrument panel IP and/or doors DP may provide a weakened area to aid the airbag in breaking through the trim component/panel during airbag deployment. See FIGS. 1D-1F.

According to an exemplary embodiment as shown schematically in FIGS. 1C-1F, instrument panel IP may provide a weakened shape/zone shown as a recess RC (e.g. a line, score line, cut, notch, groove, discontinuity, interruption, etc.) to facilitate an airbag AB deployment through an airbag door ABD. According to an exemplary embodiment, the weakened shape/zone may comprise at least one of a recess or a score line behind the visible surface of instrument panel IP; as shown schematically, the weakened shape/zone may comprise an "H" shape pattern (e.g. corresponding to a door, double-door, etc. for the airbag to comprise the airbag door in the panel). See FIGS. 1C and 1D-1F. According to an exemplary embodiment, the weakened shape/zone may comprise a "U" shape pattern, a "bow tie" shape pattern, or any pattern suitable for airbag deployment.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a trim component C may be provided for a vehicle interior; the component C (e.g. a composite structure) may be configured to support an airbag chute and an airbag module providing an airbag configured to be deployed through an opening into the vehicle interior. The component C (e.g. composite structure/panel, etc.) may comprise a structural substrate SB providing at least one door established upon deployment of the airbag to facilitate deployment of the airbag from the airbag module through the opening. See FIGS. 1C-1F and 2A-2C. Structural substrate SB may comprise a reinforcement MN (shown as comprising a thread pattern, set/network of threads, etc.) configured to secure the at least one door to structural substrate SB during deployment of the airbag. See e.g. FIGS. 1C-1F, 2B and 8A-8E. Reinforcement MN may comprise a stitch arrangement (e.g. at least one stitch, set of stitches, pattern of stitches, etc.). As shown schematically according to an exemplary embodiment in FIGS. 2B-2C, 3D-3F, 4C, 5A-5C and 7A-7F, the reinforcement MN may comprise a top stitch TS and a bottom stitch BS (e.g. to comprise the pattern of stitches, stitch network, etc.). See also FIGS. 8A-8E. According to an exemplary embodiment, top stitch TS may comprise a thread weight and bottom stitch BS may comprise a thread weight; the thread weight of top stitch TS may be generally greater than the thread weight of bottom stitch BS; for example, top stitch TS may comprise 210 Tex thread; bottom stitch BS may comprise 70 Tex thread. As indicated schematically in FIGS. 8A-8E, bottom stitch BS may be configured to separate upon deployment of the airbag to facilitate deployment of the airbag from the airbag module through the opening; top stitch TS may be configured to secure the door to structural substrate SB upon deployment of the airbag. Top stitch TS may be configured to stretch upon deployment of the airbag to secure the door to structural substrate SB. Reinforcement MN may be comprised of bonded nylon thread and/or thread material of at least one of (a) KEVLAR, (b) aramid, (c) nylon, (d) polyester, (e) thread, (f) ceramic fibers, (g) polymeric fibers, (h) synthetic fibers.

Figure 3A:
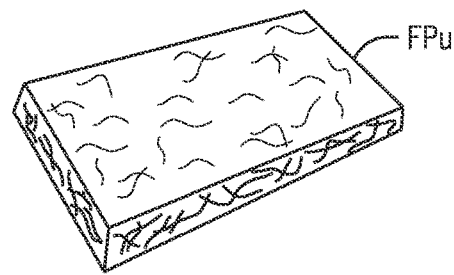
FIGS. 3A through 3F are schematic perspective views of a process to form a reinforced fiber panel according to an exemplary embodiment.
Figure 3B:
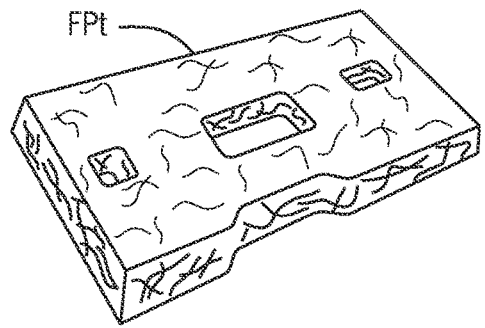
Figure 3C:
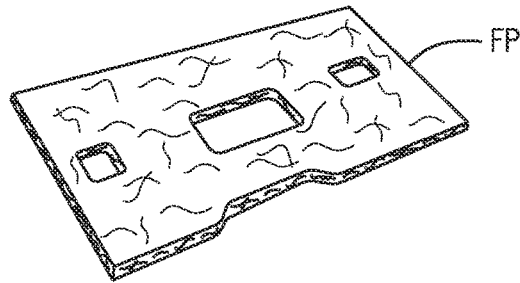
Figure 3D:
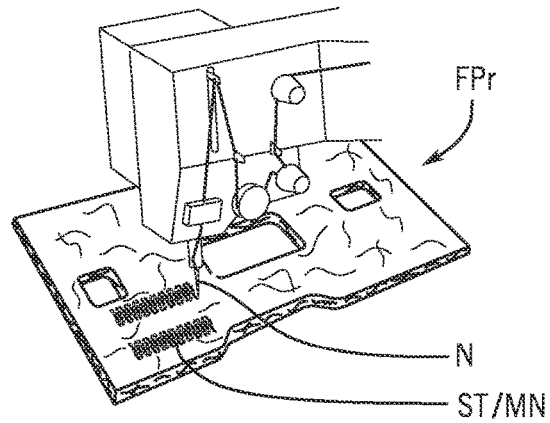
Figure 3E:
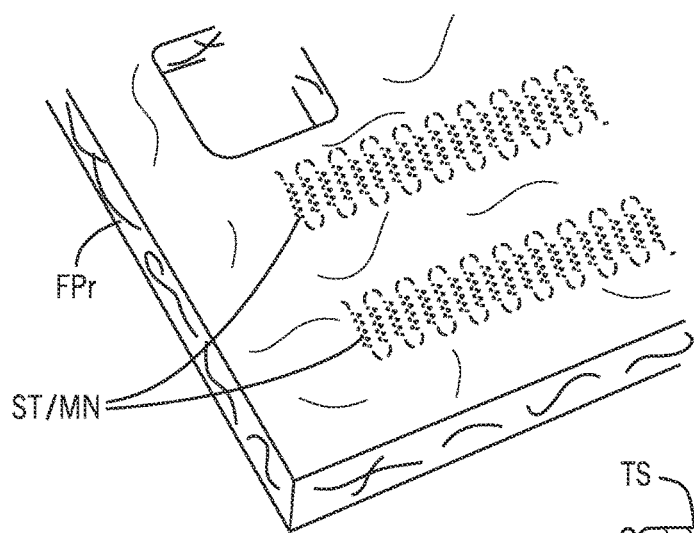
Figure 3F:
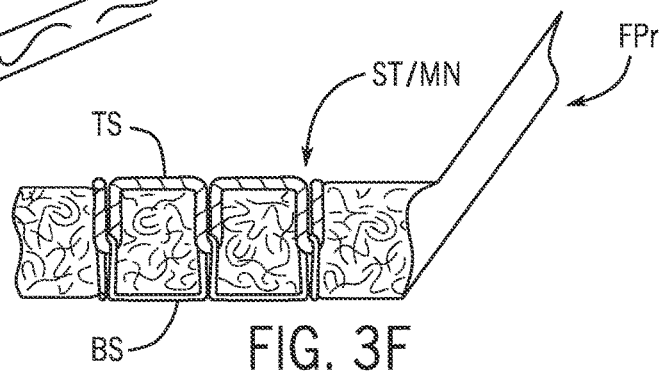

As shown schematically according to an exemplary embodiment in FIGS. 2A-2C and 3A-3F, the structural substrate SB of the component (e.g. composite structure) may comprise a panel comprised at least partially of fibers; reinforcement MN may be comprised of thread sewn to the panel (see FIGS. 3D-3F). As indicated schematically according to an exemplary embodiment in FIGS. 6A-6C and 7A-7C, the thread/reinforcement MN (e.g. set of stitches, pattern/network of stitches, etc.) may be pressed into a surface of the panel during a compression forming process. See also FIGS. 4A-4C. As shown schematically in FIGS. 7D-7E, the panel may comprise a depression RC; the thread/thread pattern (e.g. reinforcement) may be joined to the panel at depression RC; the thread/pattern and the panel may form a generally continuous surface TX for trim component C.

As indicated schematically according to an exemplary embodiment in FIGS. 4A-4D, 6A-6C and 7A-7C, the structural substrate SB may comprise a compression-formed component for the component/trim component (e.g. composite structure). As indicated schematically, the compression-formed component may comprise a recess RC in a back side of structural substrate SB configured to establish the opening so that the airbag will deploy through the compression-formed component at the opening. See e.g. FIGS. 1C-1F and 7A-7C. As shown schematically in FIGS. 3A-3F, 4A-4D, 6A-6C, 7A-7C and 8A-8E, the structural substrate SB for the component may be formed at least partially from fibers (e.g. provided as a fiber mat, fiber panel, fiber web, etc.). As indicated schematically, the structural substrate SB for the composite structure may comprise a generally rigid fiber mat. See FIGS. 3A-3F, 4A-4D, 6A-6C and 7A-7C.

As indicated schematically according to an exemplary embodiment in FIGS. 1C-1F and 7D, trim component C may further comprise a cover T to provide a surface on a front side of structural substrate SB; the cover T may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil.

As indicated schematically according to an exemplary embodiment in FIGS. 8A-8E, in operation of the airbag with the trim component contact between the airbag and the at least one door may induce tearing of cover T to establish the opening for the airbag and to facilitate deployment of the airbag through the opening in the trim component (e.g. through the composite structure); the airbag chute may be configured to define/provide at least one hinge area HG for the at least one door; reinforcement MN may be positioned adjacent the hinge area. See e.g. FIGS. 5A-5C.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a vehicle interior component C may be produced in a mold M comprising a first surface and a second surface by a process comprising: placing a pre-form substrate SB onto the first surface of the mold, forming a compression-formed structure/structural substrate SB from pre-form substrate SB by compressing pre-form substrate SB between the first surface of the mold and the second surface of the mold, and applying a cover T to the compression-formed structure SB to form a panel assembly SB providing a surface effect.

Figure 4A:
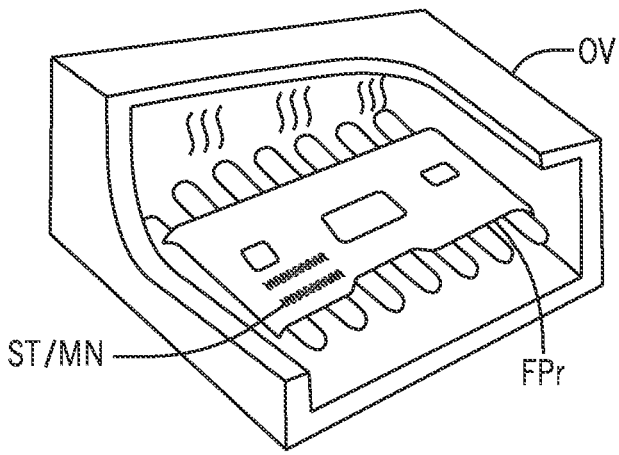
FIGS. 4A through 4C are schematic perspective views of a process to form a structural substrate from a reinforced fiber panel according to an exemplary embodiment.
Figure 4B:
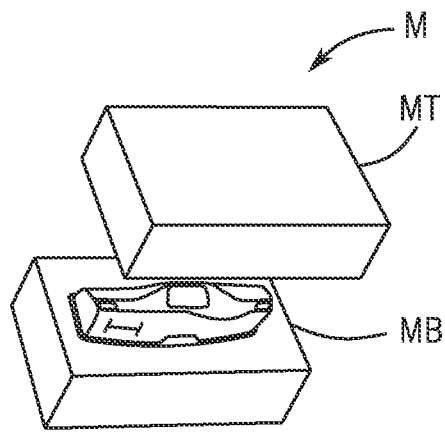
Figure 4C:
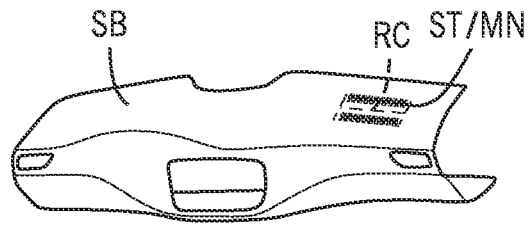
Figure 4D:
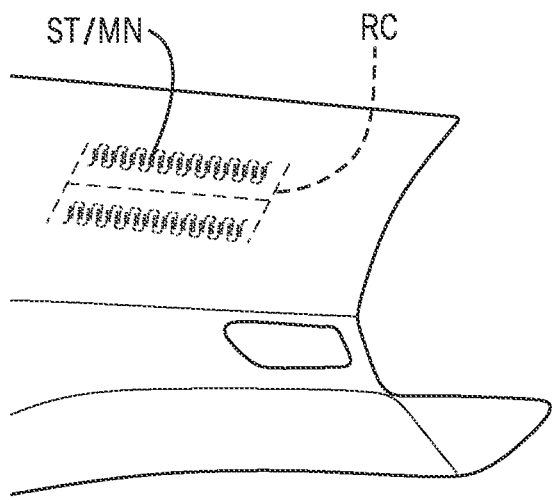
FIG. 4D is a schematic perspective cut-away view of a structural substrate according to an exemplary embodiment.

As indicated schematically in FIGS. 4A-4C, the pre-form substrate SB for the composite structure for the component may comprise a reinforced pre-form substrate (e.g. with reinforcement by thread/stitch pattern, webs, strands, links, etc.); reinforcement MN may comprise threads/material such as at least one of (a) KEVLAR, (b) aramid, (c) nylon, (d) polyester, (e) thread, (f) ceramic fibers, (h) polymeric fibers, (i) synthetic fibers. The pre-form substrate may comprise a panel comprised at least partially of fibers; reinforcement MN may be comprised of thread sewn to the panel. See e.g. FIGS. 3A-3F. As shown schematically, the compression-formed structure may comprise a substrate layer and reinforcement MN. See e.g. FIGS. 4A-4D. The reinforced pre-form substrate may comprise a surface effect comprising a generally smooth texture; the surface effect of the panel assembly may generally comprise the surface effect of the reinforced pre-from substrate; the step of forming the compression-formed structure may comprise forming reinforcement MN and the pre-form substrate into a generally continuous surface. See e.g. FIGS. 7A-7C. The substrate layer for the pre-form substrate may comprise a fiber mat; the substrate layer may comprise a generally rigid fiber mat; the step of forming the compression-formed structure may comprise forming the substrate layer into a generally rigid form; the surface effect of the panel assembly may comprise the generally rigid form of the substrate layer of the compression-formed structure. See e.g. FIGS. 3A-3F and 4A-4D. As indicated schematically in FIGS. 6A-6C and 7A-7F, the surface effect of the panel assembly may comprise a generally smooth texture and a generally rigid form; the generally smooth texture of the panel assembly may be provided by (a) a surface effect of cover T and (b) a surface effect of the pre-form substrate. See also FIGS. 1C-1F. According to an exemplary embodiment, cover T of the panel assembly may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil. As indicate schematically in FIGS. 1C and 4C, the compression-formed structure may comprise a shape; the panel assembly may comprise at least partially the shape of the compression-formed structure; the shape may comprise a first contour provided by the first surface of the mold and a second contour provided by the second surface of the mold. See e.g. FIGS. 4A-4C, 6A-6C and 7A-7F. As indicated schematically, the substrate layer for the pre-form substrate may comprise a fiber mat; the process may comprise the step of forming the pre-form substrate from a generally compressible fiber mat. See e.g. FIGS. 3A-3F, 4A-4D, 6A-6C and 7A-7F. According to an exemplary embodiment, the pre-form substrate may comprise natural fibers and a resin; the resin may comprise polypropylene; the natural fibers may comprise at least one of (a) flax; (b) kenaf. According to an exemplary embodiment, the pre-form substrate may comprise an area weight of between 1000 grams per square meter and 1800 grams per square meter; the pre-form substrate may comprise a thickness of between 1.5 mm and 4 mm; the compression-formed structure may comprise a thickness of between 0.8 mm and 3 mm. The process may comprise the step of heating the pre-formed substrate; the pre-formed substrate may be compressed as the pre-formed substrate cools; the process may comprise the step of injecting resin into the mold after the compression-formed structure is formed to form an ancillary component of the panel assembly. See e.g. FIGS. 11A-11B and 12.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a component for a vehicle interior configured to support an airbag module configured to deploy an airbag through an airbag chute by establishing a door providing an opening into the vehicle interior for the airbag may comprise a composite structure comprising a structural substrate SB formed from a fiber panel and a cover T for structural substrate SB providing an exterior surface. Structural substrate SB may comprise a stitch pattern. The composite structure may be configured so that when the airbag is deployed from the airbag module the stitch pattern provides a reinforcement MN for the door providing the opening so that the airbag can be deployed through the opening while the door remains at least partially attached to the composite structure. See e.g. FIGS. 1C-1F, 2A-2C, 8A-8E and 9A-9C.

As shown schematically according to an exemplary embodiment in FIGS. 2B, 3D-3F, 4A-4D, 5A-5C, 7A-7F, 8A-8E and 9A-9C, the reinforcement MN may comprise a set of threads (e.g. stitch pattern, stitch network, etc.); the stitch pattern may provide reinforcement MN at a hinge area HG for the door; the stitch pattern may comprise a set of threads (e.g. pattern/network). As shown schematically, the set of threads for the stitch pattern may comprise a first set of threads and a second set of threads; the set of threads for the stitch pattern may comprise an upper set of threads and a lower set of threads; the upper set of threads may comprise a set of retaining threads and the lower set of threads may comprise a set of sacrificial threads. See e.g. FIGS. 2B, 3D-3F, 5A-5C and 8A-8E/9A-9C. As indicated schematically, the set of threads for the stitch pattern may comprise a set of retaining threads configured to stretch and a set of sacrificial threads configured to break; the door may remain at least partially attached to the composite structure by the set of retaining threads; the retaining threads may provide reinforcement MN for the door; the sacrificial threads may be configured to rupture when the airbag establishes the door and the opening in the composite structure. See e.g. FIGS. 2B, 3D-3F, 5A-5C and 8A-8E/9A-9C. According to an exemplary embodiment, the set of threads for the stitch pattern may comprise a set of upper threads and a set of lower threads; the upper threads may provide a hinge for the door; the lower threads may comprise sacrificial threads configured to rupture when the airbag establishes the opening in the composite structure. See e.g. FIGS. 8A-8E. As shown schematically according to an exemplary embodiment, the stitch pattern may be provided on the fiber panel; the stitch pattern may be formed into structural substrate SB; the stitch pattern may be formed into structural substrate SB so that the stitch pattern may not be visible at the exterior surface of cover T; the stitch pattern may comprise a network of threads in the fiber panel formed into structural substrate SB. See FIGS. 2B, 5A-5C and 7A-7F. As shown schematically in FIGS. 8A-8E, the reinforcement MN provided by the stitch pattern may comprise reinforcement for the composite structure; the stitch pattern may comprise a first set of threads comprising a first thread weight and second set of threads comprising a second thread weight; the first thread weight may be larger than the second thread weight. According to an exemplary embodiment, the stitch pattern may comprise a set of retaining threads comprising 210 Tex thread and a set of sacrificial threads comprising 70 Tex thread. As indicated schematically, the set of retaining threads may be configured to stretch upon deployment of the airbag through the door for the composite structure; the stitch pattern may comprise a set of threads at least partially sewn into the fiber panel of structural substrate SB; the set of threads of the stitch pattern may be pressed into a surface of the fiber panel; the set of threads of the stitch pattern may be pressed into a surface of the fiber panel so that structural substrate SB may comprise a generally flat surface for cover T; the set of threads of the stitch pattern may be pressed into a surface of the fiber panel so that the set of threads may not be visible at the exterior surface of cover T of the composite surface. See e.g. FIGS. 3A-3F, 4A-4D and 7A-7F. According to an exemplary embodiment, reinforcement MN may comprise bonded nylon thread; the set of threads for the stitch pattern comprising at least one of (a) KEVLAR, (b) aramid, (c) nylon, (d) polyester, (e) thread, (f) ceramic fibers, (h) polymeric fibers, (i) synthetic fibers. According to an exemplary embodiment, the component may further comprise a notch (e.g. recess, interruption, line, score line, etc.) in structural substrate SB configured to facilitate establishment of the opening for the airbag through the composite structure.

As shown schematically in FIGS. 4A-4F, the structural substrate SB for the component (e.g. composite structure) may be formed into a shape; the component may further comprise a feature on structural substrate SB. As shown schematically in FIGS. 4E-4F, the feature may comprise the airbag chute and/or a resin-formed feature molded RB on structural substrate SB. See also FIGS. 6A-6C and 7A-7F. According to an exemplary embodiment, the feature may comprise at least one of (a) the airbag chute; (b) a passage for the airbag; (c) a rib; (d) a set of ribs; (e) a feature adjacent to reinforcement MN; (f) a feature at reinforcement MN; (g) a feature at a hinge area; (h) a feature at the opening; (i) a feature configured to facilitate the opening; (j) a structure for the door; (k) a set of ribs configured to establish a seam for the door; (l) structure for a double door comprising the door; (m) the airbag chute at the hinge area; (n) a resin-formed feature. As indicated schematically, the door ABD may comprise a double door; the feature may comprise a seam to facilitate formation of the double door; the door may comprise a double door providing the opening for the airbag; reinforcement MN may comprise a hinge area for each door of the double door. See e.g. FIGS. 1C-1F, 8A-8E and 9A-9C.

Figure 9A:
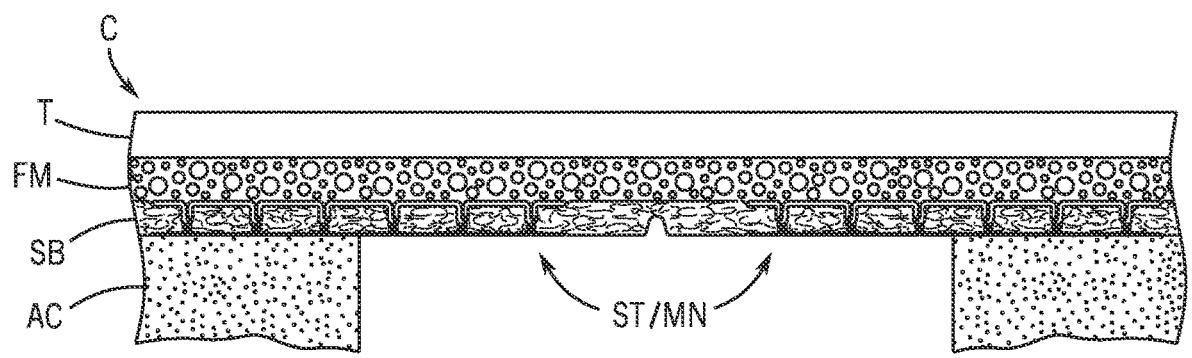
FIGS. 9A through 9C are partial schematic section views of a component for a vehicle interior according to an exemplary embodiment.
Figure 9B:
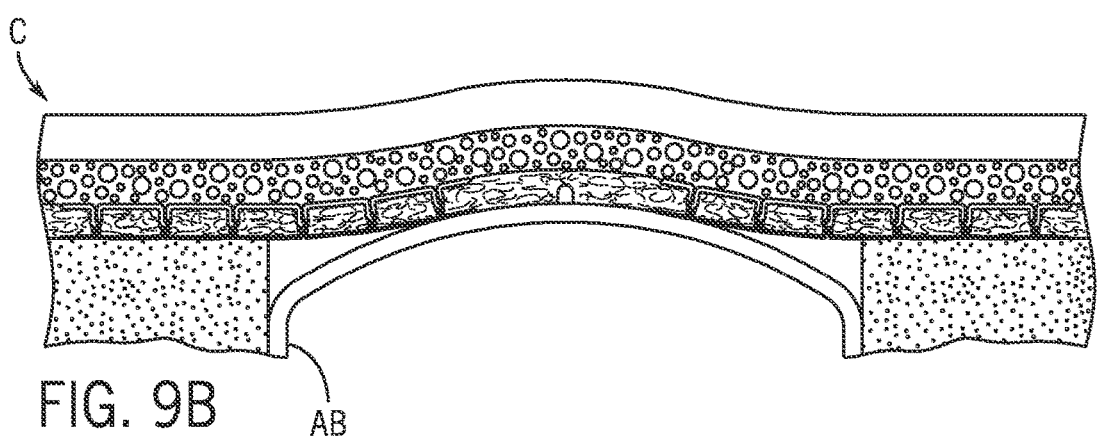
Figure 9C:
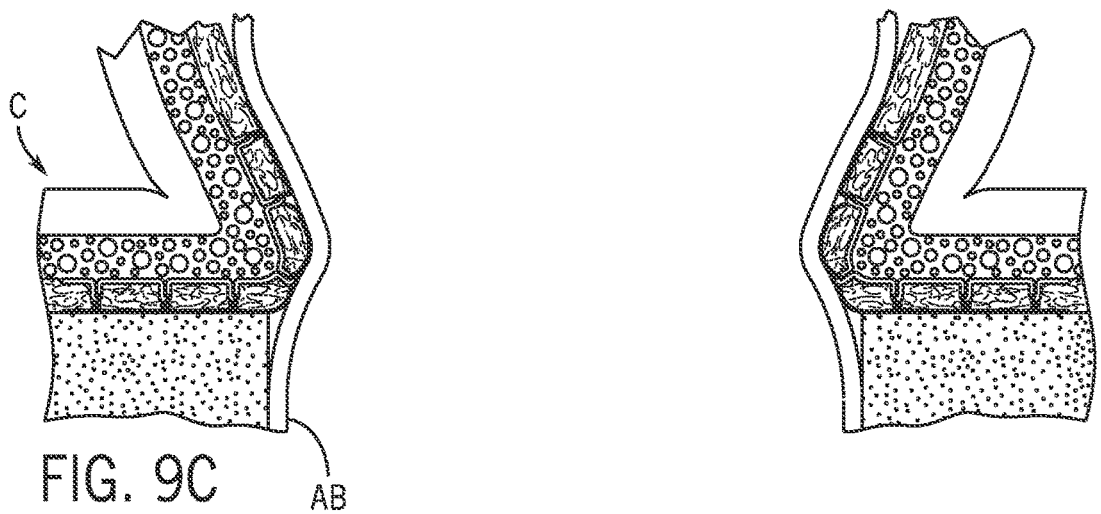
Figure 10A:
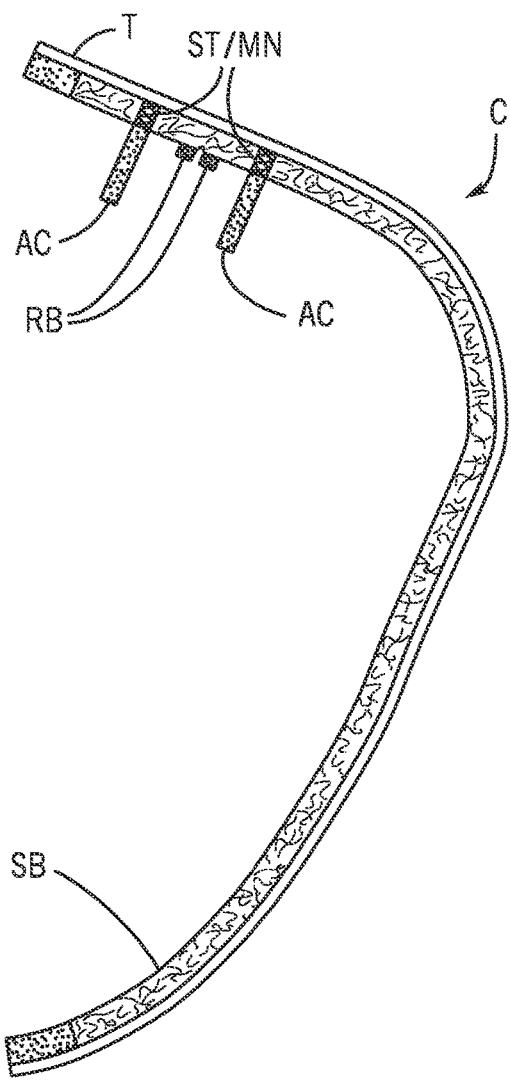
FIG. 10A is a schematic section view of a component for a vehicle interior according to an exemplary embodiment.
Figure 10B:
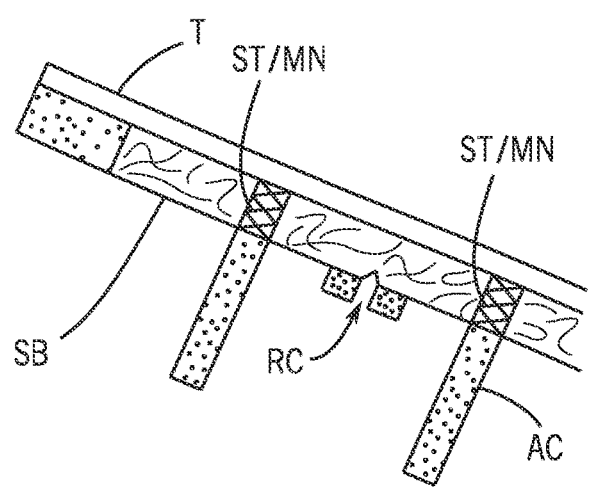
FIG. 10B is a schematic cut-away section view of a component for a vehicle interior according to an exemplary embodiment.
Figure 10C:
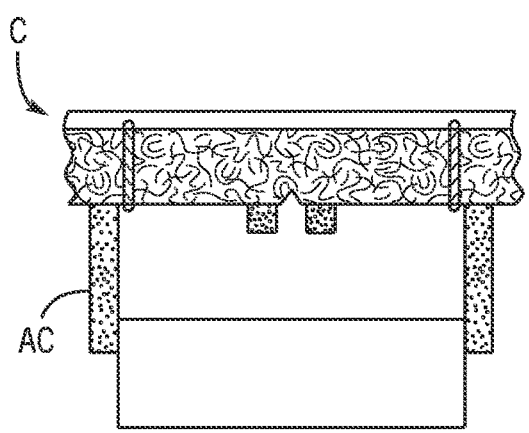
FIGS. 10C through 10D are schematic cut-away section views of a deployment of an airbag through a component for a vehicle interior according to an exemplary embodiment.
Figure 10D:
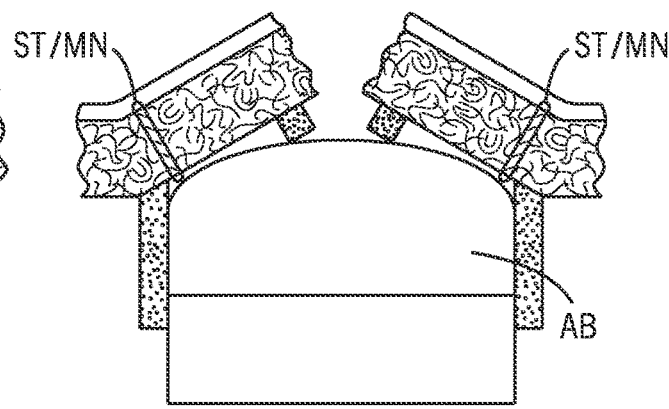

As shown schematically according to an exemplary embodiment in FIGS. 9A-9C, the composite structure further may comprise a foam layer FM beneath cover T; reinforcement MN may comprise a hinge area configured for the door established by deployment of the airbag through the airbag chute; structural substrate SB may comprise a compression-formed component from the fiber panel; structural substrate SB may comprise a generally rigid fiber mat. See also FIGS. 5A-5C and 8A-8E. According to an exemplary embodiment, cover T may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on structural substrate SB; (m) paint on structural substrate SB; (n) the exterior surface of structural substrate SB. According to an exemplary embodiment, the component may comprise at least one of an instrument panel; a door panel; a trim panel; a trim component. See e.g. FIGS. 1A-1F.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a component for a vehicle interior configured to support an airbag module configured to deploy an airbag through an airbag chute by establishing a door providing an opening into the vehicle interior for the airbag may comprise a composite structure comprising a structural substrate SB formed from a fiber panel, a cover T for structural substrate SB providing an exterior surface and a feature formed from resin on structural substrate SB. Structural substrate SB may comprise a reinforcement MN; reinforcement MN may be configured so that the door established by deployment of the airbag remains at least partially attached to the composite structure. As shown schematically according to an exemplary embodiment, reinforcement MN may comprise a pattern of threads; the pattern of threads may be configured so that when the airbag is deployed from the airbag module the door remains at least partially attached to the composite structure by at least a portion of the pattern of threads; the pattern of threads may comprise a first stitch pattern and a second stitch pattern; the pattern of threads may comprise a set of stitches; the pattern of threads may comprise a stitch network; the stitch network may comprise a hinge for the door; the stitch network for reinforcement MN may comprise a set of retaining threads and a set of sacrificial threads; the pattern of threads for reinforcement MN may comprise a first set of threads and a second set of threads; the pattern of threads for reinforcement MN may comprise a set of retaining threads and a set of sacrificial threads; the pattern of threads for reinforcement MN may comprise a set of strong threads and a set of weak threads; the set of threads for reinforcement MN may comprise a set of retaining threads and a set of sacrificial threads; the set of retaining threads may be configured to comprise reinforcement MN after deployment of the airbag. See FIGS. 1C-1D, 2C, 3D-3F, 4A-4D, 5A-5C, 6A-6C, 7A-7F, 8A-8E, 9A-9C and 10A-10D.

As shown schematically, the reinforcement MN may comprise a hinge area for the door; reinforcement MN may comprise a hinge for the door. See e.g. FIGS. 8A-8E, 9A-9C and 10A-10D. According to an exemplary embodiment, the feature may comprise a resin-formed feature molded on structural substrate SB; the feature may comprise the airbag chute (shown as feature AC and/or RB); the resin-formed feature may comprise at least one of (a) the airbag chute; (b) a passage for the airbag; (c) a rib; (d) a set of ribs; (e) a feature adjacent to reinforcement MN; (f) a feature at reinforcement MN; (g) a feature at a hinge area; (h) a feature at the opening; (i) a feature configured to facilitate the opening; (j) structure for the door; (k) a set of ribs configured to establish a seam for the door; (l) structure for a double door comprising the door. See e.g. FIGS. 1C-1D, 2C, 3D-3F, 4A-4D, 5A-5C, 6A-6C, 7A-7F, 8A-8E, 9A-9C and 10A-10D.

As indicated schematically according to an exemplary embodiment in FIGS. 1C-1F, 6A-6C, 7A-7F, 8A-8E, 9A-9C and 10A-10D, the reinforcement for the structural substrate/fiber panel of the composite structure/component (e.g. configured for deployment of an airbag from an airbag chute through an opening established in the composite structure/component) may be provided with a thread pattern/arrangement ST/MN (such as comprising top threads and bottom threads shown as reinforcement/thread pattern). Compare FIGS. 8A-8E (pattern with reinforcement MN with top threads TS and bottom threads BS) and FIG. 9A-9C (pattern for composite structure with foam layer and reinforcement/thread pattern ST/MN).

According to an exemplary embodiment as shown schematically in FIGS. 3A-3F, 4A-4D and 5A-5C, the fiber panel FP (e.g. formed mat/panel/pad, lofted mat/panel/pad, uncompressed mat/pad, woven mat/pad, non-woven mat, pre-formed mat, compressed mat, etc.) for the structural substrate/compression-formed component SB may be provided for forming a reinforcement/thread pattern ST/MN (e.g. by sewing, stitching, etc. of threads/fiber, etc.). As indicated schematically in FIGS. 8A-8E, the reinforcement/thread pattern ST/MN for the composite structure/component facilitates deployment of the airbag AB into the vehicle interior; top threads TS stretch and retain connection (e.g. at the opening/door established by deployment of the airbag) and bottom threads BS tear/rupture (e.g. stretch/release/separate). Compare FIGS. 9A-9C (composite structure with foam layer and corresponding reinforcement). According to an exemplary embodiment, the reinforcement/thread pattern may comprise threads in an arrangement with a variation in pattern/stitch or material or thickness/size or etc. (e.g. variations in strength, variations in Tex value (that may range between and beyond 70 Tex and 210 Tex), variations in density, variations in performance/properties, etc.); for example, the reinforcement/thread pattern may be configured with a top stitch that may tear/separate and a bottom stitch that may stretch/retain (e.g. a heavyweight bottom thread) or with an integrated pattern with threads/multiple threads that may exhibit suitable variations of strength/performance during deployment of the airbag through the composite structure/component from the airbag chute/module. See e.g. FIGS. 1C-1F, 8D-8E and 9A-9C.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a trim component for a vehicle interior configured to support an airbag module providing an airbag for deployment through an opening into the vehicle interior may be prepared using a mold by a process comprising the steps of: providing a pre-form substrate, joining a reinforcement MN to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate SB having a shape. According to an exemplary embodiment as shown schematically, the shape for the composite structure/trim component C may correspond to a first contour of the first surface and a second contour of the second surface; structural substrate SB for the composite structure may be configured to provide at least one door established upon deployment of the airbag to facilitate deployment of the airbag from the airbag module through the opening; reinforcement MN for the composite structure may be configured to secure the at least one door to structural substrate SB during deployment of the airbag. See FIGS. 1C-1F, 2C, 4A-4C and 6A-6C. According to an exemplary embodiment, the step of joining a reinforcement MN to the pre-form substrate may comprise sewing at least one of a thread; a stitch to the pre-form substrate; the at least one of the thread or the stitch may be comprised of at least one of (a) KEVLAR, (b) aramid, (c) nylon, (d) polyester, (e) ceramic fibers, (f) polymeric fibers, (g) synthetic fibers. According to an exemplary embodiment, the step of joining a reinforcement MN to the pre-form substrate may comprise piercing an opening in the pre-form substrate and joining a top stitch TS to a bottom stitch BS at the opening; top stitch TS may comprise a thread weight and bottom stitch BS may comprise a thread weight; the thread weight of top stitch TS may be generally greater than the thread weight of bottom stitch BS. According to an exemplary embodiment, the process may comprise the step of forming a recess in a surface of at least one of the pre-form substrate; structural substrate SB; the recess may be configured to facilitate deployment of the airbag.

According to an exemplary embodiment as shown schematically in FIGS. 2A-2C, 3A-3F, 4A-4F, 5A-5C, 6A-6C, 7A-7F, 8A-8E, 9A-9C, 10A-10D, 11A-11B and 12, a method of producing/manufacturing a vehicle trim component configured to support an airbag module providing an airbag for deployment from the airbag module through an opening into the vehicle interior may comprise the steps of: providing a pre-form substrate, joining a reinforcement MN to the pre-form substrate in at least one hinge area to form a reinforced pre-form substrate, disposing the reinforced pre-form substrate onto a first surface of the mold, and compressing the reinforced pre-form substrate between the first surface and a second surface of the mold to form the reinforced pre-form substrate into a structural substrate SB having a shape. The shape may correspond to a first contour of the first surface and a second contour of the second surface. Structural substrate SB may be configured to provide at least one door established upon deployment of the airbag to facilitate deployment of the airbag from the airbag module through the opening. Reinforcement MN may be configured to secure the door to structural substrate SB during deployment of the airbag.

Figure 11A:
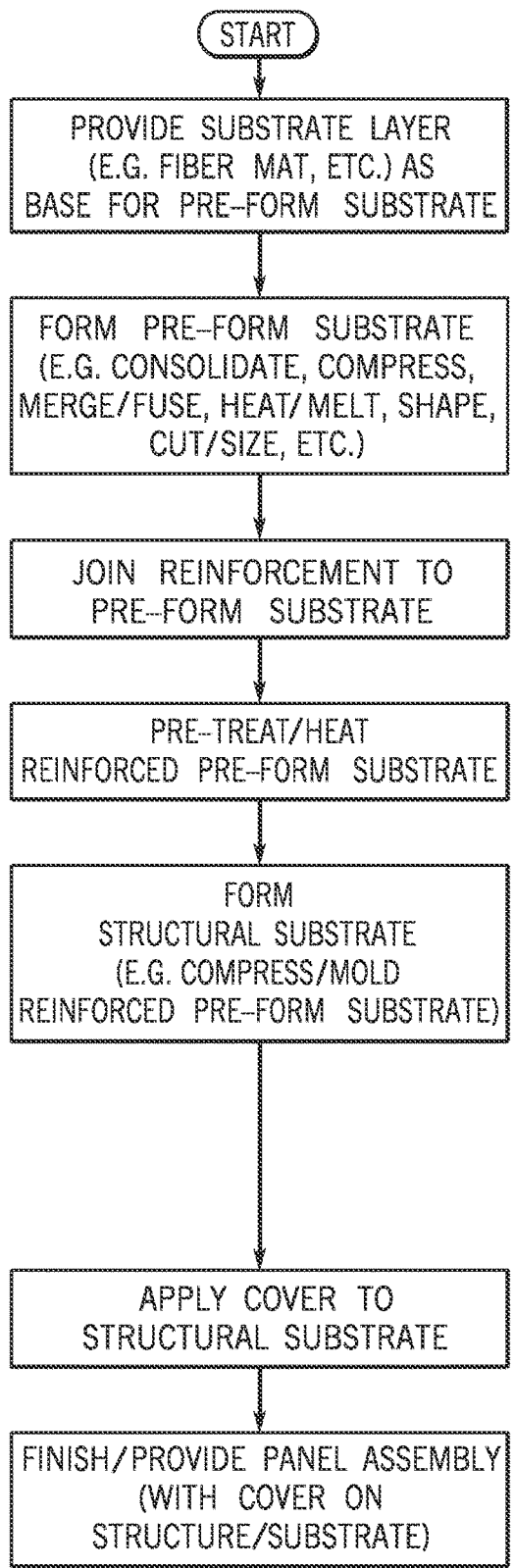
FIG. 11A is a schematic flow diagram of a method for forming a vehicle interior component according to an exemplary embodiment.

According to an exemplary embodiment as shown schematically in FIG. 11A, a method of manufacturing a vehicle trim component C may comprise the steps of providing a substrate layer (e.g. fiber mat, etc.) as a base for a pre-form substrate, forming the pre-form substrate (e.g. consolidating, compressing, merging/fusing, heating/melting, shaping, cutting/sizing, etc.), joining a reinforcement to the pre-form substrate, pre-treating/heating the reinforced pre-form substrate, forming a structural substrate (e.g. compressing/molding the reinforced pre-form substrate), applying a cover to the structural substrate and finishing/providing a panel assembly (with the cover on the structure/substrate).

Figure 11B:
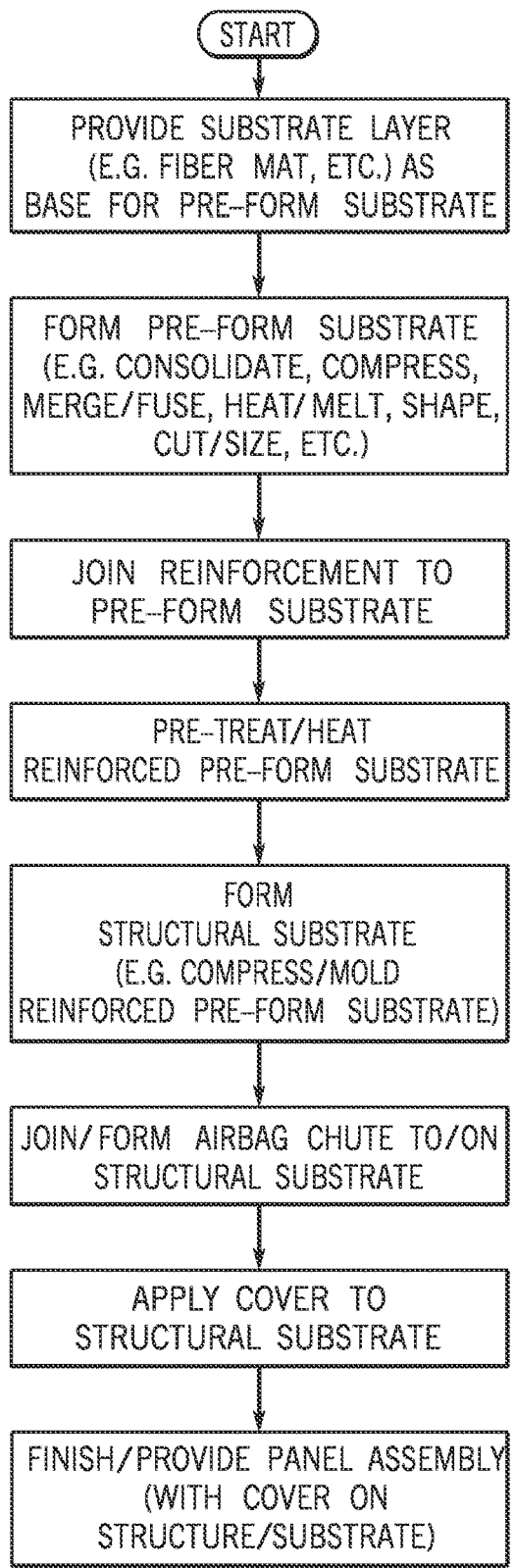
FIG. 11B is a schematic flow diagram of a method for forming a vehicle interior component according to an exemplary embodiment.

According to an exemplary embodiment as shown schematically in FIG. 11B, a method of manufacturing a vehicle trim component C may comprise the steps of providing a substrate layer (e.g. fiber mat, etc.) as a base for a pre-form substrate, forming the pre-form substrate (e.g. consolidating, compressing, merging/fusing, heating/melting, shaping, cutting/sizing, etc.), joining a reinforcement to the pre-form substrate, pre-treating/heating the reinforced pre-form substrate, forming a structural substrate (e.g. compressing/molding the reinforced pre-form substrate), joining/forming an airbag chute to/on the structural substrate, applying a cover to the structural substrate and finishing/providing a panel assembly (with the cover on the structure/substrate).

Figure 12:
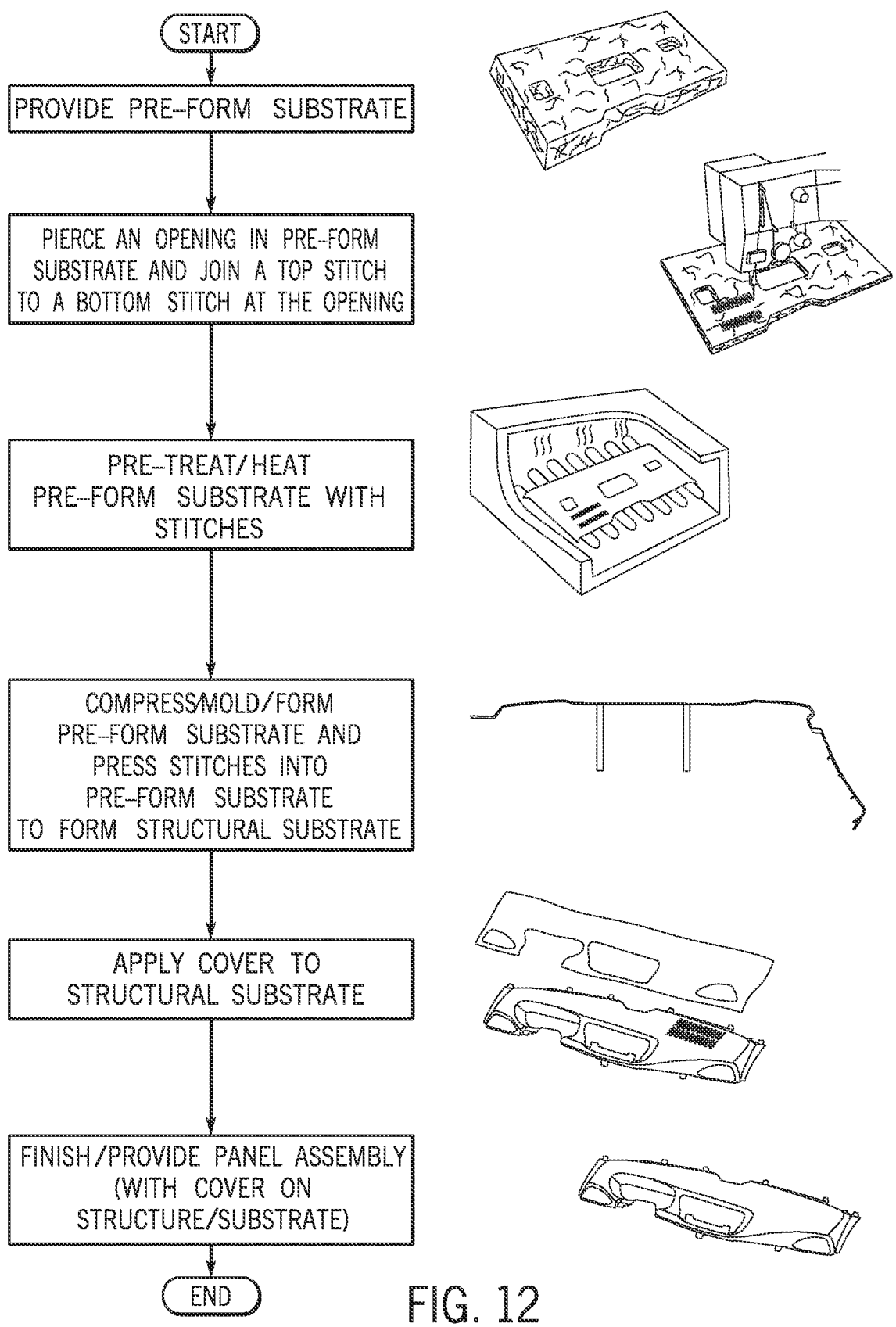
FIG. 12 is a schematic flow diagram of a method for forming a vehicle interior component according to an exemplary embodiment.

According to an exemplary embodiment as shown schematically in FIG. 12, a method of manufacturing a vehicle trim component C may comprise the steps of providing a pre-form substrate, piercing an opening in the pre-form substrate and joining a top stitch to a bottom stitch at the opening, pre-treating/heating the pre-form substrate with the top and the bottom stitch, compressing/molding/forming the pre-form substrate and pressing the top stitch and the bottom stitch into the pre-form substrate to form a structural substrate, applying a cover to the structural substrate, and finishing/providing a panel assembly (with the cover on the structure/substrate).

Exemplary Embodiments—B

Referring to FIGS. 1A and 1B, a vehicle V is shown schematically with an interior I comprising components such as trim components, panels, consoles, etc. As indicated schematically according to an exemplary embodiment in FIGS. 13A-13B, the vehicle interior may comprise a component such as a trim panel shown as instrument panel IP configured to provide a base B with a moveable panel/door D to provide access into an opening. See also FIGS. 14A-14B and 18A-18B.

As shown schematically according to an exemplary embodiment in FIGS. 14A-14B, 15A-15F, 16A-16E, 18A-18B, 19 and 20, the component may comprise a substrate such as a fiber panel FP formed with a reinforcement MN (e.g. fiber/thread, etc.) shown as provided in a stitch/stitch pattern ST at a hinge area for a hinge HG (shown as a living hinge) for the moveable panel/door D.

According to an exemplary embodiment as shown schematically in FIGS. 13A-13B, 14A-14B, 15A-15F, 16A-16E, 17A-17E, 18A-18D, 19 and 20, a component such as a trim component shown as instrument panel IP for a vehicle interior may be configured to provide a panel D configured to be moved between a closed position and an open position relative to a base B to provide an opening. As shown schematically in FIGS. 13A-13B, 14A-14B and 18A-18D, the panel D may comprise a structural substrate shown as comprising a fiber panel FP the panel D and a hinge area HG for the panel D; and a reinforcement MN for the panel at the hinge area; the reinforcement MN may comprise a stitch pattern ST configured to reinforce the hinge area during movement of the panel; the hinge area may comprise a hinge HG; the hinge may comprise material of the structural substrate and the reinforcement; the stitch pattern of the reinforcement may comprise thread sewn into the structural substrate; the panel may comprise a door. The structural substrate may comprise a surface for the stitch pattern; the stitch pattern may be pressed into the surface of the structural substrate. See FIGS. 15A-15F and 16A-16E. As indicated schematically in FIGS. 19 and 20, the structural substrate may comprise at least one of (a) a compression-formed component; (b) a generally rigid fiber mat; (c) a fiber panel. The structural substrate may comprise a base; the panel may be configured to be movable relative to the base; the reinforcement may be configured to reinforce the panel to the base at the hinge. As indicated schematically in FIGS. 13A-13B, 14A-14B and 18A-18B, the component may comprise a cover providing an exterior surface; the stitch pattern may be concealed at the exterior surface by the cover. The reinforcement may be comprised of at least one of (a) KEVLAR, (b) aramid, (c) nylon, (d) polyester, (e) thread, (f) ceramic fibers, (g) polymeric fibers, (h) synthetic fibers. The stitch pattern may comprise a sewn thread pattern in the base. The component may comprise at least one of an instrument panel, a door panel, a trim panel, a trim component, a trim component wherein the panel comprises a door (e.g. formed during manufacture); a trim component wherein the panel comprises an airbag door (e.g. established during airbag deployment). See also FIGS. 1C-1F and 13A-13B.

As indicated schematically in FIGS. 16A-16E, the component may be formed by a process comprising the step of injecting resin into a mold after a compression-formed structure comprising the structural substrate is formed to form an ancillary component of a composite structure. See also FIGS. 19 and 20.

According to an exemplary embodiment as shown schematically in FIGS. 13A-13B, 14A-14B, 15A-15F, 16A-16E, 17A-17E, 18A-18D, 19 and 20, a component for a vehicle interior such as a trim component shown as instrument panel IP configured to provide a panel D configured to be moved between a closed position and an open position may be prepared in a mold M providing a first mold surface MT and a second mold surface MB by a method comprising the steps of providing a substrate FP comprising a base, forming the substrate with a hinge area HG so that the panel D may be configured to be movable relative to the base of the substrate at the hinge area HG, joining a reinforcement MN in the substrate at the hinge area for the panel and compressing the substrate between the first mold surface and the second mold surface of the mold to form a structural substrate having a shape (see FIGS. 16A-16B); the shape of the structural substrate may be formed at least partially by the first mold surface and the second mold surface; the reinforcement at the hinge area for the panel may be configured to secure the panel to the base for movement between the closed position and the open position; the step of joining the reinforcement MN in the substrate may comprise sewing a stitch pattern ST in the substrate (see FIGS. 15A-15F); the step of forming the substrate may comprise at least partially cutting the panel from the base of the substrate with a cut CT (see FIG. 20); the hinge area may comprise a hinge HG and the panel may comprise a door D; the hinge HG may comprise a living hinge formed in the base of the substrate (see FIGS. 14A-

14B and 18A-18B); the hinge may comprise material from the substrate reinforced by the stitch pattern ST of the reinforcement MN. As indicated schematically according to an exemplary embodiment in FIGS. 17A-17E, 18A-18B, 19 and 20, the hinge area HG of the component may comprise a recess RC in the substrate; the step of forming the substrate may comprise at least partially cutting the panel from the base of the substrate with a cut CT and at least partially retaining material for a hinge HG for the panel D at the hinge area HG; the substrate may comprise a pre-form substrate; the substrate may comprise a fiber panel. See also FIGS. 13A-13B. As indicated schematically in FIGS. 13A-13B, 14A-14B, 18A-18B, 19 and 20, the method may comprise the step of providing a cover layer T on the substrate FP; the stitch pattern ST of the reinforcement MN may be at least partially concealed by the cover layer; the step of providing a cover layer on the substrate may comprise molding the cover layer on the substrate. As indicated schematically in FIGS. 15A-15F, 19 and 20, the step of joining the reinforcement MN in the substrate may comprise sewing a stitch pattern ST in a surface of the substrate; the method may comprise the step of providing a molded cover on an outer surface of the substrate configured to conceal the stitch pattern in the inner surface of the substrate.

According to an exemplary embodiment as shown schematically in FIGS. 13A-13B, 14A-14B, 15A-15F, 16A-16E, 17A-17E, 18A-18D, 19 and 20, a component for a vehicle interior configured to provide a panel D configured to be moved between a closed position and an open position may comprise a structural substrate formed from a fiber panel FP and a cover T for the structural substrate providing an exterior surface; the structural substrate may comprise a hinge HG for the panel and a stitch pattern ST at the hinge; the stitch pattern may comprise a thread; the stitch pattern ST may be configured to provide a reinforcement MN at the hinge when the panel is rotated between the closed position and the open position. As indicated schematically in FIGS. 13A-13B, 19 and 20, the stitch pattern ST may be formed into the structural substrate so that the stitch pattern is not visible at the exterior surface of the cover.

Exemplary Embodiments—C

According to an exemplary embodiment as shown schematically in FIG. 3A, a fiber mat FPu may comprise a combination of fibers (e.g. natural and/or synthetic fibers) and thermoplastic resin (e.g. polypropylene (PP), acrylonitrile butadiene styrene (ABS), polycarbonate (PC), etc.). According to an exemplary embodiment as shown schematically in FIG. 3B, fiber mat FPu may be trimmed into a fiber mat FPt having a thickness. According to an exemplary embodiment, fiber mat FPt may be heated to induce the thermoplastic resin to liquefy. According to an exemplary embodiment as shown schematically in FIG. 3C, heated fiber mat FPt may be partially compressed into a fiber panel FP having a thickness less than the thickness of fiber mat FPt. According to an exemplary embodiment as shown schematically in FIGS. 3D through 3F, a reinforcement MN comprising at least one of (a) KEVLAR, (b) aramid, (c) nylon, (d) polyester, (e) thread, (f) ceramic fibers, (g) polymeric fibers, (h) synthetic fibers, (i) a stitch may be sewn to fiber panel FP to form reinforced fiber panel FPr.

According to an exemplary embodiment as shown schematically in FIG. 4A, reinforced fiber panel FPr may be heated in an oven OV. As shown schematically in FIG. 4B, heated reinforced fiber panel FPr may be transferred into a mold having a mold top MT and mold bottom MB. According to an exemplary embodiment as shown schematically in FIGS. 4C and 4D, a component shown as an instrument panel substrate may be produced by a process of compression forming heated reinforced fiber panel FPr into a structural substrate SB and injection molding resin onto compression formed heated reinforced fiber panel FPr. A recess RC of structural substrate SB may be formed in the process. Recess RC may define a door to be established upon deployment of an airbag to facilitate deployment of the airbag from an airbag module through an opening. Reinforcement MN may be configured to secure the door to structural substrate SB during deployment of the airbag.

Figure 4E:
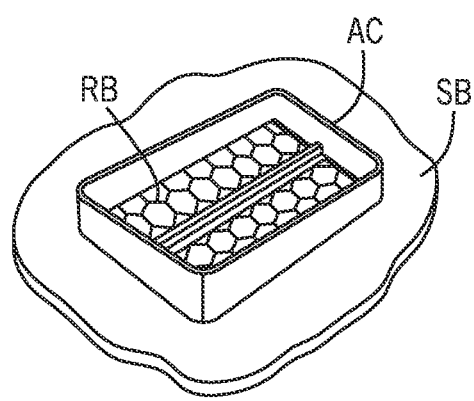
FIGS. 4E through 4F are schematic perspective cut-away views of a component for a vehicle interior according to an exemplary embodiment.
Figure 4F:
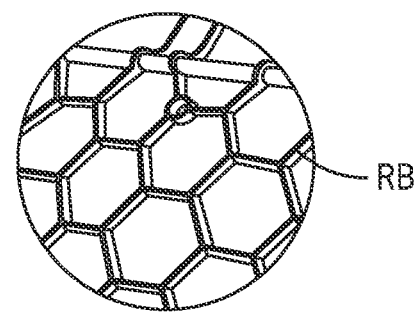
Figure 5A:
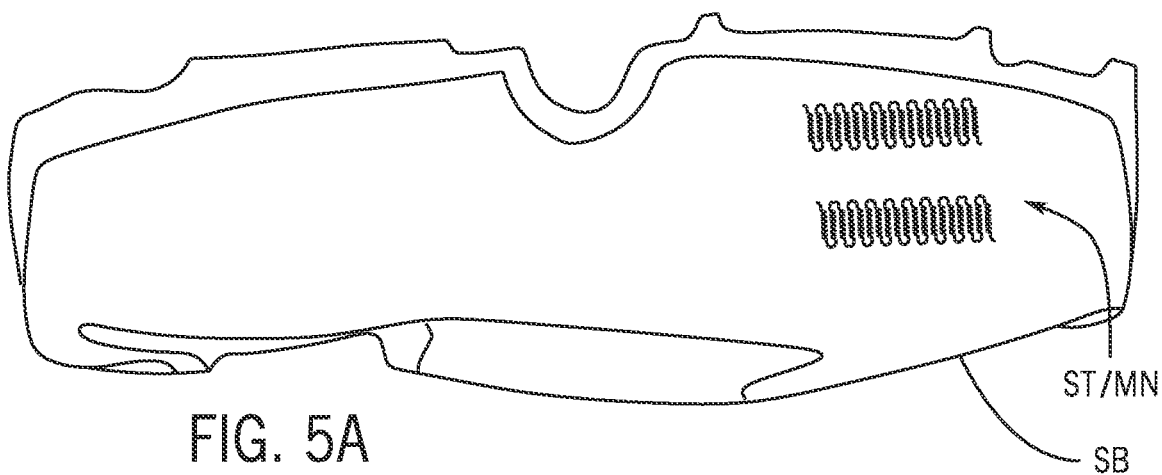
FIG. 5A is a schematic perspective view of a structural substrate according to an exemplary embodiment.
Figure 5B:
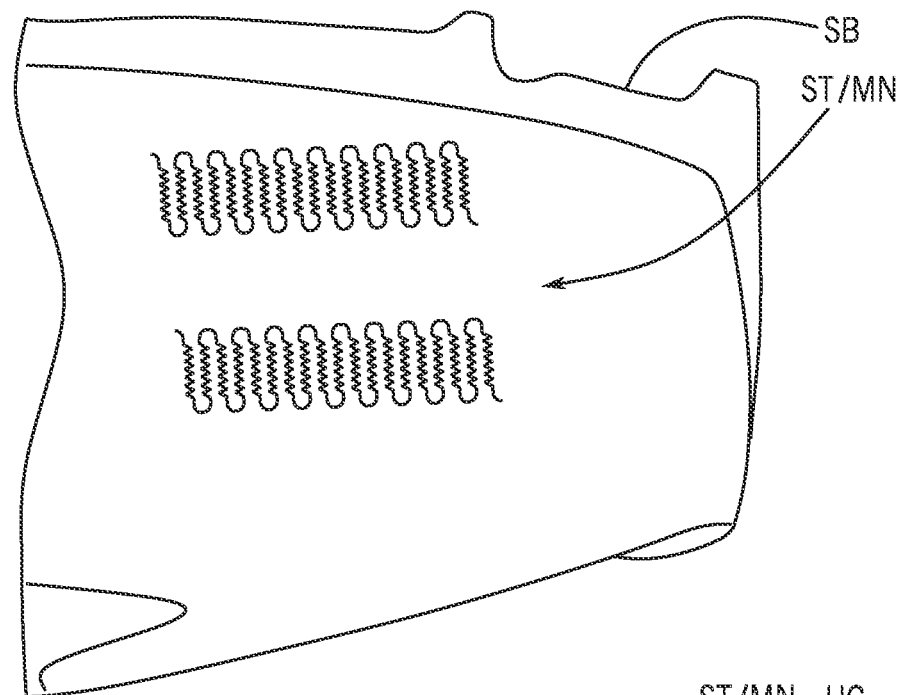
FIG. 5B is a schematic partial perspective view of a structural substrate according to an exemplary embodiment.
Figure 5C:
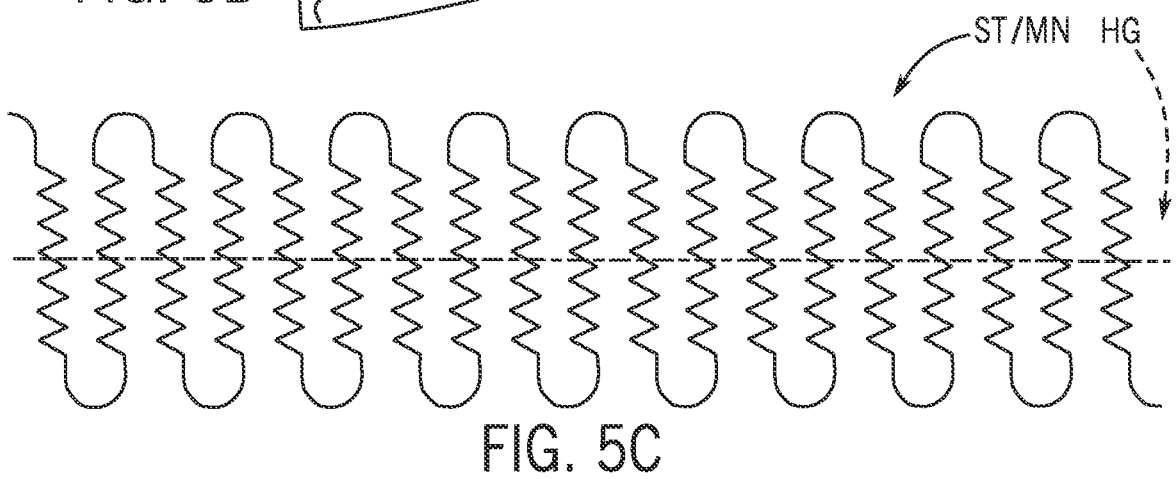
FIG. 5C is a schematic partial plan view of a reinforcement for a structural substrate according to an exemplary embodiment.
Figure 6A:
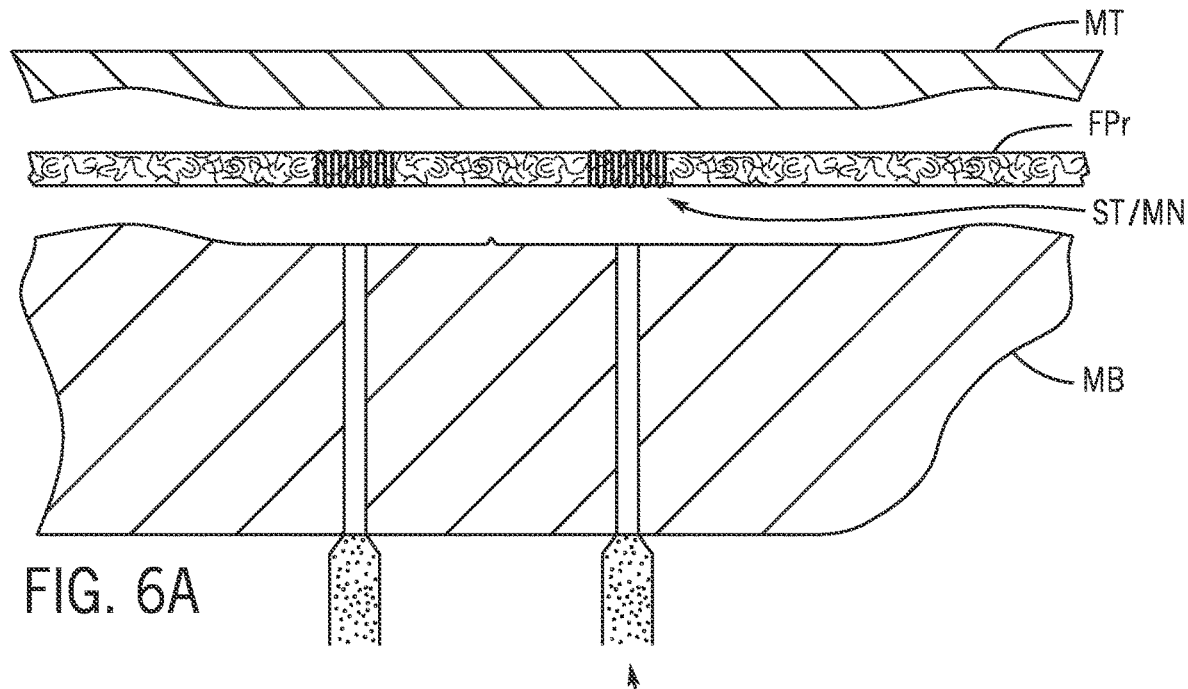
FIGS. 6A through 6C are schematic partial section views of a process to form a structural substrate with an airbag chute from a reinforced fiber panel according to an exemplary embodiment.
Figure 6B:
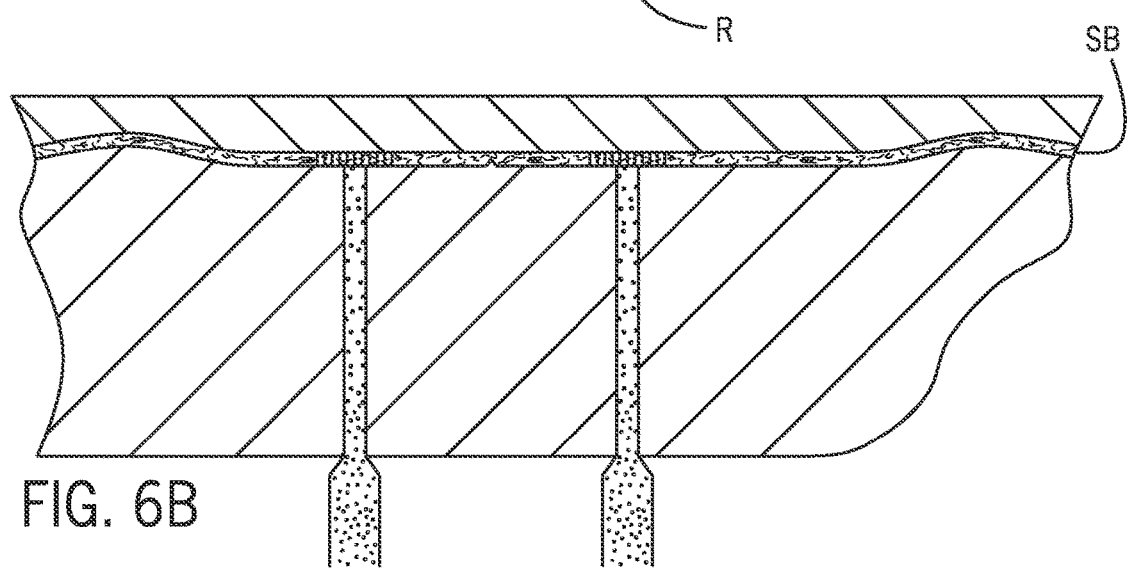
Figure 6C:
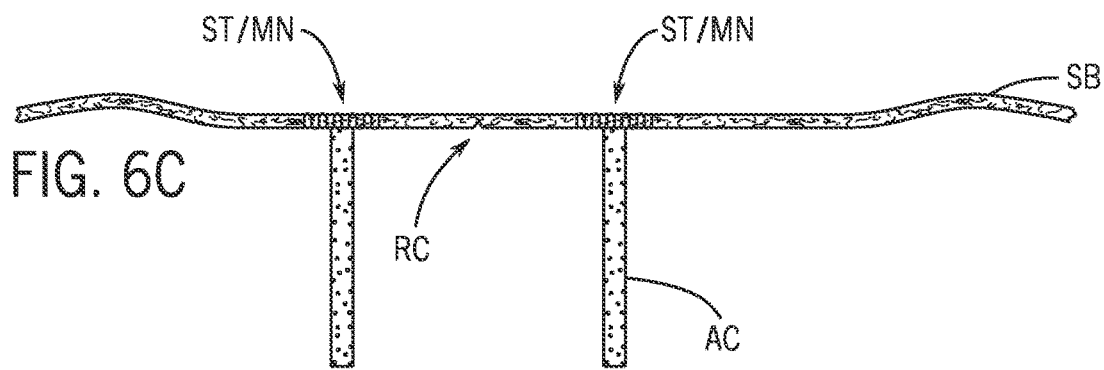
Figure 7A:
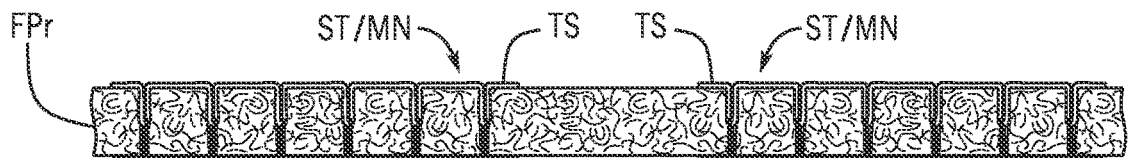
FIGS. 7A through 7E are schematic partial section views of a process to form a vehicle interior component shown as an instrument panel according to an exemplary embodiment.
Figure 7B:
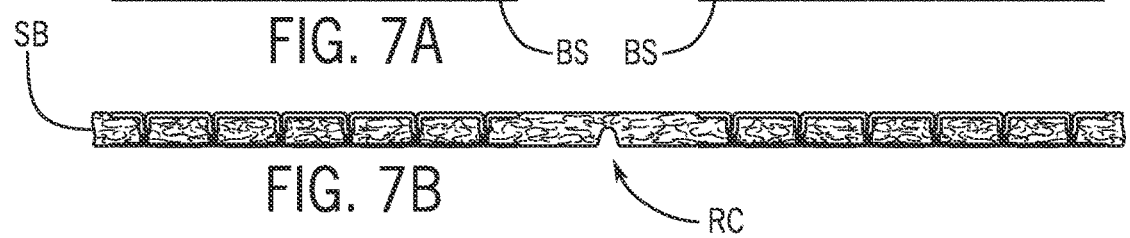
Figure 7C:
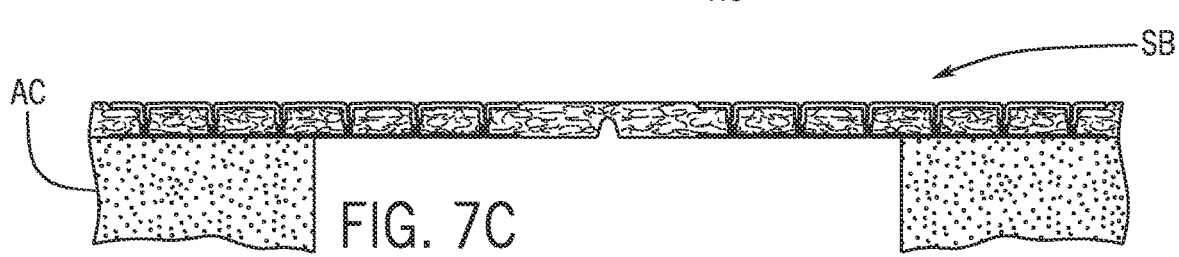
Figure 7D:
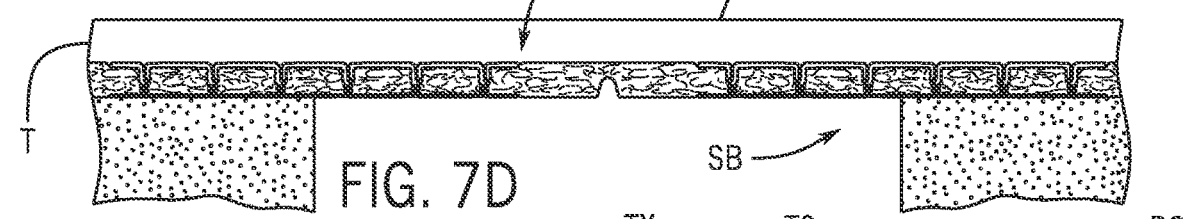
Figure 7E:
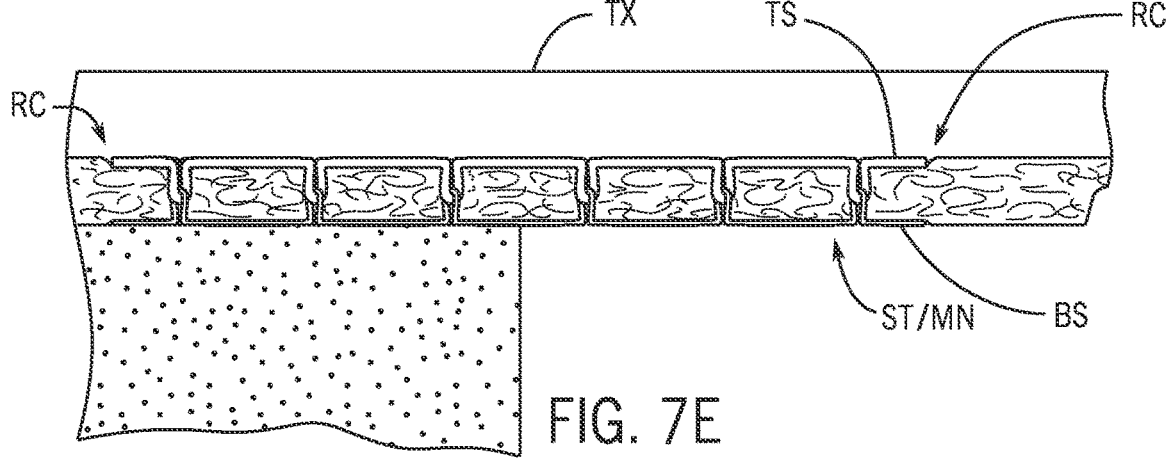
Figure 7F:
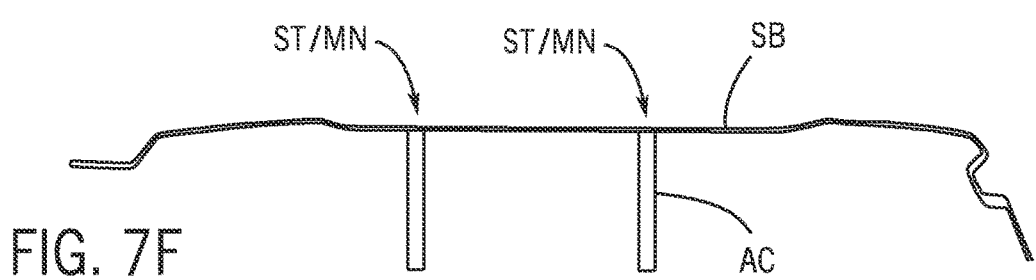
FIG. 7F is a schematic partial section view of a vehicle interior component shown as an instrument panel according to an exemplary embodiment.

According to an exemplary embodiment as shown schematically in FIGS. 4E and 4F, the instrument panel substrate may provide a feature shown as a plastic rib RB on a back side of structural substrate SB to improve structural integrity and rigidity of structural substrate SB. Structural substrate SB may be configured to support an airbag chute AC and an airbag module comprising an airbag. As shown schematically in FIG. 10A, plastic rib RB may comprise a reinforcement to provide structural support; plastic rib RB may comprise a border to provide reinforcement and/or dimensional accuracy for structural substrate SB. According to an exemplary embodiment, plastic rib RB may be placed at any location on structural substrate SB (e.g. along an edge of structural substrate SB, in the middle of structural substrate SB, etc.). According to an exemplary embodiment, multiple plastic ribs RB may be placed at various different locations on structural substrate SB. According to an exemplary embodiment, plastic rib RB may improve structural integrity of the instrument panel substrate. According to an exemplary embodiment, the instrument panel substrate may be able to maintain structural integrity during an airbag deployment; the position/placement of plastic rib RB may be intended to create a strength differential between different areas of the instrument panel substrate; energy needed for an airbag to break through a vehicle interior component C may be directed to recess RC of structural substrate SB; plastic rib RB may prevent or minimize ripping or tearing of structural substrate SB at any location other than at recess RC during an airbag deployment. According to an exemplary embodiment as shown schematically in FIG. 4F, plastic rib RB may form a honeycomb shaped pattern to improve structural integrity and rigidity. According to an exemplary embodiment, plastic rib RB may be formed in any configuration according to a specific application (e.g. ancillary features for attaching air vents, speakers or infotainment system, etc.).

According to an exemplary embodiment as shown schematically in FIGS. 10A-10D, a trim component C for a vehicle interior may be configured to support an airbag chute AC and an airbag module providing an airbag AB configured to be deployed through an opening into the vehicle interior. Trim component C may comprise a structural substrate SB providing a front side, a back side and at least one door established upon deployment of airbag AB to facilitate deployment of airbag AB from the airbag module through the opening. Structural substrate SB may comprise a reinforcement MN configured to secure the door to structural substrate SB during deployment of airbag AB. Reinforcement MN may comprise at least one stitch. Reinforcement MN may be comprised of at least one of (a) KEVLAR, (b) aramid, (c) nylon, (d) polyester, (e) thread, (f) ceramic fibers, (g) polymeric fibers, (h) synthetic fibers. Structural substrate SB may comprise a panel FP comprised at least partially of fibers. Reinforcement MN may be comprised of thread sewn to panel FP. Structural substrate SB may comprise a compression-formed component. Compression-formed component SB may comprise a recess RC in the back side of structural substrate SB configured to establish the opening so that airbag AB will deploy through compression-formed component SB at the opening. Structural substrate SB may be formed at least partially from fibers. Trim component C may comprise a cover T to provide a surface on the front side of structural substrate SB. Contact between airbag AB and the door may induce tearing of cover T to establish the opening for the airbag and may facilitate deployment of airbag AB through the opening.

According to an exemplary embodiment as shown schematically in FIGS. 3A-3F, 4A-4F and 10A-10D, a trim component C for a vehicle interior configured to support an airbag module providing an airbag AB for deployment through an opening into the vehicle interior may be prepared using a mold M by a process. The process may comprise the steps of providing a fiber panel FP, joining a reinforcement MN to fiber panel FP in at least one hinge area to form a reinforced fiber panel FPr, disposing reinforced fiber panel FPr onto a first surface of mold M, compressing reinforced fiber panel FPr between the first surface and a second surface of mold M to form reinforced fiber panel FPr into a structural substrate SB having a shape and attaching a structure AC on a side of structural substrate SB. The shape may correspond to a first contour of the first surface and a second contour of the second surface. Structural substrate SB may be configured to provide at least one door established upon deployment of airbag AB to facilitate deployment of airbag AB from the airbag module through the opening. Structure AC may be configured to support the airbag module and to direct airbag AB toward structural substrate SB to establish the opening and the door during deployment of airbag AB. Reinforcement MN may be configured to secure the door to structural substrate SB during deployment of airbag AB. Joining reinforcement MN to fiber panel FP may comprise sewing at least one of a thread; a stitch to fiber panel FP. The at least one of the thread; the stitch may be comprised of at least one of (a) KEVLAR, (b) aramid, (c) nylon, (d) polyester, (e) ceramic fibers, (f) polymeric fibers, (g) synthetic fibers. Attaching structure AC on a side of structural substrate SB may comprise injecting resin into mold M. The process may comprise the step of forming a recess RC in a surface of at least one of fiber panel FP; reinforced fiber panel FPr; recess RC may be configured to facilitate deployment of airbag AB.

According to an exemplary embodiment as shown schematically in FIGS. 3A-3F, 4A-4F and 10A-10D, a method of manufacturing a vehicle trim component C configured to support an airbag module providing an airbag AB for deployment from the airbag module through an opening into the vehicle interior may comprise the steps of providing a fiber panel FP, joining a reinforcement MN to fiber panel FP in at least one hinge area to form a reinforced fiber panel FPr, disposing reinforced fiber panel FPr onto a first surface of a mold M, compressing reinforced fiber panel FPr between a first surface and a second surface of the mold to form reinforced fiber panel FPr into a structural substrate SB having a shape and attaching a structure AC on a side of the structural substrate. The shape may correspond to a first contour of the first surface and a second contour of the second surface. Structural substrate SB may be configured to provide at least one door established upon deployment of the airbag from the airbag module through the opening. Structure AC may be configured to support the airbag module and may direct airbag AB toward structural substrate SB to establish the opening and the door during deployment of airbag AB. Reinforcement MN may be configured to secure the door to structural substrate SB during deployment of the airbag.

Exemplary Embodiments—D

Referring to FIGS. 1A-1B and 13A-13B, a vehicle V is shown including an interior I with vehicle interior components shown as trim components such as an instrument panel IP, doors DP and a floor console FC; according to an exemplary embodiment, components of vehicle V such as instrument panel IP and doors DP may include trim components/panels comprised of fiber and plastic. According to an exemplary embodiment as shown schematically in FIGS. 13A-13B, trim components such as instrument panel IP and doors may provide visible surfaces in the vehicle interior of vehicle V. According to an exemplary embodiment, vehicle interior/trim components such as instrument panel IP and/or doors may provide at least one moveable panel/door D and a hinge area HG with living hinge for the panel/door. See FIGS. 13A-13B, 14A-14B and 18A-18B.

According to an exemplary embodiment as shown schematically in FIGS. 13A-13B, instrument panel IP may provide a panel/door D and a living hinge HG at a hinge area HG for the panel/door D; the living hinge HG (e.g. a line, score line, cut, notch, groove, discontinuity, interruption, etc.) may be configured to facilitate rotation of the panel/door. According to an exemplary embodiment, instrument panel IP may comprise a base B and a reinforcement MN to secure the panel/door D at the living hinge HG for movement relative to the base. See FIGS. 14A-14B and 18A-18B.

Figure 15A:
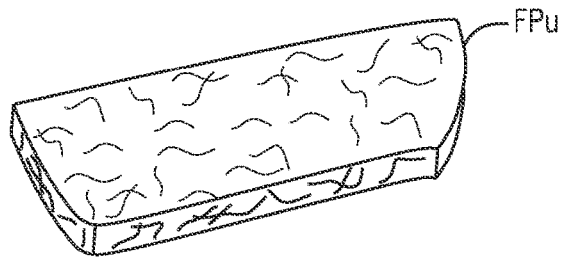
FIGS. 15A through 15F are schematic perspective views of a process to form a reinforced fiber panel according to an exemplary embodiment.
Figure 15B:
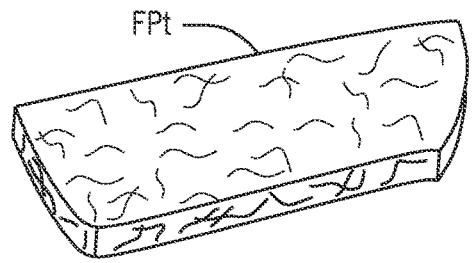
Figure 15C:
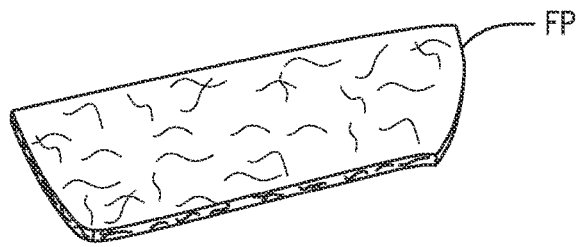
Figure 15D:
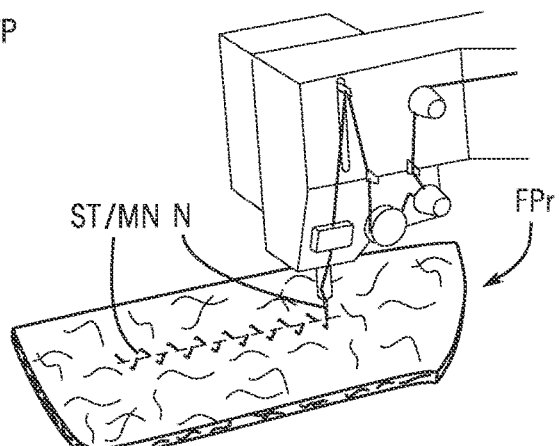
Figure 15E:
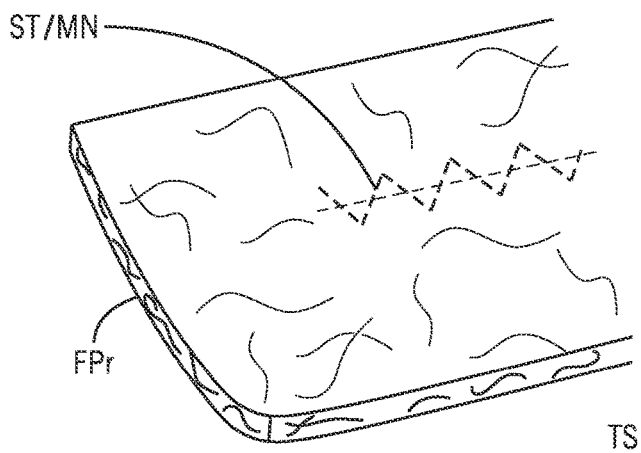
Figure 15F:
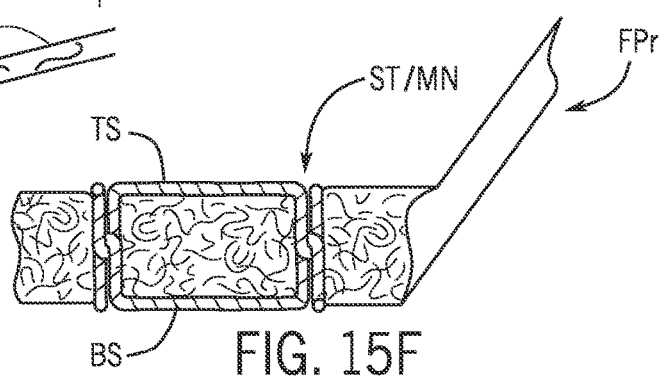
Figure 17A:
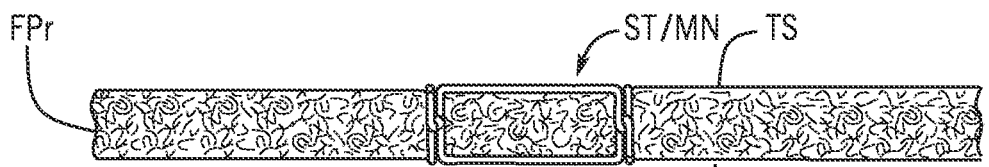
FIGS. 17A through 17E are schematic partial section views of a process to form a vehicle interior component according to an exemplary embodiment.
Figure 17B:
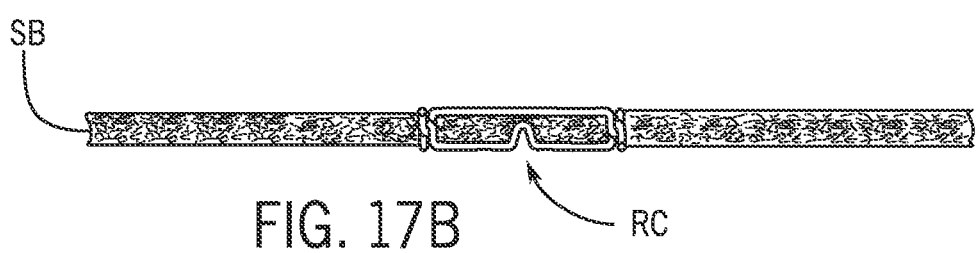
Figure 17C:
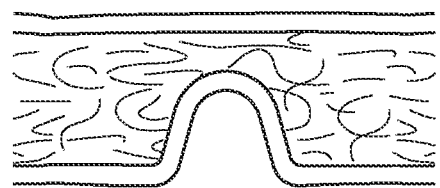
Figure 17D:
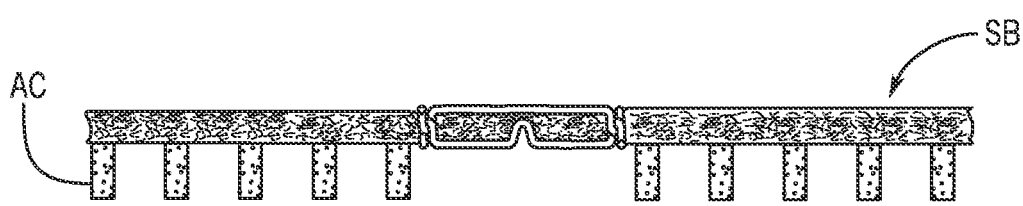
Figure 17E:
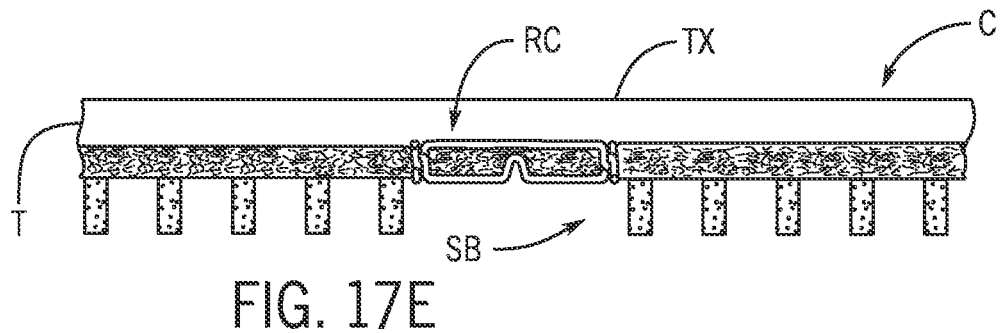
Figure 18A:
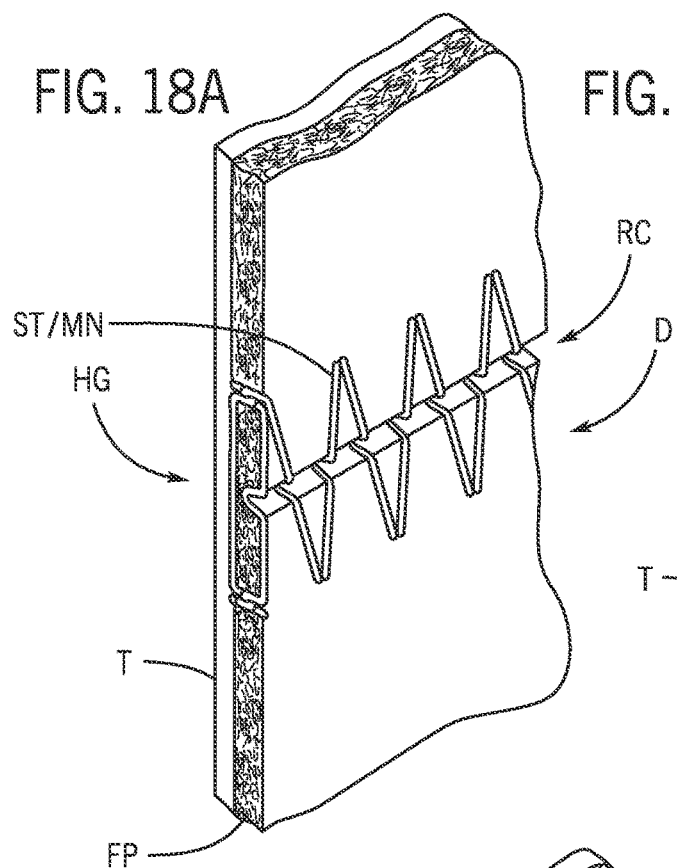
FIGS. 18A through 18D are schematic cutaway perspective views of a vehicle interior component according to an exemplary embodiment.
Figure 18B:
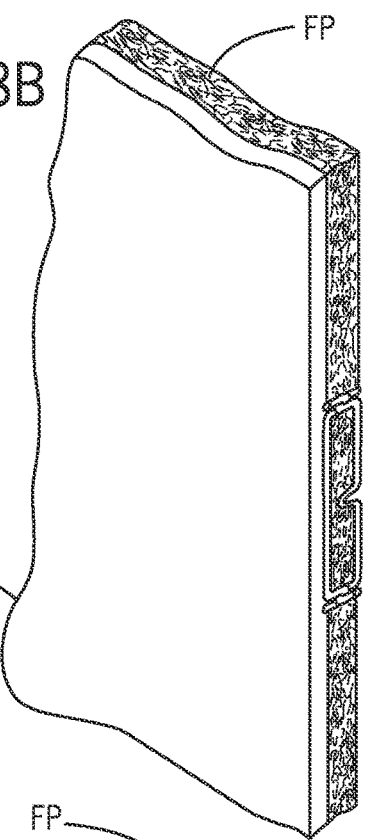
Figure 18C:
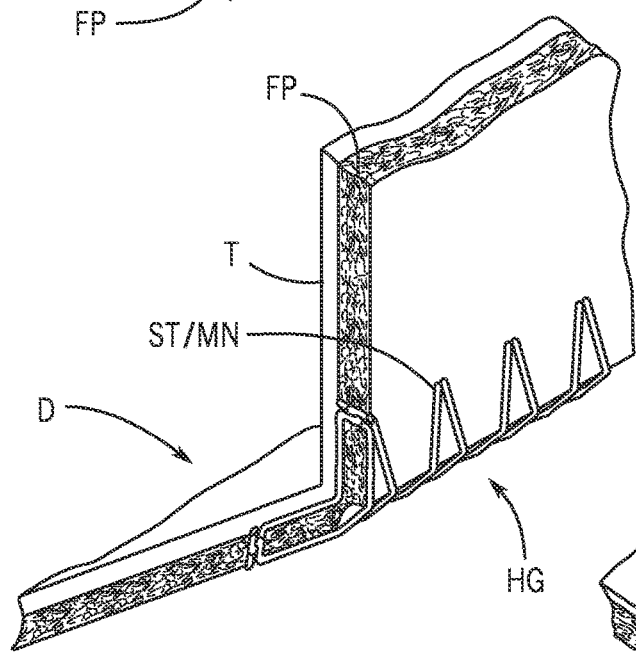
Figure 18D:
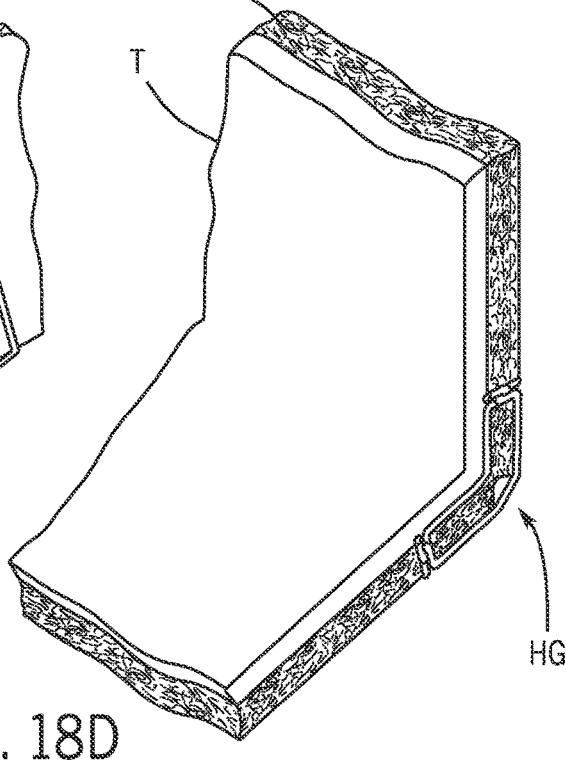
Figure 19:
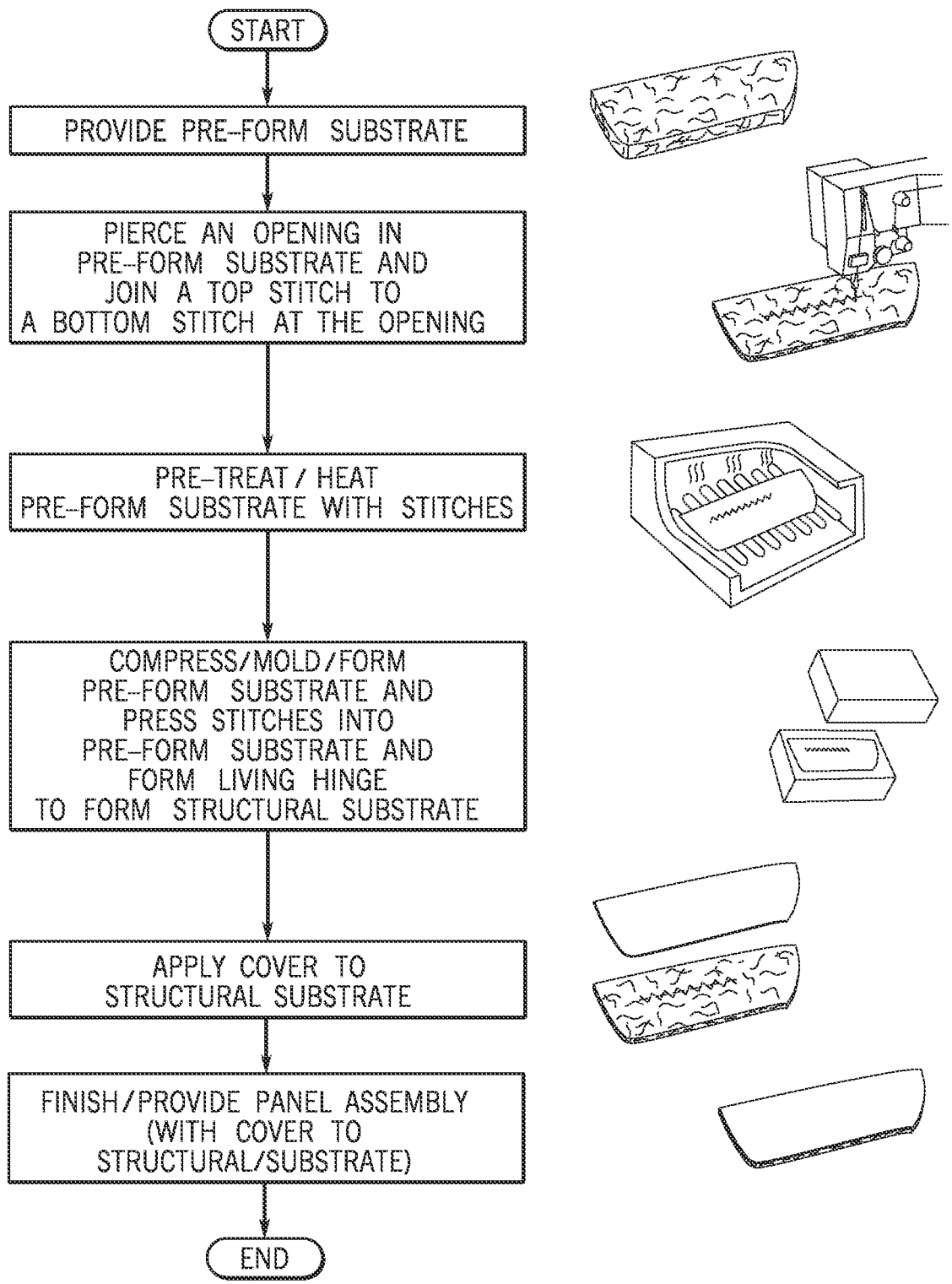
FIGS. 19 and 20 are schematic flow diagrams of a method for forming a vehicle interior component according to an exemplary embodiment.
Figure 20:
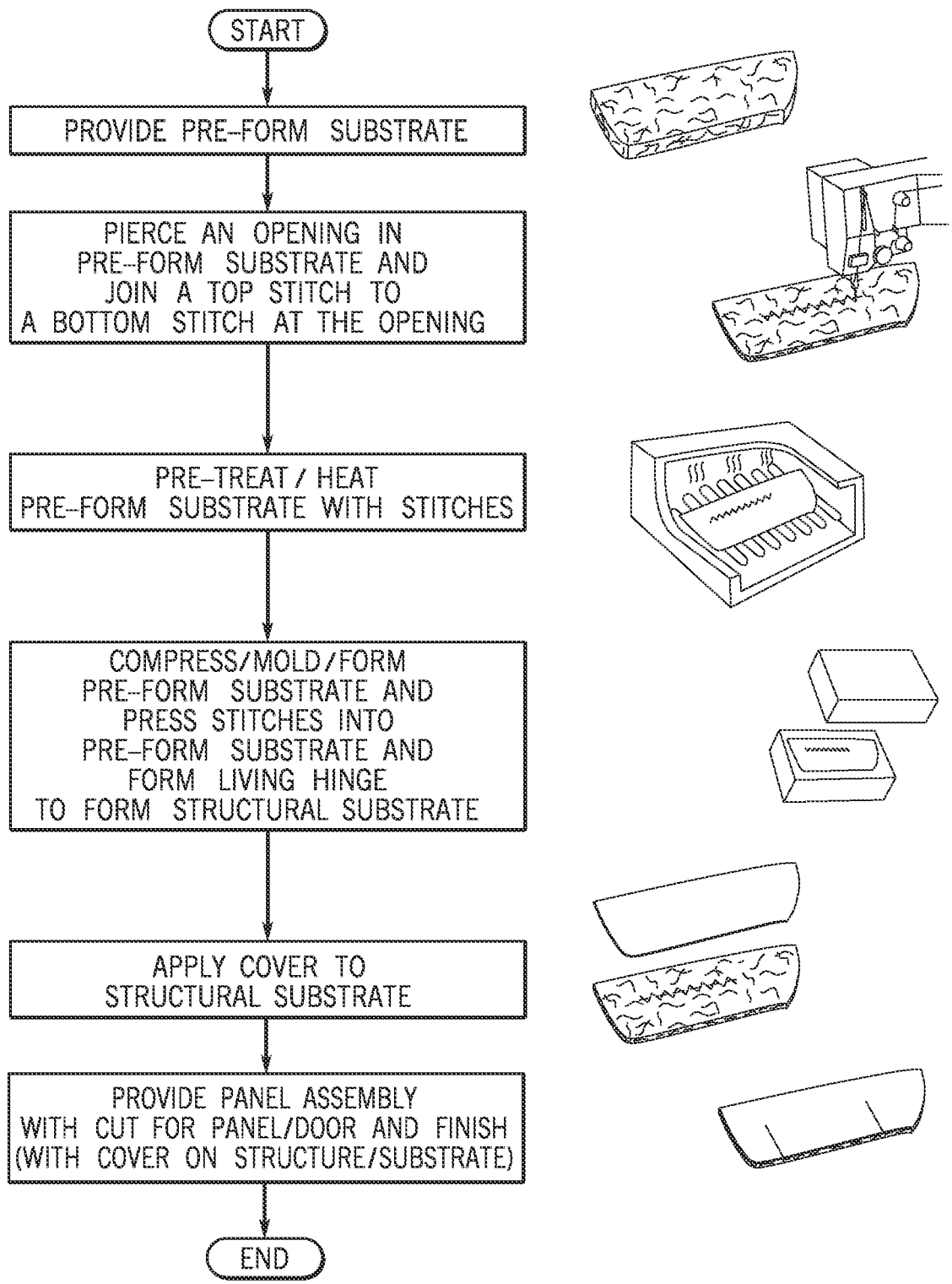
Figure 21:
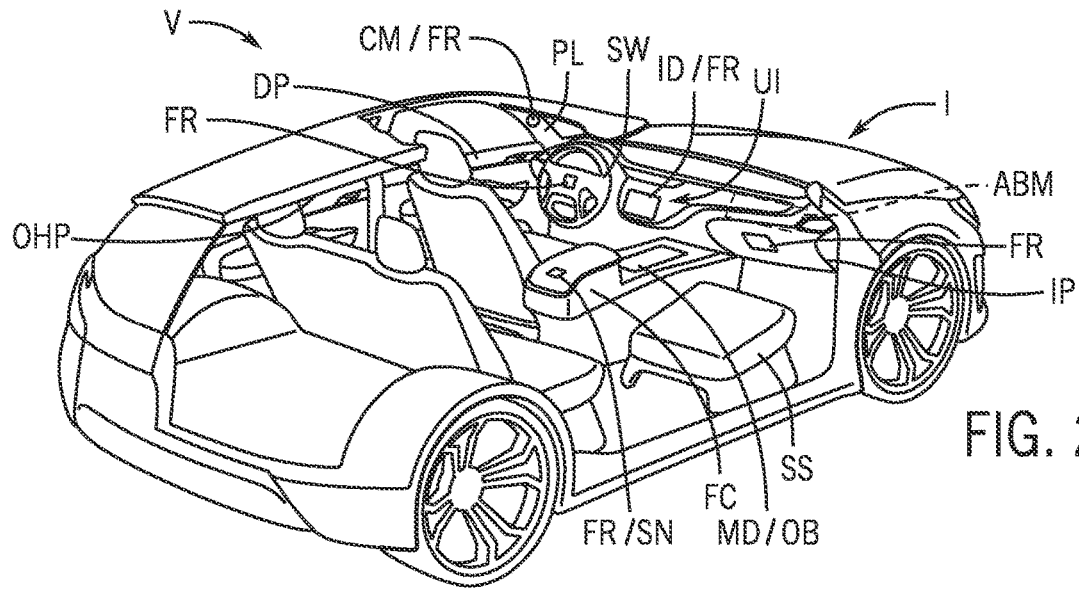
FIG. 21 is a schematic perspective cut-away view of a vehicle showing a vehicle interior according to an exemplary embodiment.
Figure 22:
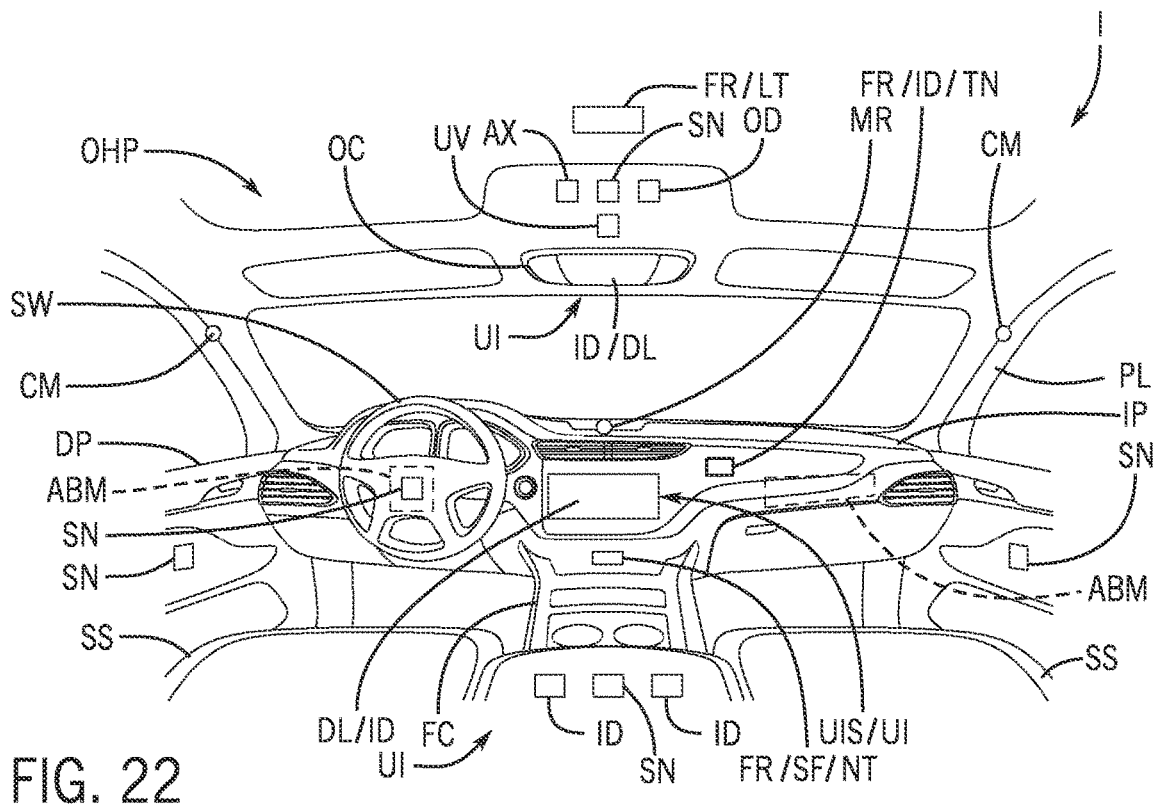
FIG. 22 is a schematic perspective cut-away view of a vehicle interior according to an exemplary embodiment.
Figure 23:
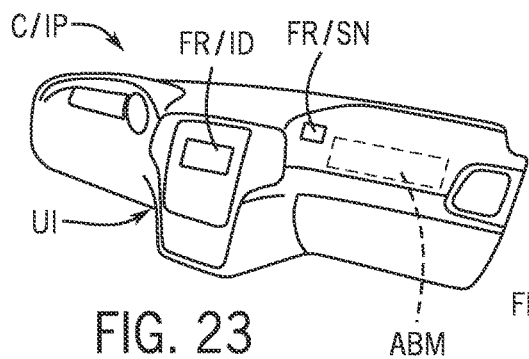
FIG. 23 is a schematic perspective view of a component comprising a panel with a functional circuit according to an exemplary embodiment.
Figure 24:
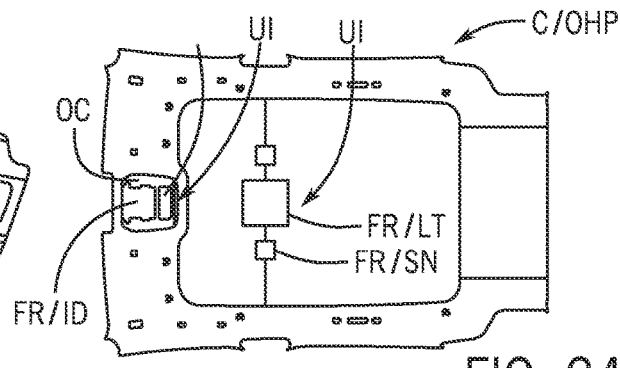
FIG. 24 is a schematic plan view of a component comprising a panel with a functional circuit according to an exemplary embodiment.
Figure 25:
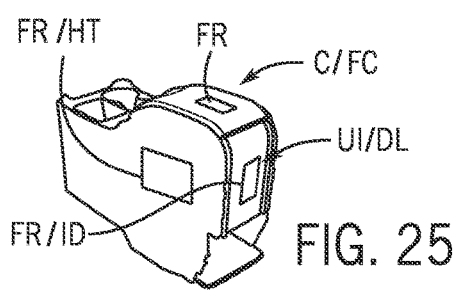
FIG. 25 is a schematic perspective view of a component comprising a panel with a functional circuit according to an exemplary embodiment.
Figure 26:
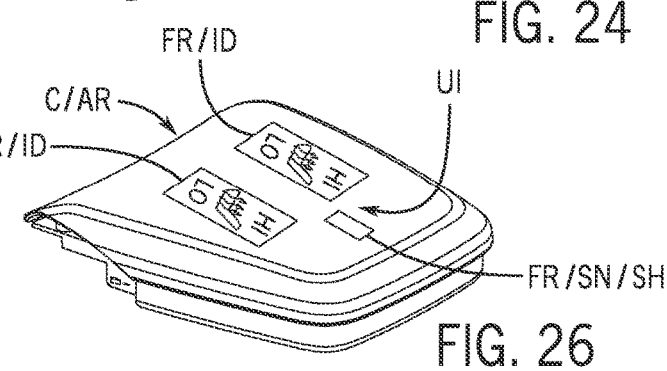
FIG. 26 is a schematic perspective view of a component comprising a panel with a functional circuit according to an exemplary embodiment.
Figure 27:
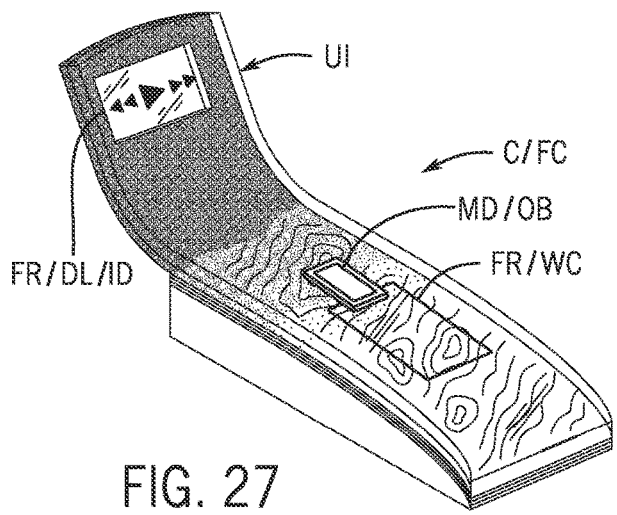
FIG. 27 is a schematic perspective view of a component comprising a panel with a functional circuit according to an exemplary embodiment.
Figure 28:
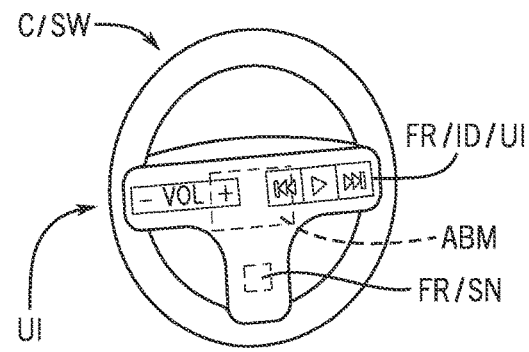
FIG. 28 is a schematic perspective view of a component comprising a panel with a functional circuit according to an exemplary embodiment.
Figure 29:
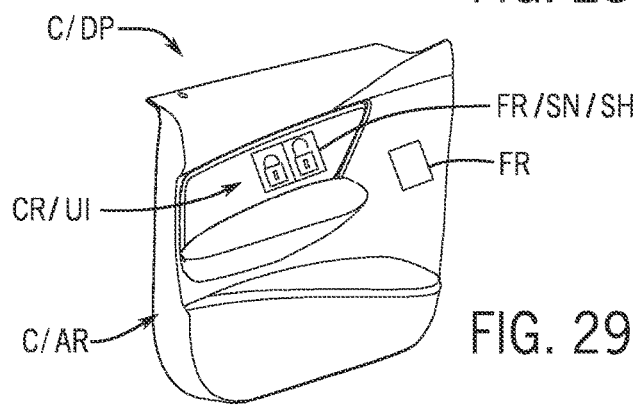
FIG. 29 is a schematic perspective view of a component comprising a panel with a functional circuit according to an exemplary embodiment.
Figure 33A:
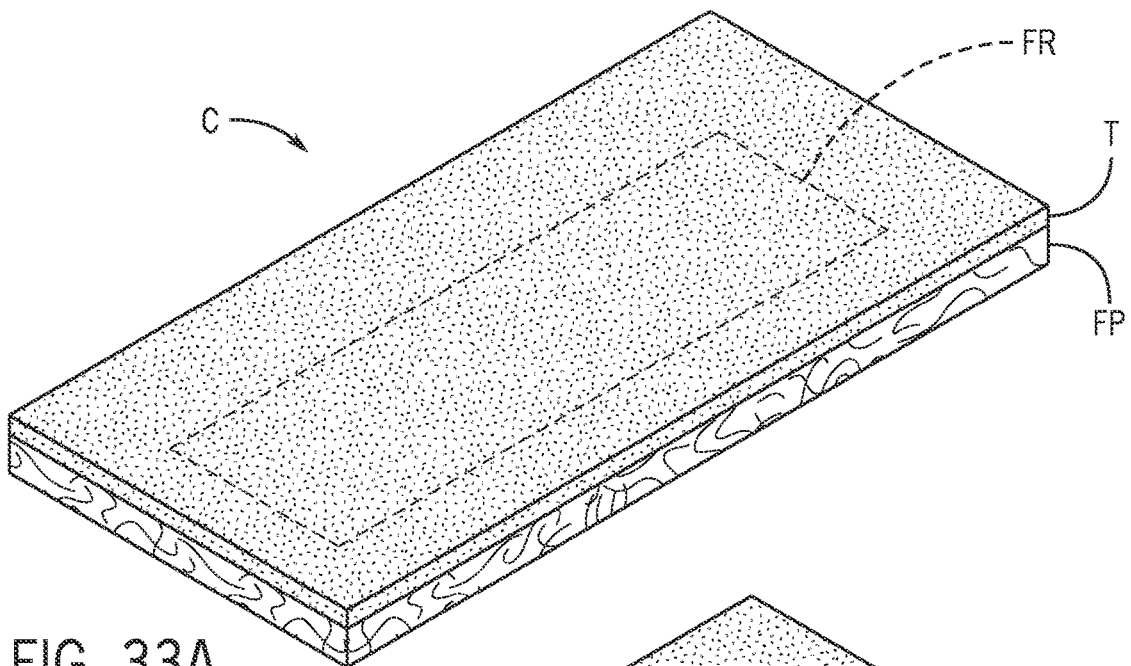
FIG. 33A is a schematic perspective view of a component comprising a panel with a functional circuit according to an exemplary embodiment.
Figure 33B:
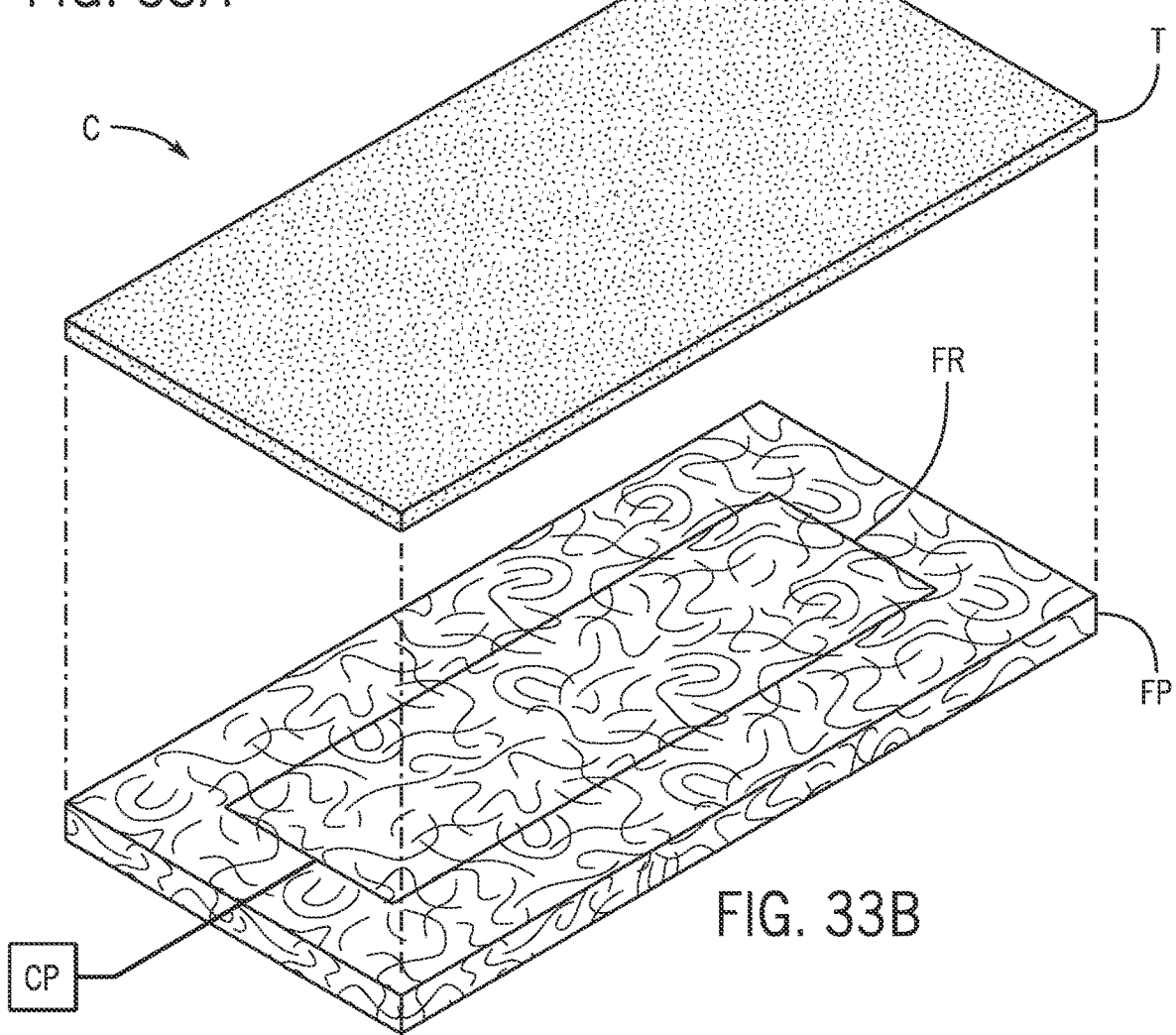
FIG. 33B is a schematic exploded perspective view of a component comprising a panel with a functional circuit according to an exemplary embodiment.
Figure 34A:
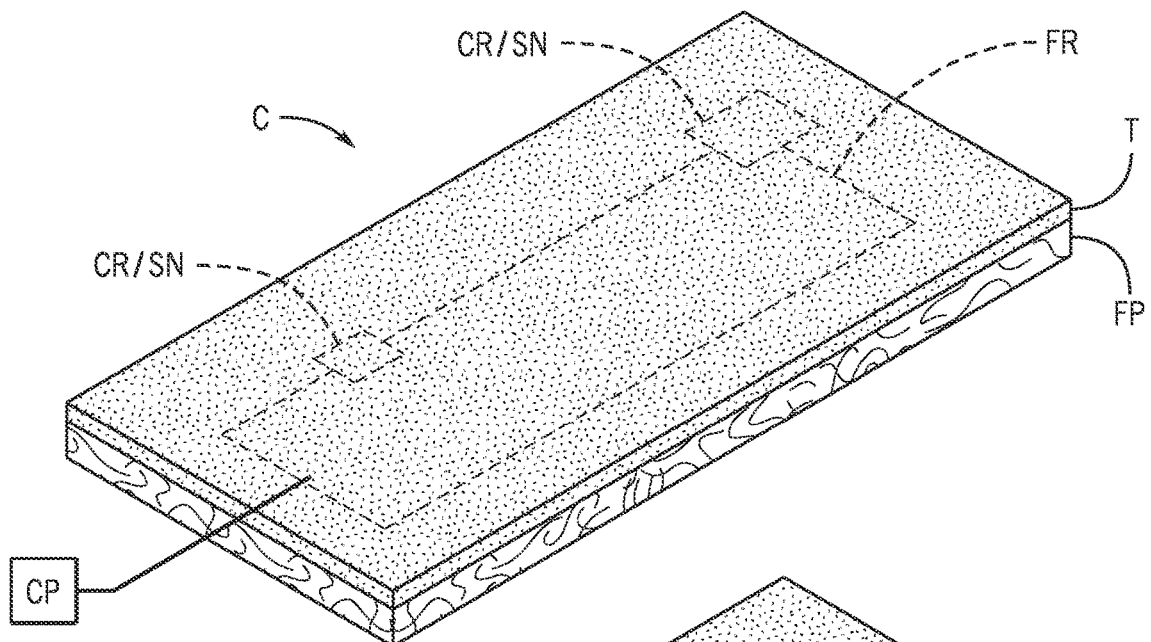
FIG. 34A is a schematic perspective view of a component comprising a panel with a functional circuit according to an exemplary embodiment.
Figure 34B:
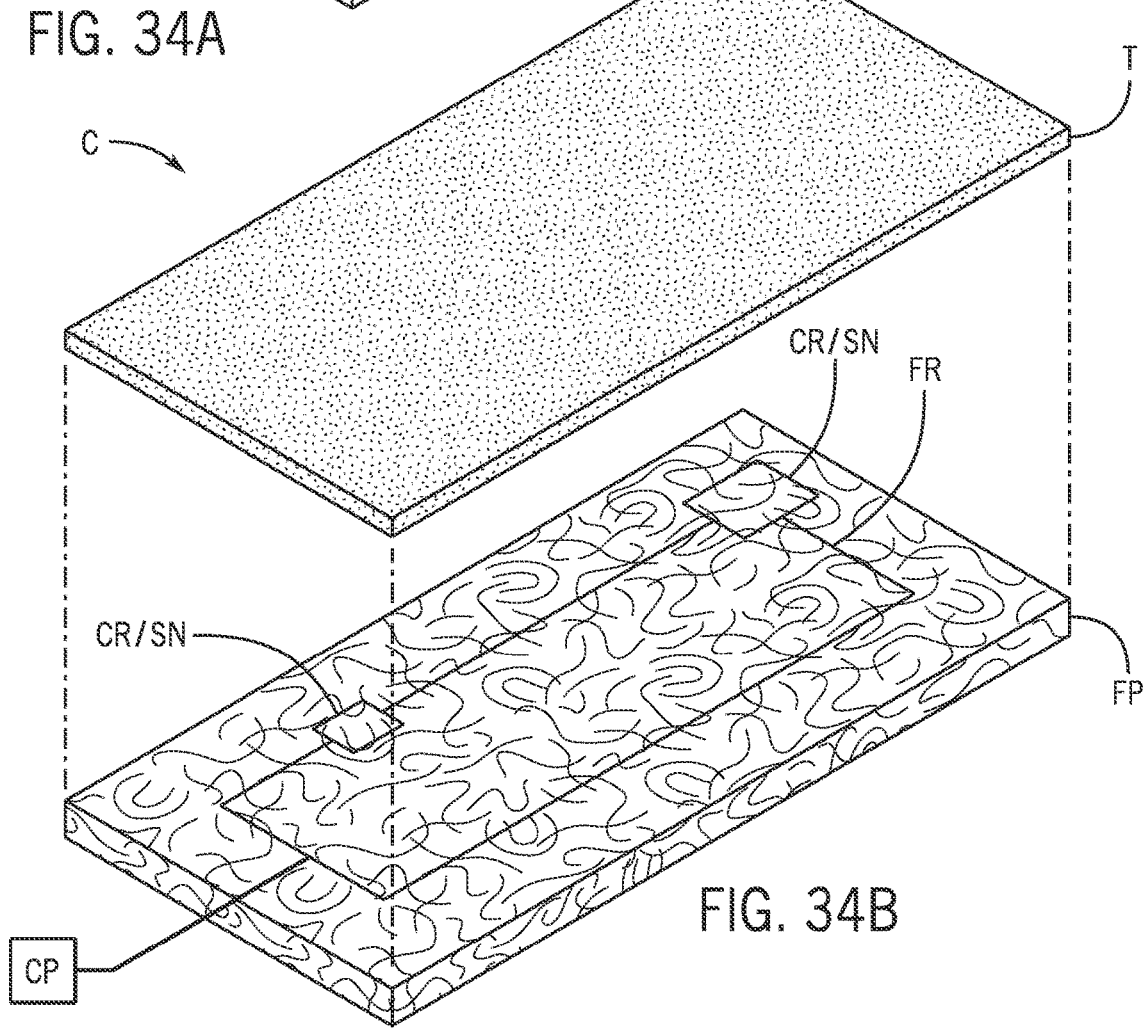
FIG. 34B is a schematic exploded perspective view of a component comprising a panel with a functional circuit according to an exemplary embodiment.
Figure 37A:
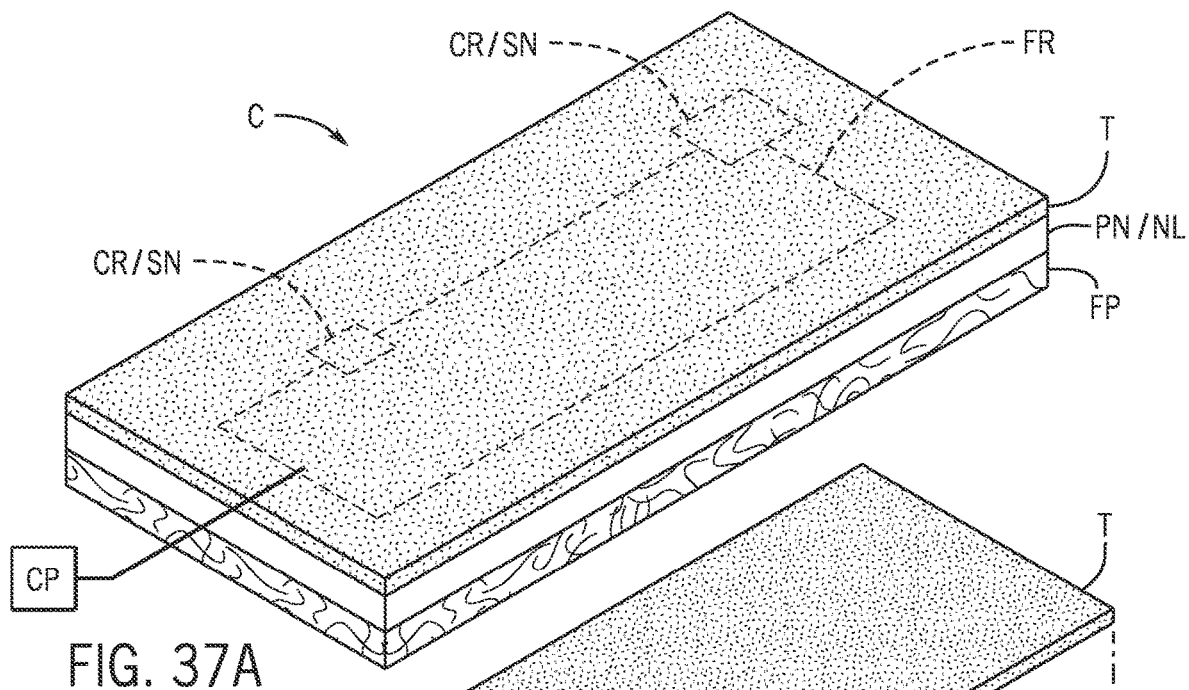
FIG. 37A is a schematic perspective view of a component comprising a panel with a functional circuit according to an exemplary embodiment.
Figure 37B:
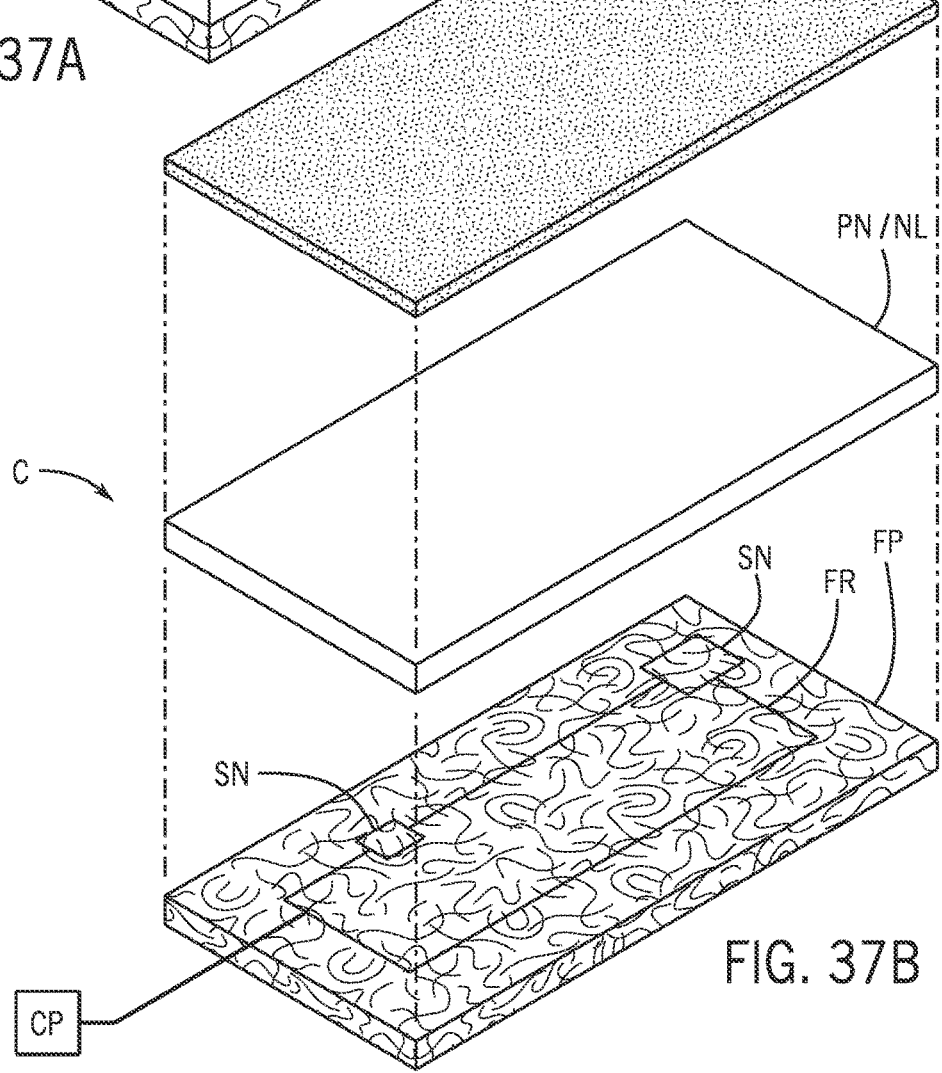
FIG. 37B is a schematic exploded perspective view of a component comprising a panel with a functional circuit according to an exemplary embodiment.
Figure 39:
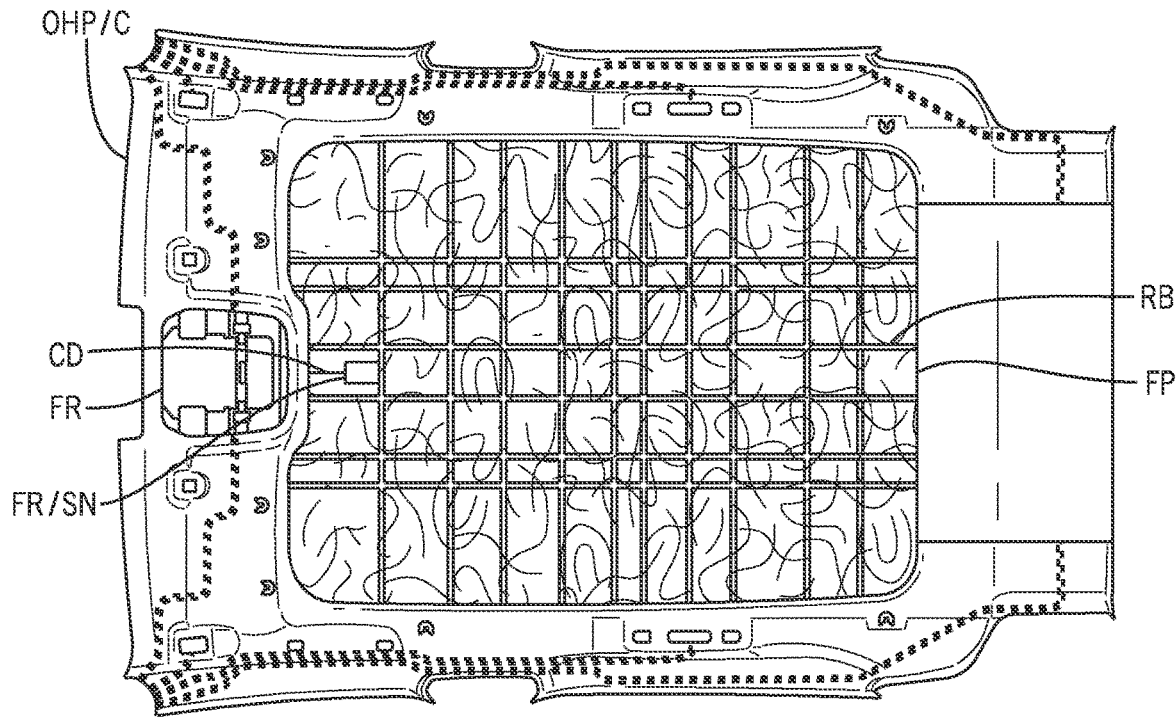
FIG. 39 is a schematic plan view of a component comprising a panel with a functional circuit according to an exemplary embodiment.
Figure 40:
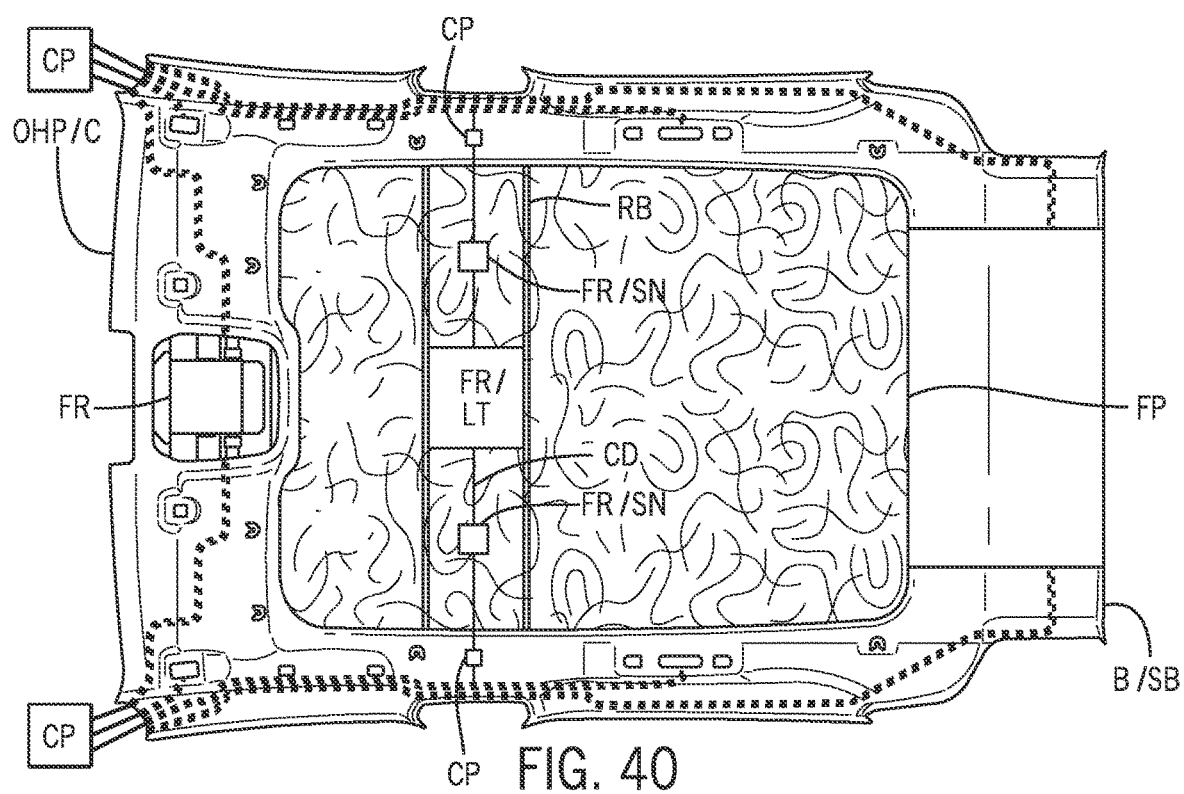
FIG. 40 is a schematic plan view of a component comprising a panel with a functional circuit according to an exemplary embodiment.
Figure 41A:
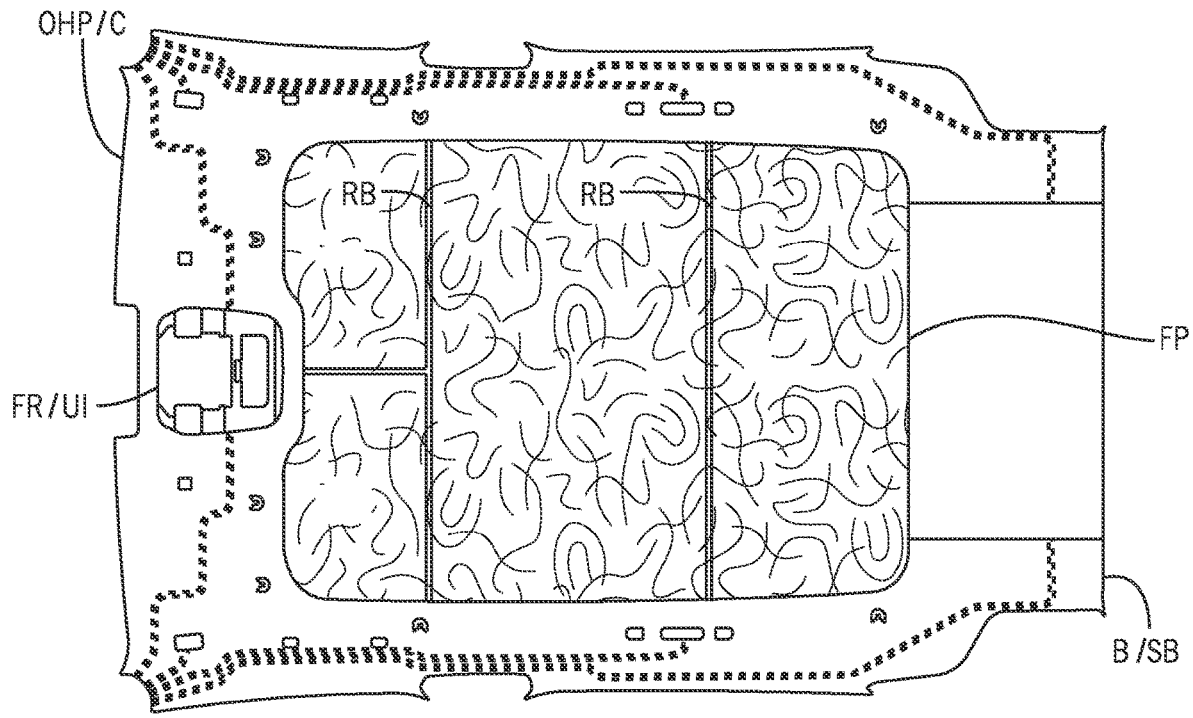
FIG. 41A is a schematic plan view of a component comprising a panel with a functional circuit according to an exemplary embodiment.
Figure 41B:
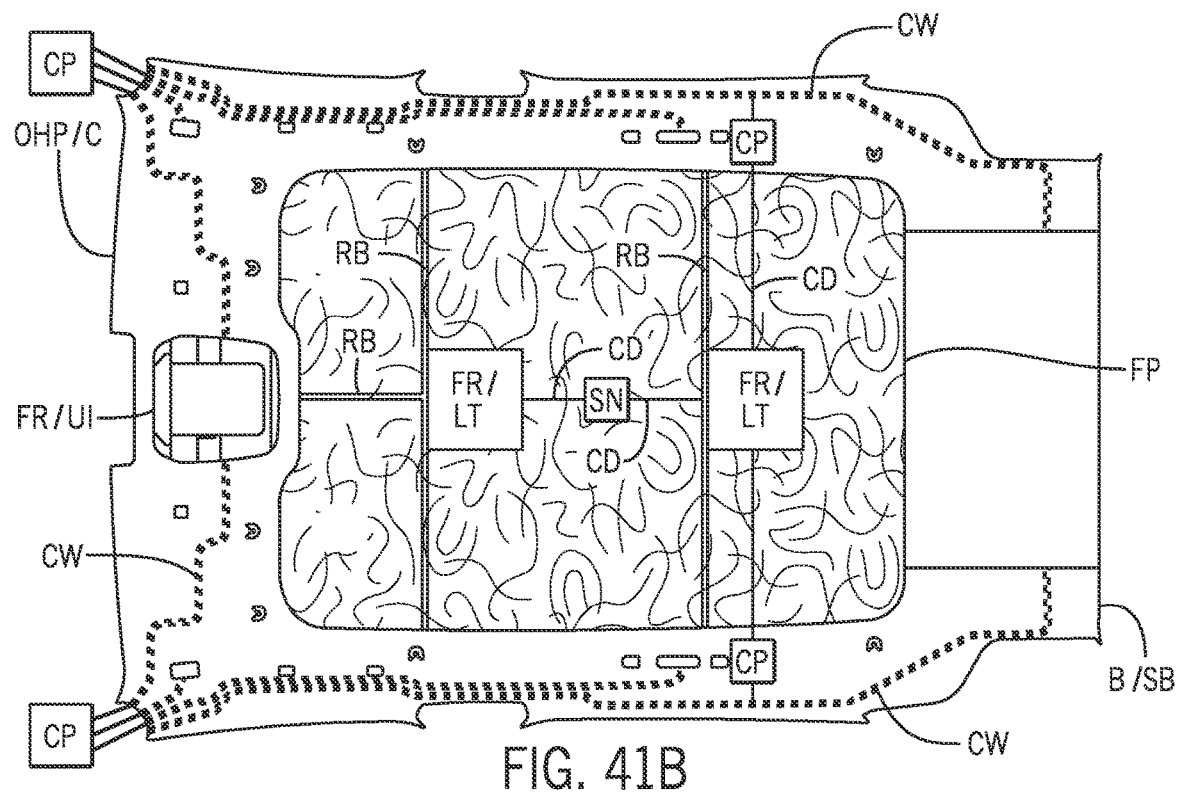
FIG. 41B is a schematic plan view of a component comprising a panel with a functional circuit according to an exemplary embodiment.
Figure 42A:
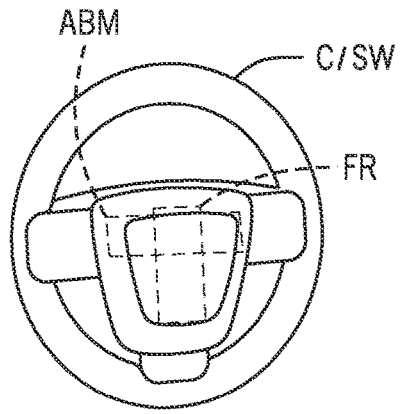
FIG. 42A is a schematic perspective view of a component comprising a panel with a functional circuit according to an exemplary embodiment.
Figure 42B:
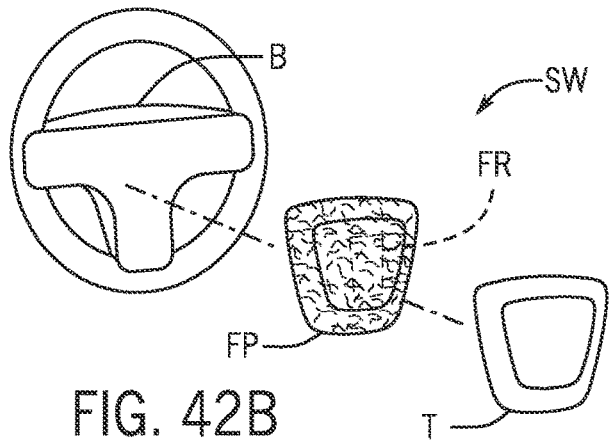
FIG. 42B is a schematic exploded perspective view of a component comprising a panel with a functional circuit according to an exemplary embodiment.
Figure 42C:
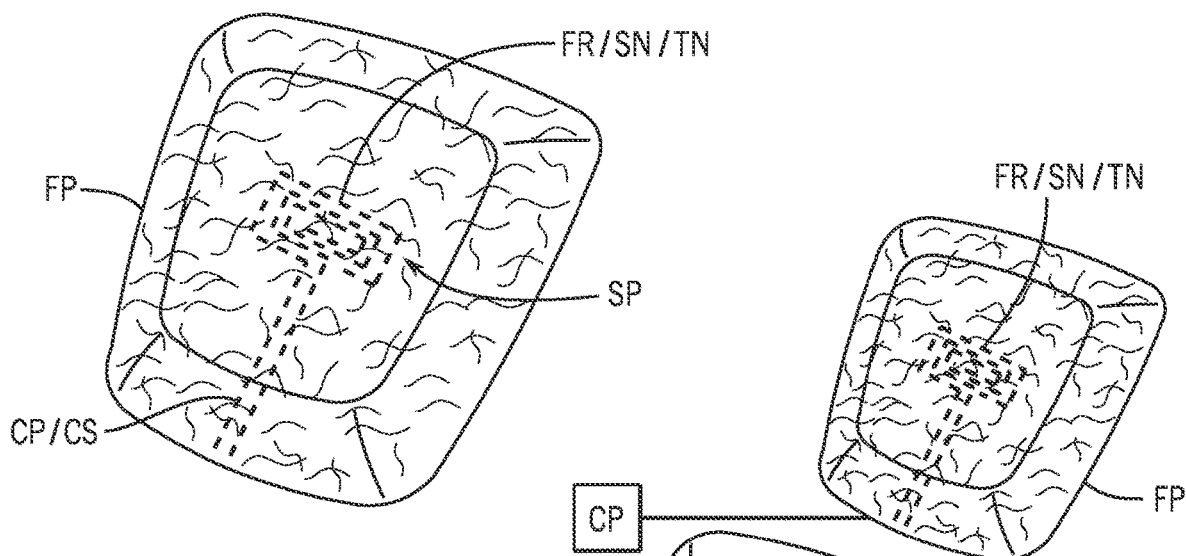
FIG. 42C is a schematic perspective view of a component comprising a panel with a functional circuit according to an exemplary embodiment.
Figure 42D:
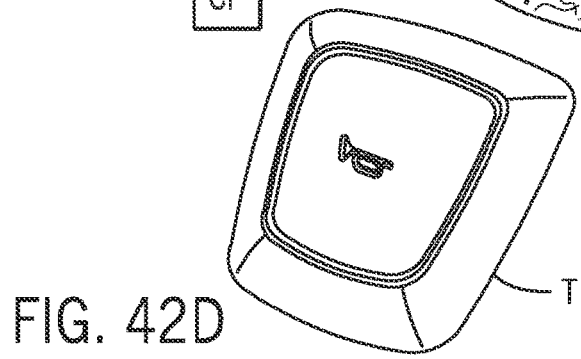
FIG. 42D is a schematic exploded perspective view of a component comprising a panel with a functional circuit according to an exemplary embodiment.

According to an exemplary embodiment as shown schematically in FIG. 15A, a fiber mat FPu may comprise a combination of fibers (e.g. natural and/or synthetic fibers) and thermoplastic resin (e.g. polypropylene (PP), acrylonitrile butadiene styrene (ABS), polycarbonate (PC), etc.). According to an exemplary embodiment as shown schematically in FIG. 15B, fiber mat FPu may be trimmed into a fiber mat FPt having a thickness. According to an exemplary embodiment, fiber mat FPt may be heated to induce the thermoplastic resin to liquefy. According to an exemplary embodiment as shown schematically in FIG. 15C, heated fiber mat FPt may be partially compressed into a fiber panel FP having a thickness less than the thickness of fiber mat FPt. According to an exemplary embodiment as shown schematically in FIGS. 15D through 15F, a reinforcement MN comprising at least one of (a) KEVLAR, (b) aramid, (c) nylon, (d) polyester, (e) thread, (f) ceramic fibers, (g) polymeric fibers, (h) synthetic fibers, (i) a stitch may be sewn to fiber panel FP to form reinforced fiber panel FPr.

According to an exemplary embodiment as shown schematically in FIGS. 15A-15F, 16A-16E, 19 and 20, a method of manufacturing a vehicle trim component C may comprise the steps of providing a fiber panel FP, joining a reinforcement MN to fiber panel FP in at least one hinge area to form a reinforced fiber panel FPr, disposing reinforced fiber panel FPr onto a first surface of a mold M, compressing reinforced fiber panel FPr between a first surface and a second surface of the mold to form reinforced fiber panel FPr into a structural substrate SB having a shape and attaching a structure AC on a side of the structural substrate. The shape may correspond to a first contour of the first surface and a second contour of the second surface. Structural substrate SB may be configured to provide at least one panel/door. Reinforcement MN may be configured to secure the panel/door to structural substrate SB.

According to an exemplary embodiment as shown schematically in FIG. 16A, reinforced fiber panel FPr may be heated in an oven OV. As shown schematically in FIG. 16B, heated reinforced fiber panel FPr may be transferred into a mold having a mold top MT and mold bottom MB. According to an exemplary embodiment as shown schematically in FIGS. 16C and 16D, a component shown as an instrument panel substrate may be produced by a process of compression forming heated reinforced fiber panel FPr into a structural substrate SB and injection molding resin onto compression formed heated reinforced fiber panel FPr. A recess RC of structural substrate SB may be formed in the process. Recess RC may be configured to provide a living hinge for a door of structural substrate SB. Reinforcement MN may be configured to secure the door to structural substrate SB during movement (e.g. opening and/or closing) of the door.

According to an exemplary embodiment as shown schematically in FIG. 16E, the instrument panel substrate may provide a feature shown as a plastic rib RB on a back side of structural substrate SB to improve structural integrity and rigidity of structural substrate SB. Plastic rib RB may comprise a reinforcement to provide structural support. Plastic rib RB may comprise a border to provide reinforcement and/or dimensional accuracy for structural substrate SB. According to an exemplary embodiment, plastic rib RB may be placed at any location on structural substrate SB (e.g. along an edge of structural substrate SB, in the middle of structural substrate SB, etc.). According to an exemplary embodiment, multiple plastic ribs RB may be placed at various different locations on structural substrate SB. According to an exemplary embodiment, plastic rib RB may improve structural integrity of the instrument panel substrate. According to an exemplary embodiment as shown schematically in FIG. 16E, plastic rib RB may form a honeycomb shaped pattern to improve structural integrity and rigidity. According to an exemplary embodiment, plastic rib RB may be formed in any configuration according to a specific application (e.g. ancillary features for attaching air vents, speakers or infotainment system, etc.).

According to an exemplary embodiment as shown schematically in FIGS. 13A-13B, 14A-14B, 15A-15F, 16A-16E, 17A-17E, 18A-18D, 19 and 20, a trim component for a vehicle interior may comprise a structural substrate providing at least one panel/door. The structural substrate may comprise a reinforcement configured to secure the at least one panel/door to the structural substrate. The reinforcement may comprise a top stitch and a bottom stitch. The reinforcement may be comprised of bonded nylon thread. The reinforcement may be comprised of at least one of (a) KEVLAR, (b) aramid, (c) nylon, (d) polyester, (e) thread, (f) ceramic fibers, (h) polymeric fibers, (i) synthetic fibers. The structural substrate may comprise a panel comprised at least partially of fibers; the reinforcement may be comprised of thread sewn to the panel. Thread may be pressed into a surface of the panel during a compression forming process. The structural substrate may comprise at least one of (a) a compression-formed component; (b) a generally rigid fiber mat. The structural substrate may comprise a living hinge for the at least one door; the reinforcement may be positioned at the living hinge.

According to an exemplary embodiment as shown schematically in FIGS. 13A-13B, 14A-14B, 15A-15F, 16A-16E, 17A-17E, 18A-18D, 19 and 20, a vehicle interior component produced in a mold may comprise a first surface and a second surface by a process comprising placing a pre-form substrate onto the first surface of the mold, forming a compression-formed structure from the pre-form substrate by compressing the pre-form substrate between the first surface of the mold and the second surface of the mold and applying a cover to the compression-formed structure to form a panel assembly providing a surface effect. The compression-formed substrate may comprise a door and a living hinge for the door. The pre-form substrate may comprise a reinforcement for the living hinge. The pre-form substrate may comprise a fiber panel; the reinforcement may be comprised of thread sewn to the fiber panel. The compression-formed structure may comprise a substrate layer and the reinforcement. The step of forming the compression-formed structure may comprise forming the substrate layer into a generally rigid form. The step of forming the compression-formed structure may comprise forming the reinforcement and the pre-form substrate with a generally continuous surface. A generally smooth texture of the panel assembly may be provided by (a) a surface effect of the cover and (b) a surface effect of the pre-form substrate. The panel assembly may comprise a composite structure with at least partially a shape of the compression-formed structure; the shape may comprise a first contour provided by the first surface of the mold and a second contour provided by the second surface of the mold. The pre-form substrate may comprise a resin; the process may comprise the step of heating the pre-formed substrate and the pre-formed substrate may be compressed as the pre-formed substrate cools. The process may comprise the step of injecting resin into the mold after the compression-formed structure is formed to form an ancillary component of the panel assembly.

According to an exemplary embodiment as shown schematically in FIGS. 13A-13B, 14A-14B, 15A-15F, 16A-16E, 17A-17E, 18A-18D, 19 and 20, a component for a vehicle interior providing a hinged panel may comprise a composite structure comprising a structural substrate formed from a fiber panel and a cover for the structural substrate providing an exterior surface. The structural substrate may comprise a stitch pattern. The stitch pattern may comprise a thread. The composite structure may be configured so that the stitch pattern provides a reinforcement for the hinged panel so that the hinged panel remains at least partially attached to the composite structure when the hinged panel is rotated at a hinge. The stitch pattern may be provided on the fiber panel. The stitch pattern may be formed into the structural substrate so that the stitch pattern is not visible at the exterior surface of the cover. The set of threads of the stitch pattern may be pressed into a surface of the fiber panel so that the structural substrate comprises a generally flat surface for the cover. The thread may be pressed into a surface of the fiber panel so that the thread is not visible at the exterior surface of the cover of the composite surface. The thread may comprise a network of threads in the fiber panel formed into the structural substrate. The reinforcement may comprise threads for the stitch pattern comprising at least one of (a) KEVLAR, (b) aramid, (c) nylon, (d) polyester, (e) thread, (f) ceramic fibers, (g) polymeric fibers, (h) synthetic fibers; (i) bonded nylon. The hinged panel may be configured to remain at least partially attached to the composite structure by the thread. The stitch pattern may provide the reinforcement at a living hinge for the hinged panel. The thread may comprise a set of threads at least partially sewn into the fiber panel of the structural substrate. The component may comprise a feature on the structural substrate. The feature may comprise at least one of (a) a rib; (b) a set of ribs; (c) a feature adjacent to the reinforcement; (d) a feature at the reinforcement; (e) a feature at the hinged panel; (f) a structure for the hinged panel; (g) a resin-formed feature; (h) a resin-formed feature molded on the structural substrate.

The composite structure further may comprise a foam layer beneath the cover. The structural substrate may comprise a compression-formed component from the fiber panel. The cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

According to an exemplary embodiment as shown schematically in FIGS. 13A-13B, 14A-14B, 15A-15F, 16A-16E, 17A-17E, 18A-18D, 19 and 20, a component for a vehicle interior providing a hinged panel may comprise a composite structure comprising a structural substrate formed from a fiber panel providing the hinged panel and a cover for the structural substrate providing an exterior surface. The structural substrate may comprise a reinforcement. The reinforcement may be configured so that the hinged panel remains at least partially attached to the composite structure when the hinged panel is rotated at a living hinge.

According to an exemplary embodiment as shown schematically in FIGS. 13A-13B, 14A-14B, 15A-15F, 16A-16E, 17A-17E, 18A-18D, 19 and 20, a trim component for a vehicle interior may be prepared using a mold by a process comprising the steps of providing a pre-form substrate, joining a reinforcement to the pre-form substrate to form a reinforced pre-form substrate, disposing the reinforced pre-form substrate onto a first surface of the mold and compressing the reinforced pre-form substrate between the first surface and a second surface of the mold to form the reinforced pre-form substrate into a structural substrate having a shape and comprising a living hinge. The shape may correspond to a first contour of the first surface and a second contour of the second surface. The structural substrate may be configured to provide at least one hinged panel. The reinforcement may be configured to secure the at least one hinged panel to the structural substrate at the living hinge. The step of joining a reinforcement to the pre-form substrate may comprise sewing at least one of a thread or a stitch to the pre-form substrate. The step of joining a reinforcement to the pre-form substrate may comprise piercing an opening in the pre-form substrate and joining a stitch to the pre-form substrate at the opening.

According to an exemplary embodiment as shown schematically in FIGS. 13A-13B, 14A-14B, 15A-15F, 16A-16E, 17A-17E, 18A-18D, 19 and 20, a method of manufacturing a vehicle trim component may comprise the steps of providing a pre-form substrate, joining a reinforcement to the pre-form substrate to form a reinforced pre-form substrate, disposing the reinforced pre-form substrate onto a first surface of the mold; and compressing the reinforced pre-form substrate between the first surface and a second surface of the mold to form the reinforced pre-form substrate into a structural substrate having a shape and a living hinge. The shape may correspond to a first contour of the first surface and a second contour of the second surface. The structural substrate may be configured to provide at least one hinged panel. The reinforcement may be configured to secure the hinged panel to the structural substrate when the hinged panel is rotated at the living hinge.

Exemplary Embodiments—E

According to an exemplary embodiment as shown schematically in the FIGURES, a component for a vehicle interior may comprise a composite structure comprising a fiber panel and a cover. The fiber panel may comprise a conductor. The conductor may be configured to provide a functional circuit for the composite structure. The conductor may comprise a pattern of electrically conductive threads. Conductive thread may be within the fiber panel. Conductive thread may be stitched onto the fiber panel. The conductor may comprise a stitch pattern comprising conductive thread comprising the functional circuit. The functional circuit may comprise a user interface. The functional circuit may comprise an input device and/or an output device. The functional circuit may comprise a circuit element. The composite structure may comprise a feature on the fiber panel; the feature may comprise at least one of (a) a resin structure; (b) a resin feature; (c) a molded feature; (d) a molded structure; (e) a rib. The composite structure may comprise a resin structure for the fiber panel adjacent to the functional circuit. The fiber panel may comprise a stitch pattern comprising at least one of (a) conductive thread; (b) non-conductive thread. The component may comprise at least one of a trim panel, an instrument panel, a door panel, an overhead panel, a console, an overhead console, a floor console, an interior trim component, pillar trim, an operator control, a steering control, a steering wheel.

According to an exemplary embodiment as shown schematically in the FIGURES, a component for a vehicle interior may comprise a composite structure comprising a fiber panel and a cover. The fiber panel may comprise a conductor. The conductor may comprise conductive thread configured to provide a functional circuit. The conductive thread may comprise a pattern of electrically conductive threads. The composite structure may comprise a stitch pattern in the fiber panel comprising the conductive thread to provide the functional circuit. The functional circuit may comprise a sensor. The functional circuit may comprise at least one of a light, an LED light, a display, an illuminated feature. The functional circuit may comprise at least one of (a) a user interface; (b) an input device; (c) a switch; (d) an output device; (e) a display. The functional circuit may be configured to be connected to at least one of (a) a control system; (b) a vehicle system; (c) a network; (d) a power source. The composite structure may be configured to facilitate deployment of an airbag; the airbag may be configured to deploy through an airbag door; the airbag door may be configured to be formed adjacent to the functional circuit.

Exemplary Embodiments—F

According to an exemplary embodiment as shown schematically in the FIGURES, a component for a vehicle interior may comprise a composite structure comprising a fiber panel and a cover. The fiber panel may comprise a conductor. The conductor may be configured to provide a functional circuit for the composite structure. The conductor may comprise conductive thread. The conductor may comprise electrically conductive thread. The conductor may comprise a pattern of electrically conductive threads. The conductor may comprise a set of electrically conductive threads. Conductive thread may be within the fiber panel. Conductive thread may be stitched within the fiber panel. Conductive thread may be stitched into the fiber panel. Conductive thread may be stitched onto the fiber panel. The conductor may comprise a stitch pattern comprising conductive thread. The conductor may comprise a stitch pattern comprising the functional circuit. The functional circuit may comprise a user interface. The functional circuit may comprise an input device and/or an output device. The functional circuit may comprise an input device and an output device. The functional circuit may comprise a connection point. The functional circuit may comprise a circuit element. The functional circuit may be configured for connection to a power source. The functional circuit may be configured for operation by a control system. The fiber panel may comprise a compressed fiber panel. The composite structure may comprise a feature on the fiber panel. The feature may comprise a resin structure. The feature may comprise a resin feature. The feature may comprise a molded feature. The feature may comprise a molded structure. The feature may comprise a rib. The composite structure may comprise a resin structure for the fiber panel. The feature may comprise a resin structure adjacent to the functional circuit. The fiber panel may comprise a stitch pattern comprising conductive thread. The fiber panel may comprise a stitch pattern comprising non-conductive thread. The stitch pattern comprising non-conductive thread may comprise a reinforcement for the fiber panel; the reinforcement may be configured to provide a hinge area for an airbag door. The component may comprise at least one of a trim panel, an instrument panel, a door panel, an overhead panel, a console, an overhead console, a floor console, an interior trim component, pillar trim, an operator control, a steering control, a steering wheel.

According to an exemplary embodiment as shown schematically in the FIGURES, a component for a vehicle interior may comprise a composite structure comprising a fiber panel and a cover. The fiber panel may comprise a conductor. The conductor may comprise conductive thread configured to provide a functional circuit. The conductive thread may comprise a pattern of electrically conductive threads. The composite structure may comprise a stitch pattern in the fiber panel comprising the conductive thread to provide the functional circuit. The functional circuit may comprise a sensor. The sensor may be configured to operate as a switch. The functional circuit may comprise at least one of a light, an LED light, a display, an illuminated feature. The functional circuit may comprise a user interface. The functional circuit may comprise an input device. The input device may comprise a switch. The functional circuit may comprise an output device. The output device may comprise a display. The functional circuit may comprise an input device and an output device. The component may comprise a connector for the functional circuit. The functional circuit may be configured to be connected to a control system. The functional circuit may be configured to be connected to a vehicle system. The functional circuit may be configured to be connected to a network. The functional circuit may be configured to be connected to a power source. The composite structure may be configured to facilitate deployment of an airbag; the airbag may be configured to deploy through an airbag door; the airbag door may be configured to be formed adjacent to the functional circuit. The composite structure may comprise a stitch pattern in the fiber panel comprising non-conductive thread; the stitch pattern may be configured to provide a reinforcement for a hinge area for the airbag door. The component may comprise at least one of a trim panel, an instrument panel, a door panel, an overhead panel, a console, an overhead console, a floor console, an interior trim component, pillar trim, an operator control, a steering control, a steering wheel.

Exemplary Embodiments—G

According to an exemplary embodiment as shown schematically in the FIGURES, a component for a vehicle interior may comprise a structural substrate and an electrical conductor coupled to the structural substrate. The structural substrate may comprise a fiber panel. The component may comprise a stitch pattern; the stitch pattern may comprise a top stitch and a bottom stitch. The top stitch may comprise the electrical conductor. The bottom stitch may comprise the electrical conductor. The structural substrate may comprise a panel comprised at least partially of fibers; the electrical conductor may be sewn to the panel. The electrical conductor may be pressed into a surface of the panel during a compression forming process. The structural substrate may comprise an ancillary component molded on the panel. The structural substrate may comprise an ancillary component molded on the electrical conductor. The structural substrate may comprise an ancillary component molded on the panel over the electrical conductor. The structural substrate may comprise at least one of (a) a compression-formed component; (b) a generally rigid fiber mat. The component may comprise at least one of (a) an instrument panel; (b) a door panel; (c) a trim panel; (d) an overhead console; (e) a trim component.

According to an exemplary embodiment as shown schematically in the FIGURES, a component for a vehicle interior may be produced in a mold comprising a first surface and a second surface by a process comprising placing a pre-form substrate onto the first surface of the mold; forming a compression-formed structure from the pre-form substrate by compressing the pre-form substrate between the first surface of the mold and the second surface of the mold; and applying a cover to the compression-formed structure to form a panel assembly providing a surface effect. The pre-form substrate may comprise an electrical conductor. The pre-form substrate may comprise a fiber panel; the electrical conductor may be sewn to the fiber panel. The compression-formed structure may comprise a substrate layer and the electrical conductor. The step of forming the compression-formed structure may comprise forming the substrate layer into a generally rigid form. The step of forming the compression-formed structure may comprise forming the electrical conductor and the pre-form substrate with a generally continuous surface. A generally smooth texture of the panel assembly may be provided by (a) a surface effect of the cover and (b) a surface effect of the pre-form substrate. The panel assembly may comprise a composite structure with at least partially a shape of the compression-formed structure; the shape may comprise a first contour provided by the first surface of the mold and a second contour provided by the second surface of the mold. The pre-form substrate may comprise a resin; the process may comprise the step of heating the pre-formed substrate and the pre-formed substrate may be compressed as the pre-formed substrate cools. The process may comprise the step of injecting resin into the mold after the compression-formed structure is formed to form an ancillary component of the panel assembly.

According to an exemplary embodiment as shown schematically in the FIGURES, a component for a vehicle interior may comprise a composite structure comprising a structural substrate formed from a fiber panel and a cover for the structural substrate providing an exterior surface. The structural substrate may comprise a stitch pattern. The stitch pattern may comprise a set of threads. The stitch pattern may comprise an electrical conductor. The stitch pattern may be provided on the fiber panel. The stitch pattern may be formed into the structural substrate so that the stitch pattern is not visible at the exterior surface of the cover. The set of threads of the stitch pattern may be pressed into a surface of the fiber panel so that the structural substrate may comprise a generally flat surface for the cover. The set of threads of the stitch pattern may be pressed into a surface of the fiber panel so that the set of threads is not visible at the exterior surface of the cover of the composite surface. The stitch pattern may comprise a network of threads in the fiber panel formed into the structural substrate. The set of threads for the stitch pattern may comprise an upper set of threads and a lower set of threads. The upper set of threads may comprise the electrical conductor. The lower set of threads may comprise the electrical conductor. The stitch pattern may comprise a set of threads at least partially sewn into the fiber panel of the structural substrate. The component may comprise a feature on the structural substrate. The feature may comprise at least one of (a) a rib; (b) a set of ribs; (c) a reinforcement for the fiber panel; (d) a cover for the electrical conductor; (e) insulation for the electrical conductor; (f) shielding for the electrical conductor; (g) a housing for the electrical connector; (h) a cover for an electrical connector to the electrical conductor; (i) a connection point for the electrical conductor and a wire; j) a resin-formed feature; (k) a resin-formed feature molded on the structural substrate. The composite structure may comprise a foam layer beneath the cover. The structural substrate may comprise a compression-formed component from the fiber panel. The cover may comprise at least one of (a) leather; (b) synthetic leather; (c) imitation leather; (d) a composite of a plastic layer and textile backing; (e) a coated fabric; (f) polyvinylchloride coated fabric; (g) a woven fabric; (h) a non-woven fabric; (i) an applique; (j) vinyl; (k) a foil; (l) coating on the structural substrate; (m) paint on the structural substrate; (n) the exterior surface of the structural substrate. The component may comprise at least one of an instrument panel; a door panel; a trim panel; a trim component.

According to an exemplary embodiment as shown schematically in the FIGURES, a component for a vehicle interior may comprise a composite structure comprising (a) a structural substrate formed from a fiber panel; (b) a cover for the structural substrate providing an exterior surface; and (c) a feature formed from resin on the structural substrate. The structural substrate may comprise an electrical conductor. The structural substrate may comprise a pattern of threads; the pattern of threads may comprise the electrical conductor.

According to an exemplary embodiment as shown schematically in the FIGURES, a component for a vehicle interior may be prepared using a mold by a process comprising the steps of: (a) providing a pre-form substrate; (b) joining an electrical conductor to the pre-form substrate; (c) disposing the pre-form substrate with the electrical conductor into the mold; and (d) compressing the pre-form substrate between the first surface of the mold and a second surface of the mold to form the pre-form substrate into a structural substrate having a shape. The shape may correspond to a first contour of the first surface and a second contour of the second surface. The step of joining an electrical conductor to the pre-form substrate may comprise sewing the electrical conductor to the pre-form substrate. The step of joining an electrical conductor to the pre-form substrate may comprise piercing an opening in the pre-form substrate and joining the electrical conductor to a stitch at the opening.

According to an exemplary embodiment as shown schematically in the FIGURES, a method of manufacturing a component for a vehicle interior may comprise the steps of: (a) providing a pre-form substrate; (b) joining an electrical connector to the pre-form substrate; (c) disposing the pre-form substrate with the electrical conductor onto a first surface of the mold; and (d) compressing the pre-form substrate between the first surface and a second surface of the mold to form a structural substrate having a shape. The shape may correspond to a first contour of the first surface and a second contour of the second surface.

TABLE A

REFERENCE SYMBOL LIST

| ELEMENT, PART OR COMPONENT | REF SYMBOL |
| --- | --- |
| Vehicle | V |
| Interior | I |
| Component/trim component | C |
| Instrument panel | IP |
| Door/door panel | DP |
| Overhead console panel | OHP |
| Floor console | FC |
| Arm rest | AR |
| Pillar | PL |
| Seat | SS |
| Side mirror | SM |
| Steering wheel | SW |
| Fiber panel | FP |
| Cover | T |
| Base | B |
| Structural substrate | SB |
| Foam Layer | FM |
| Panel/panel layer | PN |
| Surface | TX |
| Airbag module | ABM |
| Airbag | AB |
| Airbag door | ABD |
| Airbag chute | AC |
| Hinge/Hinge area | HG |
| Tear line/seam | TR |
| Cut | CT |
| Recess/Depression | RC |
| Feature/reinforcement | MN |
| Feature/structure/structural element/reinforcement/rib | RB |
| Compression-formed component (fiber panel) | FPc |
| Fiber mat | FPu |
| Fiber mat | FPt |
| Reinforced Fiber panel | FPr |
| Sewing machine | MW |
| Needle | N |
| Stitch/stitch pattern | ST |
| Stitch pattern | SP |
| Top Stitch | TS |
| Bottom Stitch | BS |
| Oven | OV |
| Mold | M |
| Mold top | MT |
| Mold bottom | MB |
| resin | R |
| User interface (input device and/or output device) | UI |
| User interface system | UIS |
| Circuit arrangement/functional circuit | FR |
| Circuit element | CR |
| Conductor | CD |
| Conductive thread | CS |
| Cable/wire | CW |
| Connector/plug | CP |
| Connection point | CN |
| Pad/contact | PC |
| Insulator/cover | NL |
| Light | LT |
| Light guide | LG |
| LED | LED |
| System to generate field/antenna | SF |
| Field/detection space/area (field/antenna/etc.) | FL |
| Camera/video-recorder | CM |
| Image display/device (user interface input/output) | ID |
| Sensor/detector (input device/switch) | SN |
| Sensor (occupancy detector/sensor) | OC |
| ultraviolet sensor | UV |

TABLE A-continued

REFERENCE SYMBOL LIST

| ELEMENT, PART OR COMPONENT | REF SYMBOL |
| --- | --- |
| Accelerometer | AX |
| Odor/scent detector | OD |
| Microphone/sound detector | MR |
| Wireless charging/connection area/surface (for mobile device) | CW |
| Heating element | HT |
| mobile device | MD |
| object/item | OB |
| Antenna | TN |
| Switch/button | SH |
| Control system | CS |
| Power source | PS |
| Vehicle system/systems | VS |

RELATED PATENT DOCUMENTS—INCORPORATION BY REFERENCE

The present application incorporates by reference (a) U.S. patent application Ser. No. 13/595,741 titled "SYSTEM AND METHOD FOR MANUFACTURING A VEHICLE TRIM COMPONENT VIA CONCURRENT COMPRESSION FORMING AND INJECTION MOLDING" filed Aug. 27, 2012 (now U.S. Pat. No. 8,939,745); (b) U.S. patent application Ser. No. 13/846,529 titled "SYSTEM AND METHOD FOR MANUFACTURING A VEHICLE TRIM COMPONENT VIA CONCURRENT COMPRESSION FORMING AND INJECTION MOLDING" filed on Mar. 18, 2013 (now U.S. Pat. No. 9,149,961); (c) U.S. patent application Ser. No. 14/424,671 titled "SYSTEM AND METHOD FOR MOUNTING AN AIRBAG CHUTE ASSEMBLY WITHIN A VEHICLE TRIM COMPONENT" filed Feb. 27, 2015 (now U.S. Pat. No. 9,481,337); (d) U.S. patent application Ser. No. 14/808,938 titled "VEHICLE TRIM COMPONENT" filed Jul. 24, 2015 (now U.S. Pat. No. 10,118,325); (e) U.S. patent application Ser. No. 15/331,578 titled "TRIM COMPONENT FOR VEHICLE INTERIOR" filed Oct. 21, 2016 (now U.S. Pat. No. 10,093,268).

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

What is claimed is:

1. A trim component for a vehicle interior configured to present a user interface comprising:
   a composite structure comprising a structural substrate comprising a fiber panel and a cover;
   wherein the fiber panel is formed from a fiber mat comprising a conductor;
   wherein the conductor is joined with the fiber mat;
   wherein the fiber panel is formed into the structural substrate by compression forming of the fiber mat with the conductor;
   wherein the conductor comprises an electrical conductor configured to provide a functional circuit for the structural substrate of the composite structure;
   wherein the fiber panel of the structural substrate with the electrical conductor configured to provide the functional circuit comprises a generally-rigid fiber panel;
   wherein the functional circuit provided with the generally-rigid fiber panel is configured to present the user interface for the composite structure.

2. The component of claim 1 wherein the conductor comprises a pattern of electrically conductive threads.

3. The component of claim 1 wherein conductive thread is within the fiber panel.

4. The component of claim 1 wherein conductive thread is stitched onto the fiber panel.

5. The component of claim 1 wherein the conductor comprises a stitch pattern comprising conductive thread comprising the functional circuit.

6. The component of claim 1 wherein the functional circuit is provided on the fiber panel of the structural substrate.

7. The component of claim 1 wherein the functional circuit comprises the user interface comprising an input device and/or an output device.

8. The component of claim 1 wherein the functional circuit comprises a circuit element.

9. The component of claim 1 wherein the composite structure further comprises a feature on the fiber panel; wherein the feature comprises at least one of (a) a resin structure; (b) a resin feature; (c) a molded feature; (d) a molded structure; (e) a rib.

10. The component of claim 1 wherein the composite structure comprises a resin structure for the fiber panel adjacent to the functional circuit.

11. The component of claim 1 comprising at least one of a trim panel, an instrument panel, a door panel, an overhead panel, a console, an overhead console, a floor console, an interior trim component, pillar trim, an operator control, a steering control, a steering wheel.

12. A trim component for a vehicle interior configured to present a user interface comprising:
 a composite structure comprising a structural substrate comprising a fiber panel and a cover; and
 an electrical conductor;
 wherein the fiber panel is formed from a fiber mat;
 wherein the electrical conductor comprises conductive thread stitched into the fiber mat;
 wherein the fiber panel comprises a compression-formed fiber panel formed by compression forming of the fiber mat with the electrical conductor comprising conductive thread;
 wherein the electrical conductor comprising conductive thread comprises a pattern of electrically conductive threads formed in the compression-formed fiber panel and configured to provide a functional circuit;
 wherein the functional circuit provided with the compression-formed fiber panel of the structural substrate is configured to present the user interface for the composite structure.

13. The component of claim 12 wherein the conductive thread is configured to form the functional circuit within the fiber panel of the structural substrate.

14. The component of claim 12 wherein the composite structure comprises a stitch pattern in the fiber panel comprising the pattern electrically conductive threads to provide the functional circuit.

15. The component of claim 12 wherein the functional circuit comprises a sensor.

16. The component of claim 12 wherein the functional circuit comprises at least one of a light, an LED light, a display, an illuminated feature.

17. The component of claim 12 wherein the functional circuit comprises the user interface comprising an input device; a switch; an output device; a display.

18. The component of claim 12 wherein the functional circuit is configured to be connected to at least one of (a) a control system; (b) a vehicle system; (c) a network; (d) a power source.

19. The component of claim 12 wherein the composite structure is configured to facilitate deployment of an airbag; wherein the airbag is configured to deploy through an airbag door; wherein the airbag door is configured to be formed adjacent to the functional circuit.

20. A trim component for a vehicle interior configured to present a user interface comprising:
 a composite structure comprising a structural substrate comprising a fiber panel and a cover;
 wherein the fiber panel is formed from a fiber mat comprising a conductor joined to the fiber mat;
 wherein the fiber panel with the conductor is formed into the structural substrate by compression forming of the fiber mat with the conductor;
 wherein the conductor comprises an electrical conductor configured to provide a functional circuit for the structural substrate of the composite structure;
 wherein the fiber panel with the electrical conductor configured to provide the functional circuit comprises a generally-rigid fiber panel providing the structural substrate;
 wherein the functional circuit provided with the generally-rigid fiber panel providing the structural substrate is configured to present the user interface for the composite structure.

* * * * *